(12) United States Patent
Koenemann et al.

(10) Patent No.: US 8,350,035 B2
(45) Date of Patent: Jan. 8, 2013

(54) FLUORINATED RYLENETETRACARBOXYLIC ACID DERIVATIVES AND USE THEREOF

(75) Inventors: Martin Koenemann, Mannheim (DE); Peter Osswald, Wain (DE); Ruediger Schmidt, Paderborn (DE); Frank Wuerthner, Hoechberg (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 1023 days.

(21) Appl. No.: 12/279,192

(22) PCT Filed: Feb. 16, 2007

(86) PCT No.: PCT/EP2007/051532
§ 371 (c)(1),
(2), (4) Date: Aug. 13, 2008

(87) PCT Pub. No.: WO2007/093643
PCT Pub. Date: Aug. 23, 2007

(65) Prior Publication Data
US 2009/0166614 A1    Jul. 2, 2009

(30) Foreign Application Priority Data

Feb. 17, 2006  (EP) .................................... 06003266
May 23, 2006  (EP) .................................... 06114427

(51) Int. Cl.
*C07D 407/04*  (2006.01)
*C07D 221/18*  (2006.01)
*H01J 63/04*   (2006.01)

(52) U.S. Cl. ........................... 546/26; 549/232; 313/499
(58) Field of Classification Search .......................... None
See application file for complete search history.

(56) References Cited

U.S. PATENT DOCUMENTS

| 5,986,099 | A | 11/1999 | Muellen et al. |
| 6,143,905 | A | 11/2000 | Boehm et al. |
| 6,326,494 | B1 | 12/2001 | Boehm et al. |
| 7,910,736 | B2* | 3/2011 | Koenemann et al. ........... 546/37 |
| 2003/0153005 | A1 | 8/2003 | Schmid et al. |
| 2003/0181721 | A1 | 9/2003 | Wuerthner et al. |
| 2005/0176970 | A1* | 8/2005 | Marks et al. .................... 549/41 |
| 2005/0222416 | A1 | 10/2005 | Bohm et al. |

FOREIGN PATENT DOCUMENTS

| DE | 3235526 A1 | 3/1984 |
| DE | 19547209 A1 | 6/1997 |
| DE | 10148172 A1 | 4/2003 |

OTHER PUBLICATIONS

U.S. Appl. No. 12/666,127, filed Dec. 22, 2009, Koenemann, et al.
U.S. Appl. No. 12/212,199, filed Sep. 17, 2008, Koenemann, et al.
Michael J. Ahrens, et al., "Cyanated Perylene-3,4-Dicarboximides and Perylene-3,4:9,10-bis(dicarboximide): Facile Chromophoric Oxidants for Organic Photonics and Electronics" American Chemical Society, vol. 15, (pp. 2684-2686), 2003.
Brooks A. Jones, et al., "High-Mobility Air-Stable n-Type Semiconductors with Processing Versatility: Dicyanoperylene-3,4:9,10-bis(dicarboximides)" Angewandte Chemical, vol. 116, (pp. 6523-6526), 2004, XP-002430942.
Frank Wuerthner, et al., "Synthesis and Optical and Electrochemical Properties of Core-Fluorinated Perylene Bisimides" Organic Letters, vol. 8, No. 17, (pp. 3765-3768), 2006, XP-002430943.
U.S. Appl. No. 12/668,299, filed Jan. 8, 2010, Klaus, et al.
U.S. Appl. No. 12/673,908, filed Feb. 17, 2010, Koenemann, et al.
U.S. Appl. No. 12/738,947, filed Apr. 20, 2010, Koenemann, et al.
U.S. Appl. No. 12/479,228, filed Jun. 5, 2009, Koenemann, et al.

* cited by examiner

*Primary Examiner* — Kamal Saeed
*Assistant Examiner* — Nyeemah A Grazier
(74) *Attorney, Agent, or Firm* — Oblon, Spivak, McClelland, Maier & Neustadt, L.L.P.

(57) ABSTRACT

The present invention relates to fluorinated rylenetetracarboxylic acid derivatives, to a process for their preparation and to their use, especially as n-type semiconductors.

5 Claims, 7 Drawing Sheets

FLUORINATED RYLENETETRACARBOXYLIC ACID DERIVATIVES AND USE THEREOF

The present invention relates to fluorinated rylenetetracarboxylic acid derivatives, to a process for their preparation and to their use, especially as n-type organic semiconductors.

It is expected that, in addition to the classical inorganic semiconductors, organic semiconductors based on low molecular weight or polymeric materials will also increasingly become established in the future in many sectors of the electronics industry. In many cases, these organic semiconductors have advantages over the classical inorganic semiconductors, for example better substrate compatibility and better processability of the semiconductor components based on them. They allow processing on flexible substrates and enable their frontier orbital energies to be adjusted precisely to the particular application range with the methods of molecular modeling. The distinctly reduced costs of such components have brought a renaissance to the field of research of organic electronics. "Organic electronics" is concerned principally with the development of novel materials and manufacturing processes for the production of electronic components based on organic semiconductor layers. These include in particular organic field-effect transistors (OFETs) and organic light-emitting diodes (OLEDs; for example for use in displays), and photovoltaics. A great development potential is ascribed to organic field-effect transistors, for example in memory elements and integrated optoelectronic devices. There is therefore a great need for organic compounds which are suitable as organic semiconductors, in particular n-type semiconductors and especially for use in organic field-effect transistors.

DE-A-32 35 526 relates to perylene-3,4,9,10-tetracarboximides which are substituted on the perylene skeleton by alkoxy or alkylthio groups and by chlorine or bromine, to a process for their preparation and to their use in light-collecting plastics. Although a fluorinated N,N-bisisooctylperylimide is described in the noninventive example 11 of this document with specification of the empirical formula $C_{40}H_{37}N_2O_4ClF_4$, the use of such a compound as an organic semiconductor is not disclosed.

DE-A-1 95 47 209 relates to 1,7-diaryloxy- or 1,7-diarylthio-substituted perylene-3,4,9,10-tetracarboxylic acids and their dianhydrides and diimides. For their preparation, 1,7-dibromoperylene-3,4,9,10-tetracarboximides are used as intermediates. Fluorine-substituted perylenetetracarboxylic acid derivatives are not described in this document.

U.S. Pat. No. 5,986,099 (WO 96/22332) describes substituted quaterrylenetetracarboximides in which the aromatic basic skeleton may have up to 12 substituents which may include halogen substituents. Fluorinated quaterrylenetetracarboximides are not described.

US 2005/0222416 A1 (WO 03/104232) describes 1,6,9,14-tetrasubstituted terrylenetetracarboximides. Compounds fluorinated on the basic aromatic skeleton are not described in this document either.

DE-A-101 48 172 describes fluorescent naphthalene-1,4,5,8-tetracarboximides with electron-donating substituents on the aromatic ring.

US 2003/0181721 A1 describes perylene-3,4,9,10-tetracarboximides which may be substituted in the 1-, 6-, 7- and/or 12-position. Fluorinated compounds are not described in this document either.

In Chem. Mater. 2003, 15, p. 2684-2686, M. J. Ahrens, M. J. Fuller and M. R. Wasielewski describe cyano-substituted perylene-3,4-dicarboximides and perylene-3,4,9,10-bis(dicarboximides).

In Angew. Chem. 2004, 116, p. 6523-6526, B. A. Jones et al. describe the use of dicyanoperylene-3,4,9,10-bis(dicarboximides) as n-semiconductors.

US 2005/0176970 A1 describes n-semiconductors based on cyano-substituted perylene-3,4-dicarboximides and perylene-3,4,9,10-bis(dicarboximides).

The unpublished German patent application 10 2005 061 997.5 describes Br, F and/or CN-substituted naphthalene tetracarboxylic acid derivatives and their use, for example in organic field-effect transistors.

It is an object of the present invention to provide compounds which are suitable as semiconductors, for example for use in organic field-effect transistors. They should preferably be air-stable compounds.

This object is achieved by the use of compounds of the general formula I

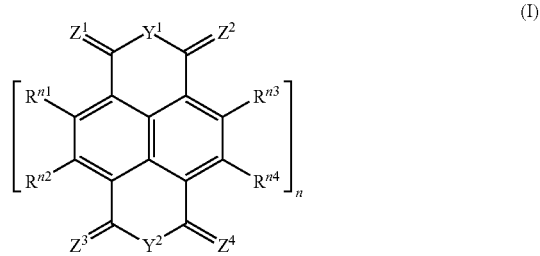

where
n is 2, 3 or 4,
at least one of the $R^{n1}$, $R^{n2}$, $R^{n3}$ and $R^{n4}$ radicals is fluorine,
if appropriate, at least one further $R^{n1}$, $R^{n2}$, $R^{n3}$ and $R^{n4}$ radical is a substituent which is selected from Cl and Br, and the remaining radicals are each hydrogen,
$Y^1$ is O or $NR^a$ where $R^a$ is hydrogen or an organyl radical,
$Y^2$ is O or $NR^b$ where $R^b$ is hydrogen or an organyl radical,
$Z^1$, $Z^2$, $Z^3$ and $Z^4$ are each O,
where, in the case that $Y^1$ is $NR^a$, it is also possible for one of the $Z^1$ and $Z^2$ radicals to be $NR^c$, where the $R^a$ and $R^c$ radicals together are a bridging group having from 2 to 5 atoms between the flanking bonds, and
where, in the case that $Y^2$ is $NR^b$, it is also possible for one of the $Z^3$ and $Z^4$ radicals to be $NR^d$, where the $R^b$ and $R^d$ radicals together are a bridging group having from 2 to 5 atoms between the flanking bonds,
as semiconductors, especially n-semiconductors, in organic electronics, especially for organic field-effect transistors, solar cells and organic light-emitting diodes.

The invention further provides for the use of compounds of the general formula I for optical labels, for invisible marking of products, as fluorescent dyes, as fluorescent labels for biomolecules and as pigments.

The invention further provides compounds of the formula I excluding compounds in which n is 2, at least one of the $R^{n1}$, $R^{n2}$, $R^{n3}$ and $R^{n4}$ radicals is fluorine and at least one further radical is chlorine. The inventive compounds are specifically not chlorotetrafluoro-N,N'-bisisooctylperylimide.

BRIEF DESCRIPTION OF THE FIGURES

A more complete appreciation of the invention and many of the attendant advantages thereof will be readily obtained as the same becomes better understood by reference to the following detailed description when considered in connection with the accompanying drawings, wherein.

Figure 1:
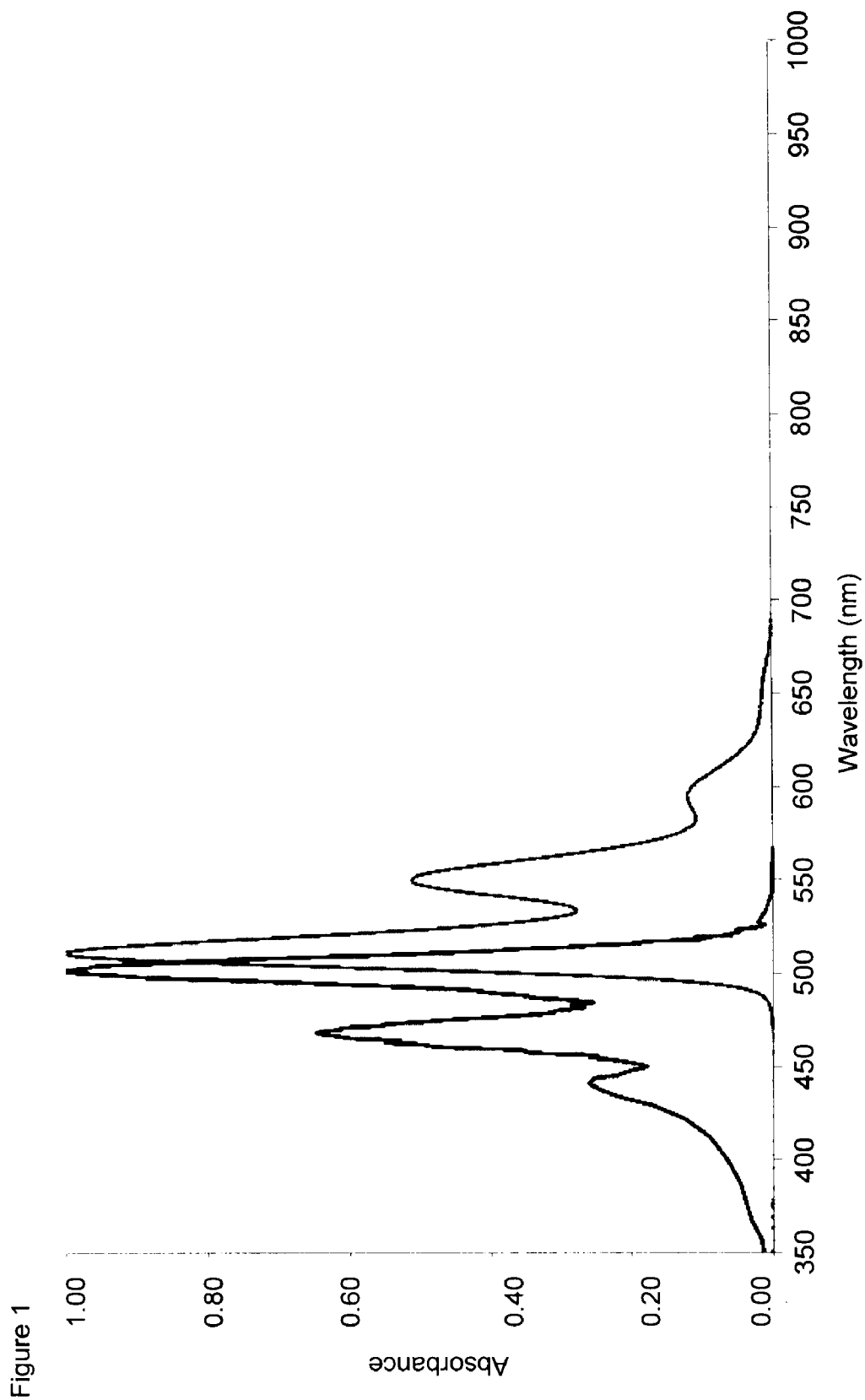
FIG. 1 shows the absorption and fluorescence spectrum of the mixture obtained in Example 1 in methyl isobutyrate.

In the compounds of the formula I, n is the number of naphthalene units which are bonded in the peri-position and form the basic skeleton of the inventive rylene compounds. In the individual $R^{n1}$ to $R^{n4}$ radicals, n is the particular naphthalene group of the rylene skeleton to which the radicals are bonded. $R^{n1}$ to $R^{n4}$ radicals which are bonded to different naphthalene groups may each have the same or different definitions. Accordingly, the compounds of the general formula I may be perylenes, terrylenes or quaterrylenes of the following formula:

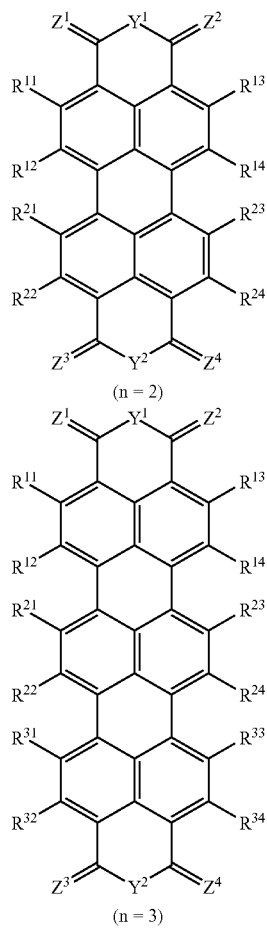

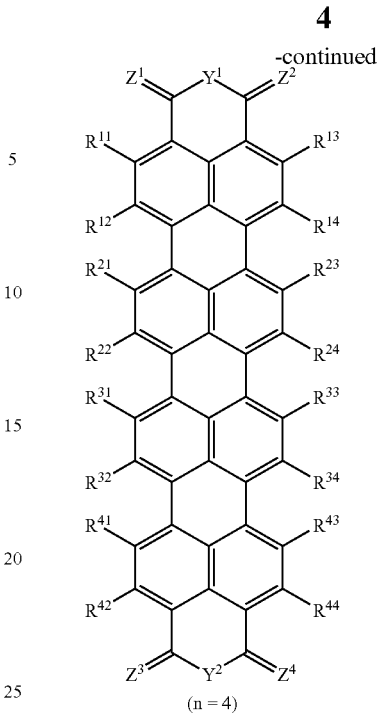

The higher homologs (n=5, 6) are formed analogously.

In the context of the present invention, the expression "alkyl" comprises straight-chain or branched alkyl. It is preferably straight-chain or branched $C_1$-$C_{30}$-alkyl, in particular $C_1$-$C_{20}$-alkyl and most preferably $C_1$-$C_{12}$-alkyl. Examples of alkyl groups are in particular methyl, ethyl, n-propyl, isopropyl, n-butyl, isobutyl, sec-butyl, tert-butyl, n-pentyl, n-hexyl, n-heptyl, n-octyl, n-nonyl, n-decyl, n-undecyl, n-dodecyl, n-tridecyl, n-tetradecyl, n-hexadecyl, n-octadecyl and n-eicosyl.

The expression alkyl also comprises alkyl radicals whose carbon chains may be interrupted by one or more nonadjacent groups which are selected from —O—, —S—, —NR$^e$—, —CO—, —SO— and/or —SO$_2$—. R$^e$ is preferably hydrogen, alkyl, cycloalkyl, heterocycloalkyl, aryl or hetaryl. The expression alkyl also comprises substituted alkyl radicals. Depending on the length of the alkyl chain, substituted alkyl groups may have one or more (for example 1, 2, 3, 4, 5 or more than 5) substituents. These are preferably selected independently from cycloalkyl, heterocycloalkyl, aryl, hetaryl, halogen, hydroxyl, thiol, COOH, carboxylate, SO$_3$H, sulfonate, NE$^1$E$^2$, nitro and cyano, where E$^1$ and E$^2$ are each independently hydrogen, alkyl, cycloalkyl, heterocycloalkyl, aryl or hetaryl. Halogen substituents are preferably fluorine, chlorine or bromine.

Carboxylate and sulfonate are a derivative of a carboxylic acid function and of a sulfonic acid function respectively, especially a metal carboxylate or sulfonate, a carboxylic ester or sulfonic ester function or a carboxamide or sulfonamide function. Cycloalkyl, heterocycloalkyl, aryl and hetaryl substituents of the alkyl groups may in turn be unsubstituted or substituted; suitable substituents are those mentioned below for these groups.

The above remarks for alkyl also apply to the alkyl moieties in alkoxy, alkylamino, alkylthio, alkylsulfinyl, alkylsulfonyl, etc.

Aryl-substituted alkyl radicals ("arylalkyl") have at least one unsubstituted or substituted aryl group as defined below. The alkyl in "arylalkyl" may bear at least one further substituent and/or be interrupted by one or more nonadjacent groups which are selected from —O—, —S—, —NR$^e$—, —CO— and/or —SO$_2$—. Arylalkyl is preferably phenyl-C$_1$-C$_{10}$-alkyl, more preferably phenyl-C$_1$-C$_4$-alkyl, for example benzyl, 1-phenethyl, 2-phenethyl, 1-phenprop-1-yl, 2-phenprop-1-yl, 3-phenprop-1-yl, 1-phenbut-1-yl, 2-phenbut-1-yl, 3-phenbut-1-yl, 4-phenbut-1-yl, 1-phenbut-2-yl, 2-phenbut-2-yl, 3-phenbut-2-yl, 4-phenbut-2-yl, 1-(phenmeth)eth-1-yl, 1-(phenmethyl)-1-(methyl)eth-1-yl or -(phenmethyl)-1-(methyl)prop-1-yl; preferably benzyl and 2-phenethyl.

In the context of the present invention, the expression "alkenyl" comprises straight-chain and branched alkenyl groups which, depending on the chain length, may bear one or more double bonds (for example 1, 2, 3, 4 or more than 4). Preference is given to C$_2$-C$_{18}$-alkenyl, particular preference to C$_2$-C$_{12}$-alkenyl. The expression "alkenyl" also comprises substituted alkenyl groups which may bear one or more (for example 1, 2, 3, 4, 5 or more than 5) substituents. Suitable substituents are, for example, selected from cycloalkyl, heterocycloalkyl, aryl, hetaryl, halogen, hydroxyl, thiol, COOH, carboxylate, SO$_3$H, sulfonate, NE$^3$E$^4$, nitro and cyano, where E$^3$ and E$^4$ are each independently hydrogen, alkyl, cycloalkyl, heterocycloalkyl, aryl or hetaryl.

Alkenyl is then, for example, ethenyl, 1-propenyl, 2-propenyl, 1-butenyl, 2-butenyl, 3-butenyl, 1-pentenyl, 2-pentenyl, 3-pentenyl, 4-pentenyl, 1-hexenyl, 2-hexenyl, 3-hexenyl, 4-hexenyl, 5-hexenyl, penta-1,3-dien-1-yl, hexa-1,4-dien-1-yl, hexa-1,4-dien-3-yl, hexa-1,4-dien-6-yl, hexa-1,5-dien-1-yl, hexa-1,5-dien-3-yl, hexa-1,5-dien-4-yl, hepta-1,4-dien-1-yl, hepta-1,4-dien-3-yl, hepta-1,4-dien-6-yl, hepta-1,4-dien-7-yl, hepta-1,5-dien-1-yl, hepta-1,5-dien-3-yl, hepta-1,5-dien-4-yl, hepta-1,5-dien-7-yl, hepta-1,6-dien-1-yl, hepta-1,6-dien-3-yl, hepta-1,6-dien-4-yl, hepta-1,6-dien-5-yl, hepta-1,6-dien-2-yl, octa-1,4-dien-1-yl, octa-1,4-dien-2-yl, octa-1,4-dien-3-yl, octa-1,4-dien-6-yl, octa-1,4-dien-7-yl, octa-1,5-dien-1-yl, octa-1,5-dien-3-yl, octa-1,5-dien-4-yl, octa-1,5-dien-7-yl, octa-1,6-dien-1-yl, octa-1,6-dien-3-yl, octa-1,6-dien-4-yl, octa-1,6-dien-5-yl, octa-1,6-dien-2-yl, deca-1,4-dienyl, deca-1,5-dienyl, deca-1,6-dienyl, deca-1,7-dienyl, deca-1,8-dienyl, deca-2,5-dienyl, deca-2,6-dienyl, deca-2,7-dienyl, deca-2,8-dienyl and the like. The remarks for alkenyl also apply correspondingly to the alkenyl groups in alkenyloxy, alkenylthio, etc.

The expression "alkynyl" comprises unsubstituted or substituted alkynyl groups which have one or more nonadjacent triple bonds, such as ethynyl, 1-propynyl, 2-propynyl, 1-butynyl, 2-butynyl, 3-butynyl, 1-pentynyl, 2-pentynyl, 3-pentynyl, 4-pentynyl, 1-hexynyl, 2-hexynyl, 3-hexynyl, 4-hexynyl, 5-hexynyl and the like. The remarks for alkynyl also apply to the alkynyl groups in alkynyloxy, alkynylthio, etc. Substituted alkynyls preferably bear one or more (for example 1, 2, 3, 4, 5 or more than 5) of the substituents mentioned above for alkyl.

In the context of the present invention, the term "cycloalkyl" comprises unsubstituted and also substituted cycloalkyl groups, preferably C$_3$-C$_8$-cycloalkyl groups, such as cyclopropyl, cyclobutyl, cyclopentyl, cyclohexyl, cycloheptyl or cyclooctyl, in particular C$_5$-C$_8$-cycloalkyl. Substituted cycloalkyl groups may have one or more (for example 1, 2, 3, 4, 5 or more than 5) substituents. These are preferably each independently selected from alkyl and the substituents mentioned above for the alkyl groups. In the case of substitution, the cycloalkyl groups bear preferably one or more, for example one, two, three, four or five C$_1$-C$_6$-alkyl groups.

Examples of preferred cycloalkyl groups are cyclopentyl, 2- and 3-methylcyclopentyl, 2- and 3-ethylcyclopentyl, cyclohexyl, 2-, 3- and 4-methylcyclohexyl, 2-, 3- and 4-ethylcyclohexyl, 3- and 4-propylcyclohexyl, 3- and 4-isopropylcyclohexyl, 3- and 4-butylcyclohexyl, 3- and 4-sec-butylcyclohexyl, 3- and 4-tert-butylcyclohexyl, cycloheptyl, 2-, 3- and 4-methylcycloheptyl, 2-, 3- and 4-ethylcycloheptyl, 3- and 4-propylcycloheptyl, 3- and 4-isopropylcycloheptyl, 3- and 4-butylcycloheptyl, 3- and 4-sec-butylcycloheptyl, 3- and 4-tert-butylcycloheptyl, cyclooctyl, 2-, 3-, 4- and 5-methylcyclooctyl, 2-, 3-, 4- and 5-ethylcyclooctyl, 3-, 4- and 5-propylcyclooctyl.

The expression cycloalkenyl comprises unsubstituted and substituted, monounsaturated hydrocarbon groups having from 3 to 8, preferably from 5 to 6 carbon ring members, such as cyclopenten-1-yl, cyclopenten-3-yl, cyclohexen-1-yl, cyclohexen-3-yl, cyclohexen-4-yl and the like. Suitable substituents are those mentioned above for cycloalkyl.

The expression bicycloalkyl comprises preferably bicyclic hydrocarbon radicals having from 5 to 10 carbon atoms, such as bicyclo[2.2.1]hept-1-yl, bicyclo[2.2.1]hept-2-yl, bicyclo[2.2.1]hept-7-yl, bicyclo[2.2.2]oct-1-yl, bicyclo[2.2.2]oct-2-yl, bicyclo[3.3.0]octyl, bicyclo[4.4.0]decyl and the like.

In the context of the present invention, the expression "aryl" comprises mono- or polycyclic aromatic hydrocarbon radicals which may be unsubstituted or substituted. Aryl is preferably unsubstituted or substituted phenyl, naphthyl, indenyl, fluorenyl, anthracenyl, phenanthrenyl, naphthacenyl, chrysenyl, pyrenyl, etc., and more preferably phenyl or naphthyl. Depending on the number and size of their ring systems, substituted aryls may have one or more (for example 1, 2, 3, 4, 5 or more than 5) substituents. These are preferably each independently selected from alkyl, alkoxy, cycloalkyl, heterocycloalkyl, aryl, hetaryl, halogen, hydroxyl, thiol, COOH, carboxylate, SO$_3$H, sulfonate, NE$^5$E$^6$, nitro and cyano, where E$^5$ and E$^6$ are each independently hydrogen, alkyl, cycloalkyl, heterocycloalkyl, aryl or hetaryl. Halogen substituents are preferably fluorine, chlorine or bromine. Aryl is more preferably phenyl which, in the case of substitution, may generally bear 1, 2, 3, 4 or 5, preferably 1, 2 or 3 substituents.

Aryl which bears one or more radicals is, for example, 2-, 3- and 4-methylphenyl, 2,4-, 2,5-, 3,5- and 2,6-dimethylphenyl, 2,4,6-trimethylphenyl, 2-, 3- and 4-ethylphenyl, 2,4-, 2,5-, 3,5- and 2,6-diethylphenyl, 2,4,6-triethylphenyl, 2-, 3- and 4-propylphenyl, 2,4-, 2,5-, 3,5- and 2,6-dipropylphenyl, 2,4,6-tripropylphenyl, 2-, 3- and 4-isopropylphenyl, 2,4-, 2,5-, 3,5- and 2,6-diisopropylphenyl, 2,4,6-triisopropylphenyl, 2-, 3- and 4-butylphenyl, 2,4-, 2,5-, 3,5- and 2,6-dibutylphenyl, 2,4,6-tributylphenyl, 2-, 3- and 4-isobutylphenyl, 2,4-, 2,5-, 3,5- and 2,6-diisobutylphenyl, 2,4,6-triisobutylphenyl, 2-, 3- and 4-sec-butylphenyl, 2,4-, 2,5-, 3,5- and 2,6-di-sec-butylphenyl, 2,4,6-tri-sec-butylphenyl, 2-, 3- and 4-tert-butylphenyl, 2,4-, 2,5-, 3,5- and 2,6-di-tert-butylphenyl and 2,4,6-tri-tert-butylphenyl; 2-, 3- and 4-methoxyphenyl, 2,4-, 2,5-, 3,5- and 2,6-dimethoxyphenyl, 2,4,6-trimethoxyphenyl, 2-, 3- and 4-ethoxyphenyl, 2,4-, 2,5-, 3,5- and 2,6-diethoxyphenyl, 2,4,6-triethoxyphenyl, 2-, 3- and 4-propoxyphenyl, 2,4-, 2,5-, 3,5- and 2,6-dipropoxyphenyl, 2-, 3- and 4-isopropoxyphenyl, 2,4-, 2,5-, 3,5- and 2,6-diisopropoxyphenyl and 2-, 3- and 4-butoxyphenyl; 2-, 3- and 4-cyanophenyl.

In the context of the present invention, the expression "heterocycloalkyl" comprises nonaromatic, unsaturated or fully saturated, cycloaliphatic groups having generally from 5 to 8 ring atoms, preferably 5 or 6 ring atoms, in which 1, 2 or 3 of the ring carbon atoms are replaced by heteroatoms selected from oxygen, nitrogen, sulfur and an —NR$^e$— group and which is unsubstituted or substituted by one or more, for example 1, 2, 3, 4, 5 or 6 C$_1$-C$_6$-alkyl groups. Examples of such heterocycloaliphatic groups include pyrrolidinyl, piperidinyl, 2,2,6,6-tetramethylpiperidinyl, imidazolidinyl, pyrazolidinyl, oxazolidinyl, morpholidinyl, thiazolidinyl, isothiazolidinyl, isoxazolidinyl, piperazinyl, tetrahydrothiophenyl, dihydrothien-2-yl, tetrahydrofuranyl, dihydrofuran-2-yl, tetrahydropyranyl, 1,2-oxazolin-5-yl, 1,3-oxazolin-2-yl and dioxanyl.

In the context of the present invention, the expression "heteroaryl" comprises unsubstituted or substituted, heteroaromatic, mono- or polycyclic groups, preferably the pyridyl, quinolinyl, acridinyl, pyridazinyl, pyrimidinyl, pyrazinyl, pyrrolyl, imidazolyl, pyrazolyl, indolyl, purinyl, indazolyl, benzotriazolyl, 1,2,3-triazolyl, 1,3,4-triazolyl and carbazolyl groups, where these heterocycloaromatic groups, in the case of substitution, may generally bear 1, 2 or 3 substituents. The substituents are preferably selected from $C_1$-$C_6$-alkyl, $C_1$-$C_6$-alkoxy, hydroxyl, carboxyl, halogen and cyano.

Nitrogen-containing 5- to 7-membered heterocycloalkyl or heteroaryl radicals which, if appropriate, comprise further heteroatoms selected from oxygen and sulfur comprise, for example, pyrrolyl, pyrazolyl, imidazolyl, triazolyl, pyrrolidinyl, pyrazolinyl, pyrazolidinyl, imidazolinyl, imidazolidinyl, pyridinyl, pyridazinyl, pyrimidinyl, pyrazinyl, triazinyl, piperidinyl, piperazinyl, oxazolyl, isooxazolyl, thiazolyl, isothiazolyl, indolyl, quinolinyl, isoquinolinyl or quinaldinyl.

Halogen is fluorine, chlorine, bromine or iodine.

Specific examples of the $R^a$ and $R^b$ radicals mentioned in the formulae which follow are individually:

methyl, ethyl, n-propyl, isopropyl, n-butyl, isobutyl, sec-butyl, tert-butyl, n-pentyl, n-hexyl, n-heptyl, n-octyl, n-nonyl, n-decyl, n-undecyl, n-dodecyl, n-tridecyl, n-tetradecyl, n-hexadecyl, n-octadecyl and n-eicosyl, 2-methoxyethyl, 2-ethoxyethyl, 2-propoxyethyl, 2-butoxyethyl, 3-methoxypropyl, 3-ethoxypropyl, 3-propoxypropyl, 3-butoxypropyl, 4-methoxybutyl, 4-ethoxybutyl, 4-propoxybutyl, 3,6-dioxaheptyl, 3,6-dioxaoctyl, 4,8-dioxanonyl, 3,7-dioxaoctyl, 3,7-dioxanonyl, 4,7-dioxaoctyl, 4,7-dioxanonyl, 2- and 4-butoxybutyl, 4,8-dioxadecyl, 3,6,9-trioxadecyl, 3,6,9-trioxaundecyl, 3,6,9-trioxadodecyl, 3,6,9,12-tetraoxamidecyl and 3,6,9,12-tetraoxatetradecyl;

2-methylthioethyl, 2-ethylthioethyl, 2-propylthioethyl, 2-butylthioethyl, 3-methylthiopropyl, 3-ethylthiopropyl, 3-propylthiopropyl, 3-butylthiopropyl, 4-methylthiobutyl, 4-ethylthiobutyl, 4-propylthiobutyl, 3,6-dithiaheptyl, 3,6-dithiaoctyl, 4,8-dithianonyl, 3,7-dithiaoctyl, 3,7-dithianonyl, 2- and 4-butylthiobutyl, 4,8-dithiadecyl, 3,6,9-trithiadecyl, 3,6,9-trithiaundecyl, 3,6,9-trithiadodecyl, 3,6,9,12-tetrathiamidecyl and 3,6,9,12-tetrathiatetradecyl;

2-monomethyl- and 2-monoethylaminoethyl, 2-dimethylaminoethyl, 2- and 3-dimethyl-aminopropyl, 3-monoisopropylaminopropyl, 2- and 4-monopropylaminobutyl, 2- and 4-dimethylaminobutyl, 6-methyl-3,6-diazaheptyl, 3,6-dimethyl-3,6-diazaheptyl, 3,6-diazaoctyl, 3,6-dimethyl-3,6-diazaoctyl, 9-methyl-3,6,9-triazadecyl, 3,6,9-trimethyl-3,6,9-triazadecyl, 3,6,9-triazaundecyl, 3,6,9-trimethyl-3,6,9-triazaundecyl, 12-methyl-3,6,9,12-tetraazamidecyl and 3,6,9,12-tetramethyl-3,6,9,12-tetraazamidecyl;

(1-ethylethylidene)aminoethylene, (1-ethylethylidene)aminopropylene, (1-ethylethylidene)aminobutylene, (1-ethylethylidene)aminodecylene and (1-ethylethylidene)aminododecylene;

propan-2-on-1-yl, butan-3-on-1-yl, butan-3-on-2-yl and 2-ethylpentan-3-on-1-yl;

2-methylsulfinylethyl, 2-ethylsulfinylethyl, 2-propylsulfinylethyl, 2-isopropylsulfinylethyl, 2-butylsulfinylethyl, 2- and 3-methylsulfinylpropyl, 2- and 3-ethylsulfinylpropyl, 2- and 3-propylsulfinylpropyl, 2- and 3-butylsulfinylpropyl, 2- and 4-methylsulfinylbutyl, 2- and 4-ethylsulfinylbutyl, 2- and 4-propylsulfinylbutyl and 4-butylsulfinylbutyl;

2-methylsulfonylethyl, 2-ethylsulfonylethyl, 2-propylsulfonylethyl, 2-isopropylsulfonylethyl, 2-butylsulfonylethyl, 2- and 3-methylsulfonylpropyl, 2- and 3-ethylsulfonylpropyl, 2- and 3-propylsulfonylpropyl, 2- and 3-butylsulfonylpropyl, 2- and 4-methylsulfonylbutyl, 2- and 4-ethylsulfonylbutyl, 2- and 4-propylsulfonylbutyl and 4-butylsulfonylbutyl;

carboxymethyl, 2-carboxyethyl, 3-carboxypropyl, 4-carboxybutyl, 5-carboxypentyl, 6-carboxyhexyl, 8-carboxyoctyl, 10-carboxydecyl, 12-carboxydodecyl and 14-carboxytetradecyl;

sulfomethyl, 2-sulfoethyl, 3-sulfopropyl, 4-sulfobutyl, 5-sulfopentyl, 6-sulfohexyl, 8-sulfooctyl, 10-sulfodecyl, 12-sulfododecyl and 14-sulfotetradecyl;

2-hydroxyethyl, 2- and 3-hydroxypropyl, 3- and 4-hydroxybutyl and 8-hydroxy-4-oxaoctyl;

2-cyanoethyl, 3-cyanopropyl, 3- and 4-cyanobutyl;

2-chloroethyl, 2- and 3-chloropropyl, 2-, 3- and 4-chlorobutyl, 2-bromoethyl, 2- and 3-bromopropyl and 2-, 3- and 4-bromobutyl;

2-nitroethyl, 2- and 3-nitropropyl and 2-, 3- and 4-nitrobutyl;

methoxy, ethoxy, propoxy, butoxy, pentoxy and hexoxy;

methylthio, ethylthio, propylthio, butylthio, pentylthio and hexylthio;

ethynyl, 1- and 2-propynyl, 1-, 2- and 3-butynyl, 1-, 2-, 3- and 4-pentynyl, 1-, 2-, 3-, 4- and 5-hexynyl, 1-, 2-, 3-, 4-, 5-, 6-, 7-, 8- and 9-decynyl, 1-, 2-, 3-, 4-, 5-, 6-, 7-, 8-, 9-, 10- and 11-dodecynyl and 1-, 2-, 3-, 4-, 5-, 6-, 7-, 8-, 9-, 10-, 11-, 12-, 13-, 14-, 15-, 16- and 17-octadecynyl;

ethenyl, 1- and 2-propenyl, 1-, 2- and 3-butenyl, 1-, 2-, 3- and 4-pentenyl, 1-, 2-, 3-, 4- and 5-hexenyl, 1-, 2-, 3-, 4-, 5-, 6-, 7-, 8- and 9-decenyl, 1-, 2-, 3-, 4-, 5-, 6-, 7-, 8-, 9-, 10- and 11-dodecenyl and 1-, 2-, 3-, 4-, 5-, 6-, 7-, 8-, 9-, 10-, 11-, 12-, 13-, 14-, 15-, 16- and 17-octadecenyl;

methylamino, ethylamino, propylamino, butylamino, pentylamino, hexylamino, dicyclopentylamino, dicyclohexylamino, dicycloheptylamino, diphenylamino and dibenzylamino;

formylamino, acetylamino, propionylamino and benzoylamino;

carbamoyl, methylaminocarbonyl, ethylaminocarbonyl, propylaminocarbonyl, butylaminocarbonyl, pentylaminocarbonyl, hexylaminocarbonyl, heptylaminocarbonyl, octylaminocarbonyl, nonylaminocarbonyl, decylaminocarbonyl and phenylaminocarbonyl;

aminosulfonyl, N-dodecylaminosulfonyl, N,N-diphenylaminosulfonyl and N,N-bis(4-chlorophenyl)aminosulfonyl;

methoxycarbonyl, ethoxycarbonyl, propoxycarbonyl, hexoxycarbonyl, dodecyloxycarbonyl, octadecyloxycarbonyl, phenoxycarbonyl, (4-tert-butylphenoxy)carbonyl and (4-chlorophenoxy)carbonyl;

methoxysulfonyl, ethoxysulfonyl, propoxysulfonyl, butoxysulfonyl, hexoxysulfonyl, dodecyloxysulfonyl, octadecyloxysulfonyl, phenoxysulfonyl, 1- and 2-naphthyloxysulfonyl, (4-tert-butylphenoxy)sulfonyl and (4-chlorophenoxy)sulfonyl;

diphenylphosphino, di(o-tolyl)phosphino and diphenylphosphinoxido;

fluorine, chlorine, bromine and iodine;

phenylazo, 2-naphthylazo, 2-pyridylazo and 2-pyrimidylazo;

cyclopropyl, cyclobutyl, cyclopentyl, 2- and 3-methylcyclopentyl, 2- and 3-ethylcyclopentyl, cyclohexyl, 2-, 3- and 4-methylcyclohexyl, 2-, 3- and 4-ethylcyclohexyl, 3- and 4-propylcyclohexyl, 3- and 4-isopropylcyclohexyl, 3- and 4-butylcyclohexyl, 3- and 4-sec-butylcyclohexyl, 3- and 4-tert-butylcyclohexyl, cycloheptyl, 2-, 3- and 4-methylcycloheptyl, 2-, 3- and 4-ethylcycloheptyl, 3- and 4-propylcycloheptyl, 3- and 4-isopropylcycloheptyl, 3- and 4-butylcycloheptyl, 3- and 4-sec-butylcycloheptyl, 3- and 4-tert-butylcycloheptyl, cyclooctyl, 2-, 3-, 4- and 5-methylcyclooctyl, 2-, 3-, 4- and 5-ethylcyclooctyl and 3-, 4- and 5-propylcyclooctyl; 3- and 4-hydroxycyclohexyl, 3- and 4-nitrocyclohexyl and 3- and 4-chlorocyclohexyl;

1-, 2- and 3-cyclopentenyl, 1-, 2-, 3- and 4-cyclohexenyl, 1-, 2- and 3-cycloheptenyl and 1-, 2-, 3- and 4-cyclooctenyl;

2-dioxanyl, 1-morpholinyl, 1-thiomorpholinyl, 2- and 3-tetrahydrofuryl, 1-, 2- and 3-pyrrolidinyl, 1-piperazyl, 1-diketopiperazyl and 1-, 2-, 3- and 4-piperidyl;

phenyl, 2-naphthyl, 2- and 3-pyrryl, 2-, 3- and 4-pyridyl, 2-, 4- and 5-pyrimidyl, 3-, 4- and 5-pyrazolyl, 2-, 4- and 5-imidazolyl, 2-, 4- and 5-thiazolyl, 3-(1,2,4-triazyl), 2-(1,3,5-triazyl), 6-quinaldyl, 3-, 5-, 6- and 8-quinolinyl, 2-benzoxazolyl, 2-benzothiazolyl, 5-benzothiadiazolyl, 2- and 5-benzimidazolyl and 1- and 5-isoquinolyl;

1-, 2-, 3-, 4-, 5-, 6- and 7-indolyl, 1-, 2-, 3-, 4-, 5-, 6- and 7-isoindolyl, 5-(4-methylisoindolyl), 5-(4-phenylisoindolyl), 1-, 2-, 4-, 6-, 7- and 8-(1,2,3,4-tetrahydroisoquinolinyl), 3-(5-phenyl)-(1,2,3,4-tetrahydroisoquinolinyl), 5-(3-dodecyl-(1,2,3,4-tetrahydroisoquinolinyl), 1-, 2-, 3-, 4-, 5-, 6-, 7- and 8-(1,2,3,4-tetrahydroquinolinyl) and 2-, 3-, 4-, 5-, 6-, 7- and 8-chromanyl, 2-, 4- and 7-quinolinyl, 2-(4-phenylquinolinyl) and 2-(5-ethylquinolinyl);

2-, 3- and 4-methylphenyl, 2,4-, 3,5- and 2,6-dimethylphenyl, 2,4,6-trimethylphenyl, 2-, 3- and 4-ethylphenyl, 2,4-, 3,5- and 2,6-diethylphenyl, 2,4,6-triethylphenyl, 2-, 3- and 4-propylphenyl, 2,4-, 3,5- and 2,6-dipropylphenyl, 2,4,6-tripropylphenyl, 2-, 3- and 4-isopropylphenyl, 2,4-, 3,5- and 2,6-diisopropylphenyl, 2,4,6-triisopropylphenyl, 2-, 3- and 4-butylphenyl, 2,4-, 3,5- and 2,6-dibutylphenyl, 2,4,6-tributylphenyl, 2-, 3- and 4-isobutylphenyl, 2,4-, 3,5- and 2,6-diisobutylphenyl, 2,4,6-triisobutylphenyl, 2-, 3- and 4-sec-butylphenyl, 2,4-, 3,5- and 2,6-di-sec-butylphenyl and 2,4,6-tri-sec-butylphenyl; 2-, 3- and 4-methoxyphenyl, 2,4-, 3,5- and 2,6-dimethoxyphenyl, 2,4,6-trimethoxyphenyl, 2-, 3- and 4-ethoxyphenyl, 2,4-, 3,5- and 2,6-diethoxyphenyl, 2,4,6-triethoxyphenyl, 2-, 3- and 4-propoxyphenyl, 2,4-, 3,5- and 2,6-dipropoxyphenyl, 2-, 3- and 4-isopropoxyphenyl, 2,4- and 2,6-diisopropoxyphenyl and 2-, 3- and 4-butoxyphenyl; 2-, 3- and 4-chlorophenyl and 2,4-, 3,5- and 2,6-dichlorophenyl; 2-, 3- and 4-hydroxyphenyl and 2,4-, 3,5- and 2,6-dihydroxyphenyl; 2-, 3- and 4-cyanophenyl; 3- and 4-carboxyphenyl; 3- and 4-carboxamidophenyl, 3- and 4-N-methylcarboxamidophenyl and 3- and 4-N-ethylcarboxamidophenyl; 3- and 4-acetylaminophenyl, 3- and 4-propionylaminophenyl and 3- and 4-butyrylaminophenyl; 3- and 4-N-phenylaminophenyl, 3- and 4-N-(o-tolyl)aminophenyl, 3- and 4-N-(m-tolyl)aminophenyl and 3- and 4-(p-tolyl)aminophenyl; 3- and 4-(2-pyridyl)aminophenyl, 3- and 4-(3-pyridyl)aminophenyl, 3- and 4-(4-pyridyl)aminophenyl, 3- and 4-(2-pyrimidyl)aminophenyl and 4-(4-pyrimidyl)aminophenyl;

4-phenylazophenyl, 4-(1-naphthylazo)phenyl, 4-(2-naphthylazo)phenyl, 4-(4-naphthylazo)phenyl, 4-(2-pyridylazo)phenyl, 4-(3-pyridylazo)phenyl, 4-(4-pyridylazo)phenyl, 4-(2-pyrimidylazo)phenyl, 4-(4-pyrimidylazo)phenyl and 4-(5-pyrimidylazo)phenyl;

phenoxy, phenylthio, 2-naphthoxy, 2-naphthylthio, 2-, 3- and 4-pyridyloxy, 2-, 3- and 4-pyridylthio, 2-, 4- and 5-pyrimidyloxy and 2-, 4- and 5-pyrimidylthio.

Preferred fluorine-containing $R^a$ and $R^b$ radicals are as follows:

2,2,2-trifluoroethyl, 2,2,3,3,3-pentafluoropropyl, 2,2-difluoroethyl, 2,2,3,3,4,4,4-heptafluorobutyl, 2,2,3,3,3-pentafluoropropyl, 1H,1H-pentadecafluorooctyl, 3-bromo-3,3-difluoropropyl, 3,3,3-trifluoropropyl, 3,3,3-trifluoropropyl, 1H, 1H,2H,2H-perfluorodecyl, 3-(perfluorooctyl)propyl, 4,4-difluorobutyl-, 4,4,4-trifluorobutyl, 5,5,6,6,6-pentafluorohexyl, 2,2-difluoropropyl, 2,2,2-trifluoro-1-phenylethylamino, 1-benzyl-2,2,2-trifluoroethyl, 2-bromo-2,2-difluoroethyl, 2,2,2-trifluoro-1-pyridin-2-ylethyl, 2,2-difluoropropyl, 2,2,2-trifluoro-1-(4-methoxyphenyl)ethylamino, 2,2,2-trifluoro-1-phenylethyl, 2,2-difluoro-1-phenylethyl, 1-(4-bromophenyl)-2,2,2-trifluoroethyl, 3-bromo-3,3-difluoropropyl, 3,3,3-trifluoropropylamine, 3,3,3-trifluoro-n-propyl, 1H,1H,2H,2H-perfluorodecyl, 3-(perfluorooctyl)propyl, pentafluorophenyl, 2,3,5,6-tetrafluorophenyl, 4-cyano-(2, 3, 5, 6)-tetrafluorophenyl, 4-carboxy-2,3,5,6-tetrafluorophenyl, 2,4-difluorophenyl, 2,4,5-trifluorophenyl, 2,4,6-trifluorophenyl, 2,5-difluorophenyl, 2-fluoro-5-nitrophenyl, 2-fluoro-5-trifluoromethylphenyl, 2-fluoro-5-methylphenyl, 2,6-difluorophenyl, 4-carboxamido-2,3,5,6-tetrafluorophenyl, 2-bromo-4,6-difluorophenyl, 4-bromo-2-fluorophenyl, 2,3-difluorophenyl, 4-chloro-2-fluorophenyl, 2,3,4-trifluorophenyl, 2-fluoro-4-iodophenyl, 4-bromo-2,3,5,6-tetrafluorophenyl, 2,3,6-trifluorophenyl, 2-bromo-3,4,6-trifluorophenyl, 2-bromo-4,5,6-trifluorophenyl, 4-bromo-2,6-difluorophenyl, 2,3,4,5-tetrafluorophenyl, 2,4-difluoro-6-nitrophenyl, 2-fluoro-4-nitrophenyl, 2-chloro-6-fluorophenyl, 2-fluoro-4-methylphenyl, 3-chloro-2,4-difluorophenyl, 2,4-dibromo-6-fluorophenyl, 3,5-dichloro-2,4-difluorophenyl, 4-cyano-1-fluorophenyl, 1-chloro-4-fluorophenyl, 2-fluoro-3-trifluoromethylphenyl, 2-trifluoromethyl-6-fluorophenyl-2,3,4,6-tetrafluorophenyl, 3-chloro-2-fluorophenyl, 5-chloro-2-fluorophenyl, 2-bromo-4-chloro-6-fluorophenyl, 2,3-dicyano-4,5,6-trifluorophenyl, 2,4,5-trifluoro-3-carboxyphenyl, 2,3,4-trifluoro-6-carboxyphenyl, 2,3,5-trifluorophenyl, 4-trifluoromethyl-2,3,5,6-tetrafluorophenyl, 1-fluoro-5-carboxyphenyl, 2-chloro-4,6-difluorophenyl, 6-bromo-3-chloro-2,4-difluorophenyl, 2,3,4-trifluoro-6-nitrophenyl, 2,5-difluoro-4-cyanophenyl, 2,5-difluoro-4-trifluoromethylphenyl, 2,3-difluoro-6-nitrophenyl, 4-trifluoromethyl-2,3-difluorophenyl, 2-bromo-4,6-difluorophenyl, 4-bromo-2-fluorophenyl, 2-nitrotetrafluorophenyl, 2,2',3,3',4,5,5',6,6'-nonafluorobiphenyl, 2-nitro-3,5,6-trifluorophenyl, 2-bromo-6-fluorophenyl, 4-chloro-2-fluoro-6-iodophenyl, 2-fluoro-6-carboxyphenyl, 2,4-difluoro-3-trifluorophenyl, 2-fluoro-4-trifluorophenyl, 2-fluoro-4-carboxyphenyl, 4-bromo-2,5-difluorophenyl, 2,5-dibromo-3,4,6-trifluorophenyl, 2-fluoro-5-methylsulfonylphenyl, 5-bromo-2-fluorophenyl, 2-fluoro-4-hydroxymethylphenyl, 3-fluoro-4-bromomethylphenyl, 2-nitro-4-trifluoromethylphenyl, 4-trifluoromethylphenyl, 2-bromo-4-trifluoromethylphenyl, 2-bromo-6-chloro-4-(trifluoromethyl)phenyl, 2-chloro-4-trifluoromethylphenyl, 3-nitro-4-(trifluoromethyl)phenyl, 2,6-dichloro-4-(trifluoromethyl)phenyl, 4-trifluorophenyl, 2,6-dibromo-4-(trifluoromethyl)phenyl, 4-trifluoromethyl-2,3,5,6-tetrafluorophenyl, 3-fluoro-4-trifluoromethylphenyl, 2,5-difluoro-4-trifluoromethylphenyl, 3,5-difluoro-4-trifluoromethylphenyl, 2,3-difluoro-4-trifluoromethylphenyl, 2,4-bis(trifluoromethyl)phenyl, 3-chloro-4-trifluoromethylphenyl, 2-bromo-4,5-di(trifluoromethyl)phenyl, 5-chloro-2-nitro-4-(trifluoromethyl)

phenyl, 2,4,6-tris(trifluoromethyl)phenyl, 3,4-bis(trifluoromethyl)phenyl, 2-fluoro-3-trifluoromethylphenyl, 2-iodo-4-trifluoromethylphenyl, 2-nitro-4,5-bis(trifluoromethyl)phenyl, 2-methyl-4-(trifluoromethyl)phenyl, 3,5-dichloro-4-(trifluoromethyl)phenyl, 2,3,6-trichloro-4-(trifluoromethyl)phenyl, 4-(trifluoromethyl)benzyl, 2-fluoro-4-(trifluoromethyl)benzyl, 3-fluoro-4-(trifluoromethyl)benzyl, 3-chloro-4-(trifluoromethyl)benzyl, 4-fluorophenethyl, 3-(trifluoromethyl)phenethyl, 2-chloro-6-fluorophenethyl, 2,6-dichlorophenethyl, 3-fluorophenethyl, 2-fluorophenethyl, (2-trifluoromethyl)phenethyl, 4-fluorophenethyl, 3-fluorophenethyl, 4-trifluoromethylphenethyl, 2,3-difluorophenethyl, 3,4-difluorophenethyl, 2,4-difluorophenethyl, 2,5-difluorophenethyl, 3,5-difluorophenethyl, 2,6-difluorophenethyl, 4-(4-fluorophenyl)phenethyl, 3,5-di(trifluoromethyl)phenethyl, pentafluorophenethyl, 2,4-di(trifluoromethyl)phenethyl, 2-nitro-4-(trifluoromethyl)phenethyl, (2-fluoro-3-trifluoromethyl)phenethyl, (2-fluoro-5-trifluoromethyl)phenethyl, (3-fluoro-5-trifluoromethyl)phenethyl, (4-fluoro-2-trifluoromethyl)phenethyl, (4-fluoro-3-trifluoromethyl)phenethyl, (2-fluoro-6-trifluoromethyl)phenethyl, (2,3,6-trifluoro)phenethyl, (2,4,5-trifluoro)phenethyl, (2,4,6-trifluoro)phenethyl, (2,3,4-trifluoro)phenethyl, (3,4,5-trifluoro)phenethyl, (2,3,5-trifluoro)phenethyl, (2-chloro-5-fluoro)phenethyl, (3-fluoro-4-trifluoromethyl)phenethyl, (2-chloro-5-trifluoromethyl)phenethyl, (2-fluoro-3-chloro-5-trifluoromethyl)phenethyl, (2-fluoro-3-chloro)phenethyl, (4-fluoro-3-chloro)phenethyl, (2-fluoro-4-chloro)phenethyl, (2,3-difluoro-4-methyl)phenethyl, 2,6-difluoro-3-chlorophenethyl, (2,6-difluoro-3-methyl)phenethyl, (2-trifluoromethyl-5-chloro)phenethyl, (6-chloro-2-fluoro-5-methyl)phenethyl, (2,4-dichloro-5-fluoro)phenethyl, 5-chloro-2-fluorophenethyl, (2,5-difluoro-6-chloro)phenethyl, (2,3,4,5-tetrafluoro)phenethyl, (2-fluoro-4-trifluoromethyl)phenethyl, 2,3-(difluoro-4-trifluoromethyl)phenethyl, (2,5-di(trifluoromethyl))phenethyl, 2-fluoro-3,5-dibromophenethyl, (3-fluoro-4-nitro)phenethyl, (2-bromo-4-trifluoromethyl)phenethyl, 2-(bromo-5-fluoro)phenethyl, (2,6-difluoro-4-bromo)phenethyl, (2,6-difluoro-4-chloro)phenethyl, (3-chloro-5-fluoro)phenethyl, (2-bromo-5-trifluoromethyl)phenethyl and the like.

Preference is given to compounds of the formula I where n is 2 and 1, 2, 3, 4, 5 or 6 of the $R^{n1}$, $R^{n2}$, $R^{n3}$ and $R^{n4}$ radicals are each fluorine.

Preference is further given to compounds of the formula I where n is 3 and 1, 2, 3 or 4 of the $R^{n1}$, $R^{n2}$, $R^{n3}$ and $R^{n4}$ radicals are each fluorine.

Preference is further given to compounds of the formula I where n is 4 and 1, 2, 3, 4, 5 or 6 of the $R^{n1}$, $R^{n2}$, $R^{n3}$ and $R^{n4}$ radicals are each fluorine.

Rylenetetracarboxylic dianhydrides are referred to hereinafter as compounds I.A. Rylenetetracarboximides are referred to hereinafter as compounds I.B, where compounds I.Ba do not have an additional bridging X group and compounds I.Bb do have such an additional bridging X group.

Preference is given to compounds of the formulae I.A and I.Ba

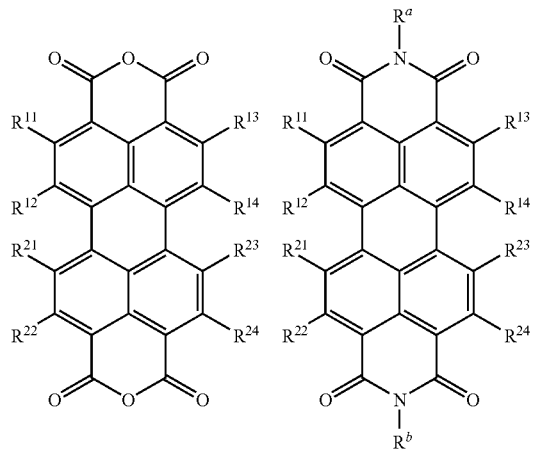

in which
1, 2, 3, 4, 5 or 6 of the $R^{11}$, $R^{12}$, $R^{13}$, $R^{14}$, $R^{21}$, $R^{22}$, $R^{23}$ and $R^{24}$ radicals are each fluorine, if appropriate, at least one of the $R^{11}$, $R^{12}$, $R^{13}$, $R^{14}$, $R^{21}$, $R^{22}$, $R^{23}$ and $R^{24}$ radicals which is not fluorine is a substituent which is selected independently from Cl and Br, and the remaining radicals are each hydrogen, and $R^a$ and $R^b$ each independently have one of the above definitions.

In the aforementioned formulae, the $R^{11}$, $R^{12}$, $R^{13}$, $R^{14}$, $R^{21}$, $R^{22}$, $R^{23}$ and $R^{24}$ radicals which are not fluorine are each hydrogen.

Particular preference is given to compounds of the formulae I.A and I.Ba

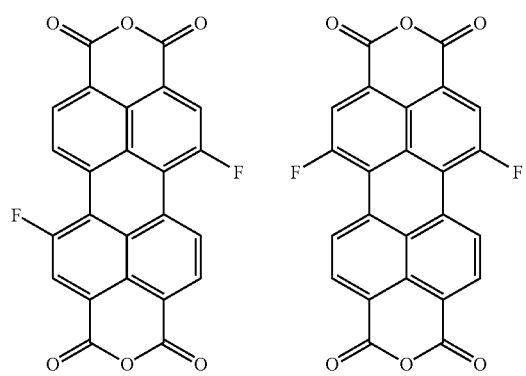

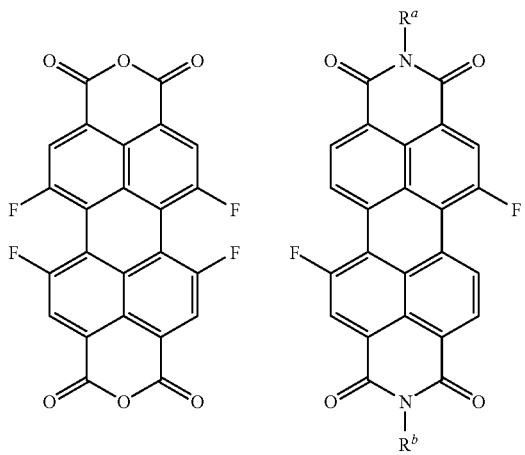

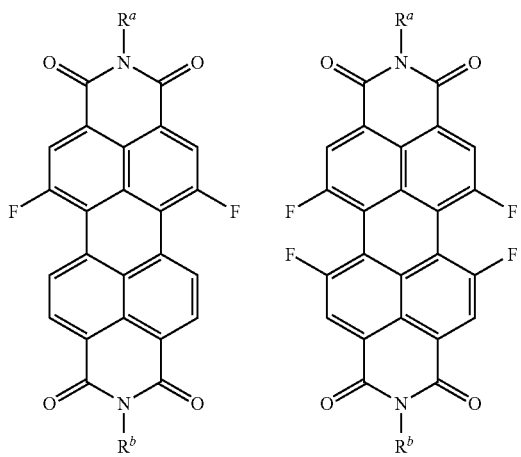

in which

R$^a$ and R$^b$ are each independently hydrogen or unsubstituted or substituted alkyl, alkenyl, alkadienyl, alkynyl, cycloalkyl, bicycloalkyl, cycloalkenyl, heterocycloalkyl, aryl or heteroaryl.

With regard to the definitions of the substituents R$^a$ and R$^b$ in the aforementioned compounds, reference is made to the remarks made at the outset.

More preferably, at least one of the R$^a$ and R$^b$ radicals is an electron-withdrawing substituted radical.

In a specific embodiment, at least one of the R$^a$ and R$^b$ radicals is a mono- or polyfluorine-substituted radical. More preferably, both R$^a$ and R$^b$ are a mono- or polyfluorine-substituted radical. With regard to suitable fluorinated radicals, reference is likewise made to the remarks made at the outset.

In a further specific embodiment, the R$^a$ and R$^b$ radicals are the same.

A further preferred embodiment is that of compounds of the general formulae I.Bb

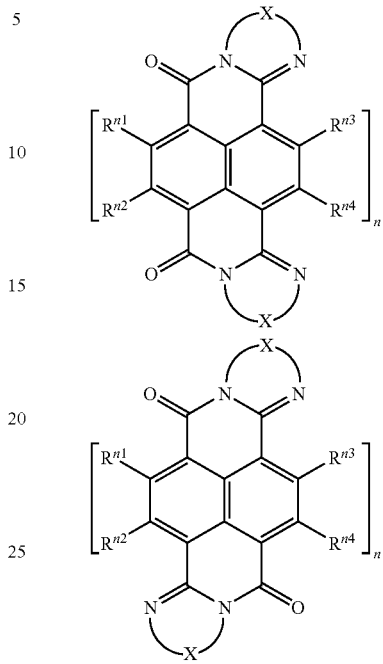

where n and R$^{n1}$, R$^{n2}$, R$^{n3}$ and R$^{n4}$ are each as defined above and X is a divalent bridging group having from 2 to 5 atoms between the flanking bonds.

The bridging X groups, together with the N—C=N group to which they are bonded, are preferably a 5- to 8-membered heterocycle which, if appropriate, is fused singly, doubly or triply to cycloalkyl, heterocycloalkyl, aryl and/or hetaryl, where the fused groups may each independently bear one, two, three or four substituents selected from alkyl, alkoxy, cycloalkyl, aryl, halogen, hydroxyl, thiol, COOH, carboxylate, SO$_3$H, sulfonate, NE$^1$E$^2$, alkylene-NE$^1$E$^3$, nitro and cyano, where E$^1$ and E$^2$ are each independently hydrogen, alkyl, cycloalkyl, heterocycloalkyl, aryl or hetaryl, and/or X may have one, two or three substituents which are selected from optionally substituted alkyl, optionally substituted cycloalkyl and optionally substituted aryl and/or X may be interrupted by 1, 2 or 3 optionally substituted heteroatoms.

The bridging X groups are preferably selected from groups of the formulae (III.a) to (III.d)

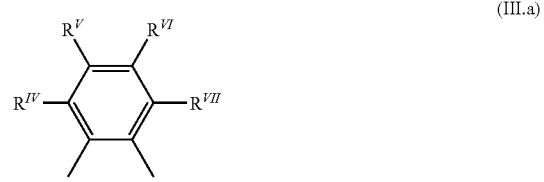
(III.a)

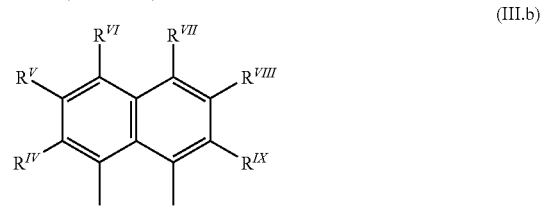
(III.b)

-continued

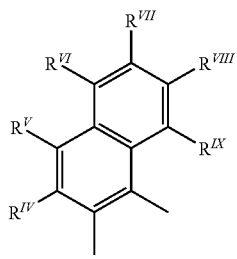
(III.c)

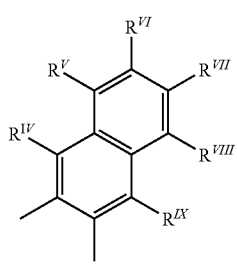
(III.d)

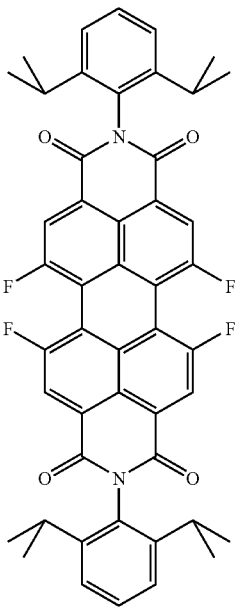

in which $R^{IV}$, $R^V$, $R^{VI}$, $R^{VII}$, $R^{VIII}$ and $R^{IX}$ are each independently hydrogen, alkyl, alkoxy, cycloalkyl, cycloalkoxy, heterocycloalkyl, heterocycloalkoxy, aryl, aryloxy, hetaryl, hetaryloxy, halogen, hydroxyl, thiol, COOH, carboxylate, $SO_3H$, sulfonate, $NE^1E^2$, alkylene-$NE^1E^3$, nitro, alkoxycarbonyl, acyl or cyano, where $E^1$ and $E^2$ are each independently hydrogen, alkyl, cycloalkyl, heterocycloalkyl, aryl or hetaryl.

In a specific embodiment, the $R^{IV}$, $R^V$, $R^{VI}$, $R^{VII}$, $R^{VIII}$ and $R^{IX}$ radicals in the (III.a) to (III.d) groups are each hydrogen.

Some particularly preferred inventive compounds are reproduced below:

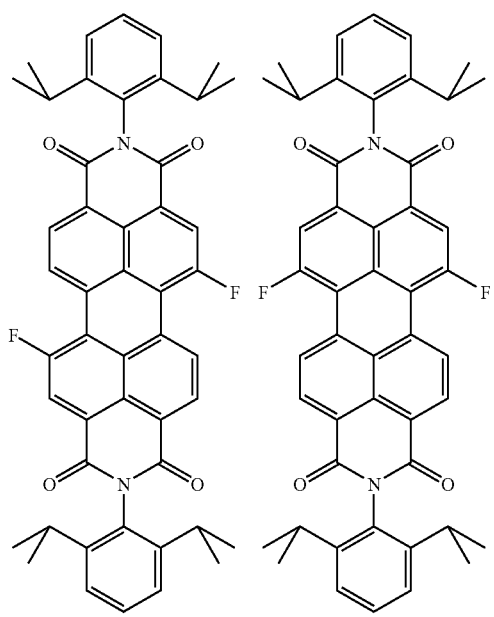

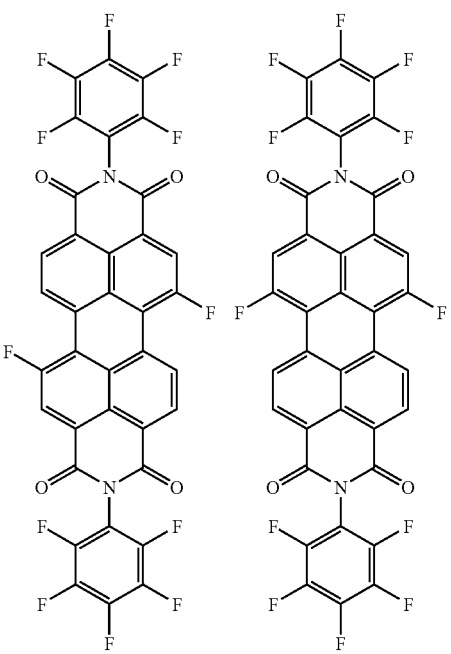

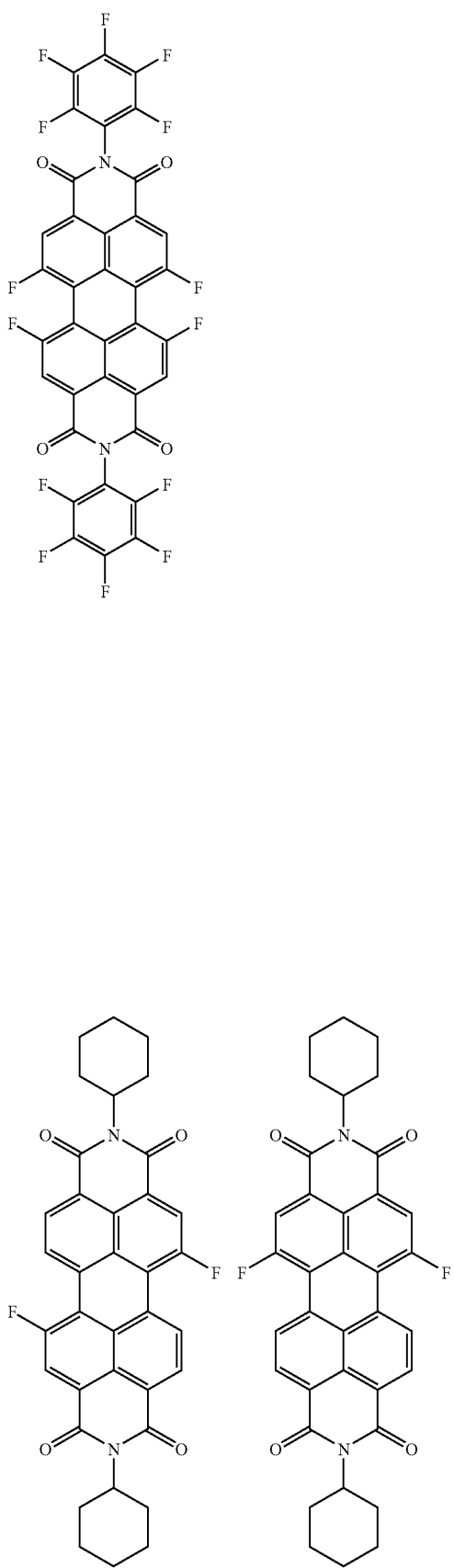

19
-continued
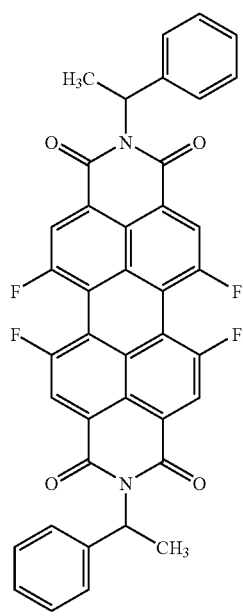
20
-continued
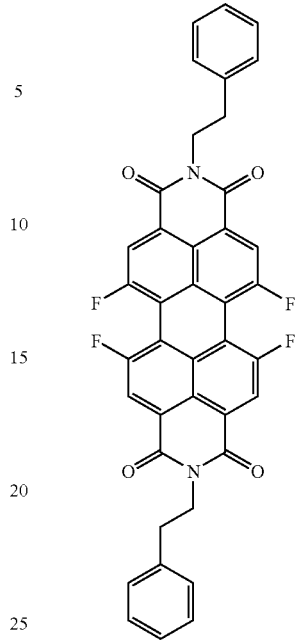
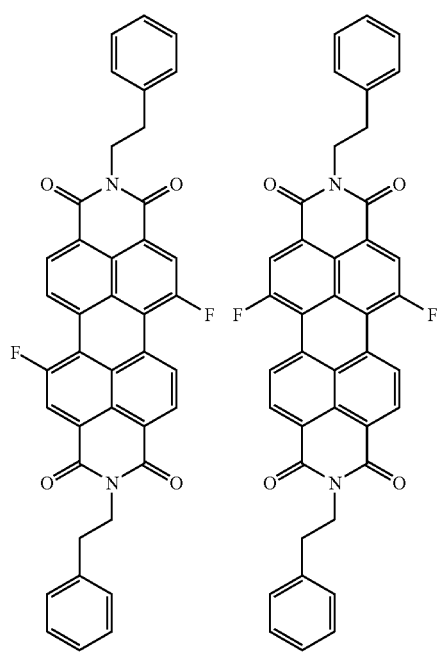
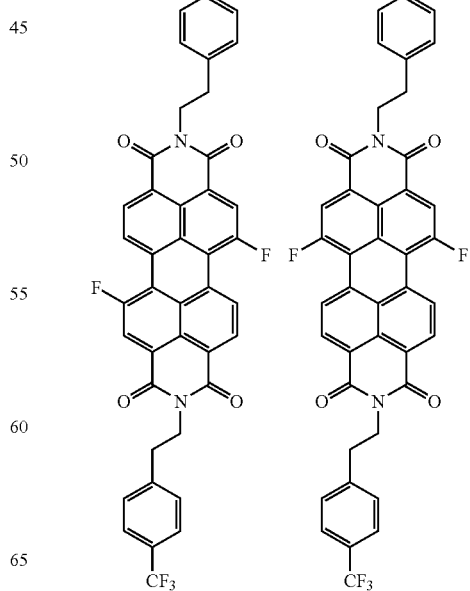

21
-continued
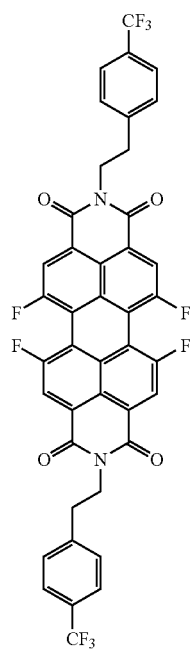
22
-continued
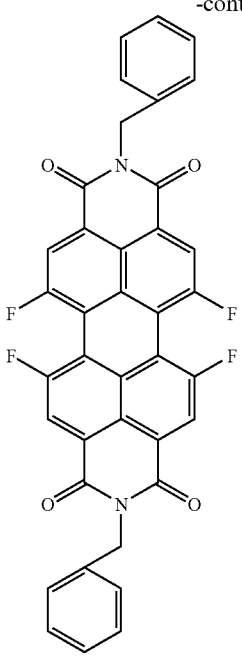
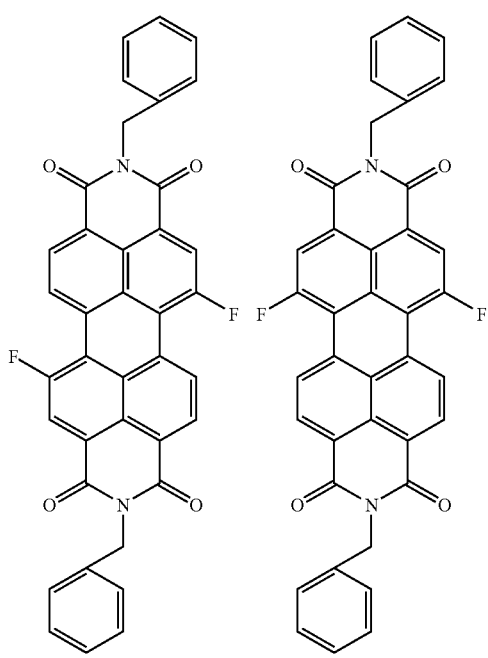
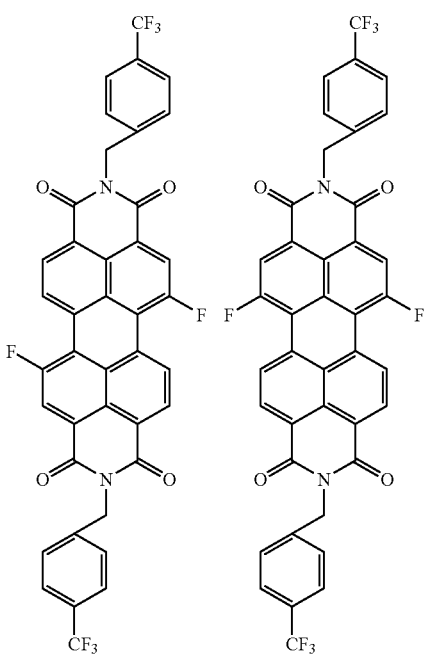

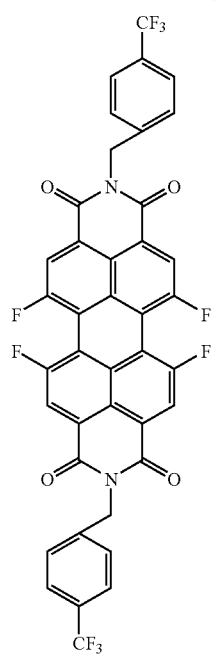
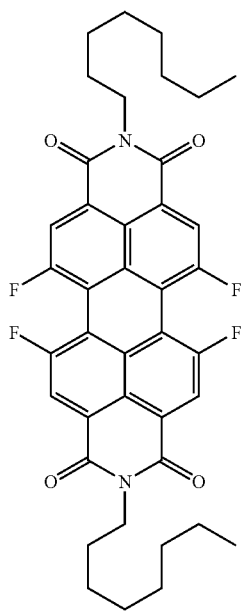

-continued
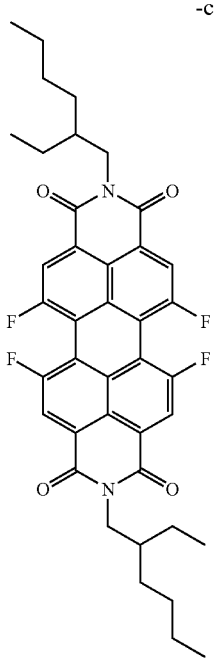
-continued
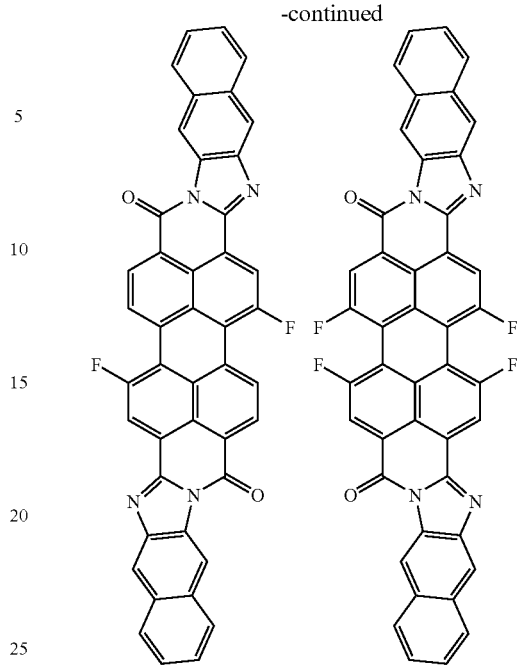
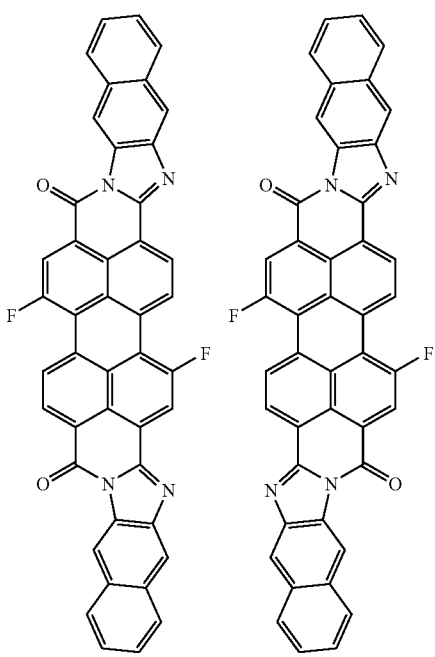
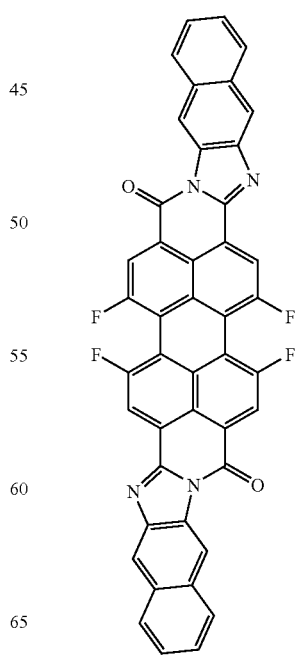

-continued

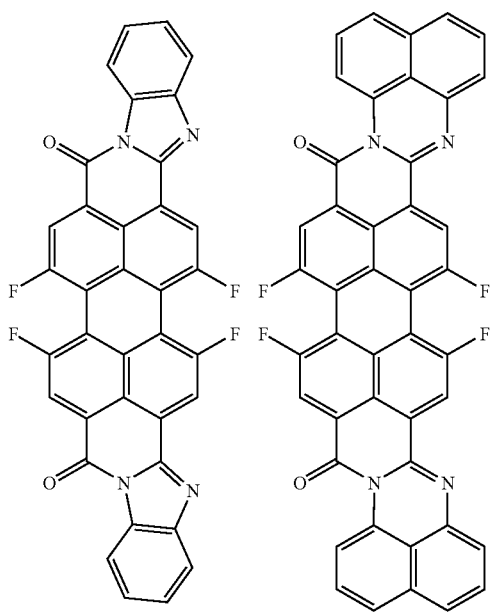

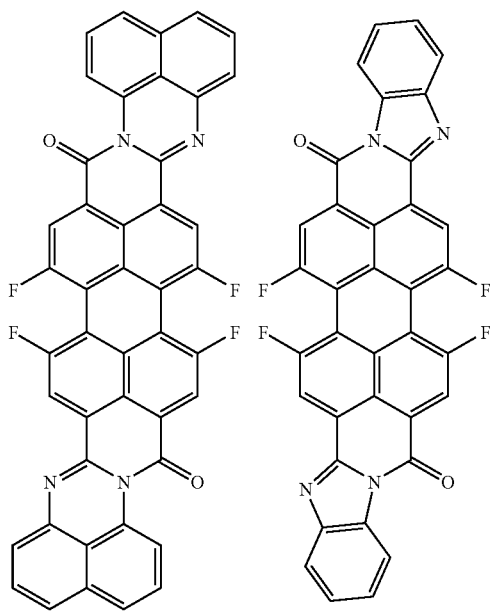

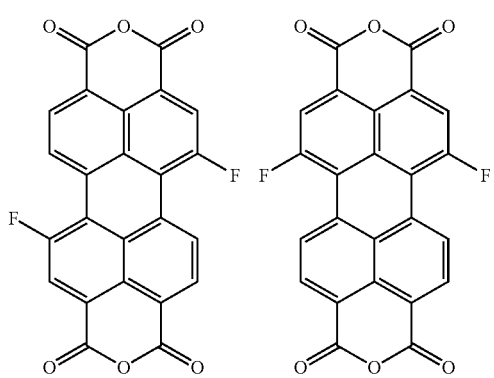

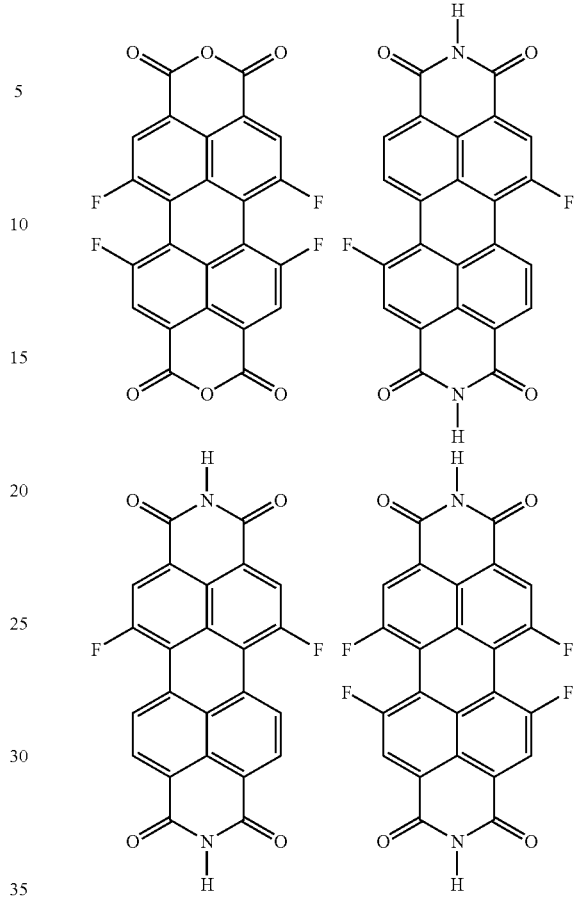

The preparation of the inventive compounds of the general formula I can start from known compounds with the same basic rylene skeleton which, instead of fluorine atoms, bear other halogen atoms such as Br and Cl, especially Br. Specifically, it has been found that, depending on the selection of the reaction conditions, rylene compounds which have at least one bromine atom as a substituent on the aromatic skeleton can be subjected to a full substitution of the halogen atoms by fluorine atoms, or to a partial substitution of the halogen atoms by fluorine atoms with simultaneous partial substitution hydrogen.

The invention therefore further provides a process for preparing compounds of the formula I

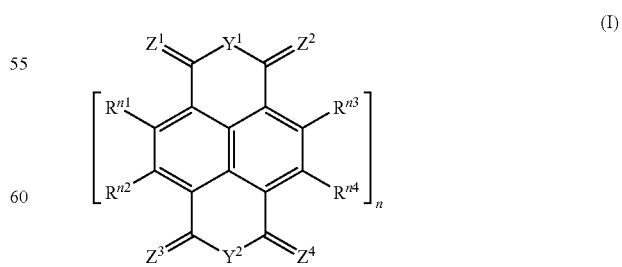

where n, $R^{n1}$, $R^{n2}$, $R^{n3}$ and $R^{n4}$, $Y^1$, $Y^2$, $Z^1$, $Z^2$, $Z^3$ and $Z^4$ are each as defined above, in which a compound of the formula I in which at least one of the $R^{n1}$, $R^{n2}$, $R^{n3}$ and $R^{n4}$, $R^1$, $R^2$, $R^3$ and R⁴ radicals is Cl or Br is subjected to a reaction with an alkali metal fluoride under substantially anhydrous conditions In the context of the invention, "substantially anhydrous conditions" are understood to mean a total water content, based on all components involved in the reaction (reactants, solvents, complexing agents, etc.), of at most 2% by weight, preferably of at most 1% by weight, in particular of at most 0.1% by weight. To achieve the anhydrous reaction conditions, the components involved in the reaction may be subjected to drying by customary processes known to those skilled in the art.

To achieve certain compounds with mixed halogenation, it may be advantageous to subject the compounds obtained after the fluorination to a halogenation with elemental $Cl_2$ and/or $Br_2$.

Suitable process conditions for the aromatic nucleophilic substitution of bromine atoms or chlorine atoms by fluorine atoms (halo-dehalogenation) are known in principle. Suitable conditions for the halo-dehalogenation are described, for example, in J. March, Advanced Organic Chemistry, 4th edition, John Wiley & Sons publishers (1992), p. 659 and in DE-A-32 35 526.

In a first embodiment, the reaction is an exchange of the bromine atoms for fluorine atoms, if appropriate with a partial dehalogenation. To insert the fluorine groups, preference is given to using an alkali metal fluoride, in particular KF, NaF or CsF. Preference is given to using from 1 to 30 equivalents of potassium fluoride per equivalent of rylene compound.

Preferred solvents for the halogen exchange are aprotic polar solvents such as dimethylformamide, N-methylpyrrolidone, $(CH_3)_2SO$, dimethyl sulfone, N,N'-dimethylimidazolidinone or sulfolane. Particular preference is given to using sulfolane as the solvent. Before use, the solvents are preferably subjected to drying to remove water by customary methods known to those skilled in the art.

For halogen exchange, it is additionally possible to use a complexing agent, for example a crown ether. These include, for example, 12-crown-4,15-crown-5,18-crown-6,21-crown-7,24-crown-8, etc. The complexing agent is selected according to its capability of complexing the alkali metals of the alkali metal halides used for the halogen exchange. When KF is used to insert the fluorine groups, the complexing agent used is preferably 18-crown-6. Preference is given to using from 0.1 to 10 equivalents of crown ether per equivalent of rylene compound.

Further suitable phase transfer catalsyts are, for example, selected from 2-azaallenium compounds, carbophosphazenium compounds, aminophosphonium compounds and diphosphazenium compounds. A. Pleschke, A. Marhold, M. Schneider, A. Kolomeitsev and G. V. Röschenthaler, in Journal of Fluorine Chemistry 125, 2004, 1031-1038, give a review of further suitable phase transfer catalysts. Reference is made to the disclosure of this document. In a preferred embodiment, 2-azaallenium compounds such as (N,N-dimethylimidazolidino)tetramethylguanidinium chloride are used. The use amount of these phase transfer catalysts is preferably from 0.1 to 20% by weight, particularly from 1 to 10% by weight, based on the weight of the rylene compound used.

It is likewise possible to use at least one crown ether in combination with at least one phase transfer catalyst different therefrom.

The reaction temperatures are preferably from 100 to 200° C., more preferably from 120 to 160° C. The reaction time is preferably from 0.5 to 48 hours.

In the case of the reaction with alkali metal fluorides in an anhydrous, aprotic, polar solvent, it is generally also possible for a dehalogenation to occur to a certain degree in addition to a halogen exchange. The resulting mixtures may subsequently be subjected to a separation, for example by fractional crystallization from $H_2SO_4$ in the case of anhydrides and imides sparingly soluble in organic solvents. Compounds having better solubility in organic solvents can be separated by recrystallization or column chromatography.

It has been found that a dehydrofluorination can also proceed in the course of the reaction with alkali metal fluorides under substantially anhydrous conditions, i.e., in addition to the chlorine or bromine atom(s), aromatic hydrogen atoms are also substituted by fluorine atoms.

In an illustrative embodiment of the process according to the invention, a dibromoperylene bisimide or a mixture of dibromoperylene bisimides is subjected to a halogen exchange according to the scheme which follows to obtain the corresponding difluoroperylene bisimides (I.Ba).

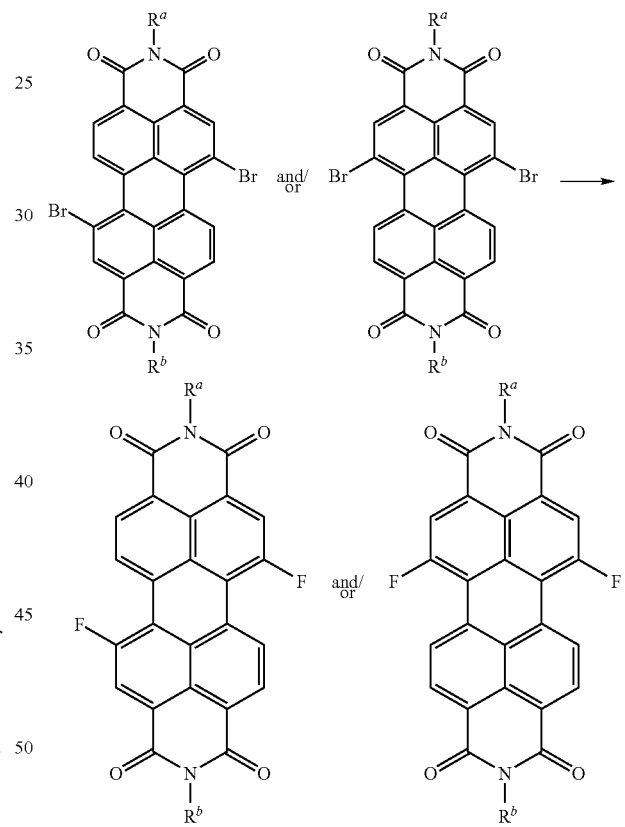

In this scheme, $R^a$ and $R^b$ are each as defined above. $R^a$ and $R^b$ are preferably defined identically and are, for example, each $C_1$-$C_{12}$-alkyl such as methyl, ethyl, n-propyl, isopropyl, n-butyl, isobutyl, sec-butyl, tert-butyl, n-pentyl, n-hexyl, n-heptyl, n-octyl, n-nonyl, n-decyl, n-undecyl or n-dodecyl, cycloalkyl such as cyclopentyl or cyclohexyl, or aryl such as phenyl, 2-, 3- and 4-methylphenyl, 2,4-, 2,5-, 3,5- and 2,6-dimethylphenyl, 2,4,6-trimethylphenyl, 2-, 3- and 4-ethylphenyl, 2,4-, 2,5-, 3,5- and 2,6-diethylphenyl, 2,4,6-triethylphenyl, 2-, 3- and 4-propylphenyl, 2,4-, 2,5-, 3,5- and 2,6-dipropylphenyl, etc.

In this embodiment, the fluorine groups are introduced preferably by using an alkali metal fluoride, especially KF.

For the halogen exchange, in this embodiment, preference is given to using a crown ether, especially -18-crown-6 in the case of use of KF, or another phase transfer catalyst, preferably a 2-azaallenium compound, especially (N,N-dimethylimidazolidino)tetramethylguanidinium chloride (CNC$^+$). Particular preference is given to using sulfolane as the solvent.

In a further illustrative embodiment of the process according to the invention, a tetrachloroperylene bisimide is subjected to a halogen exchange according to the following scheme to obtain the corresponding tetrafluoroperylene bisimides (I.Ba).

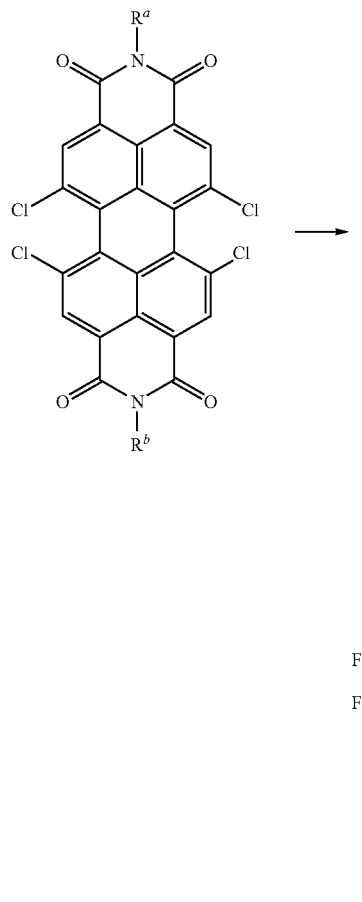

In this scheme, $R^a$ and $R^b$ are each as defined above. $R^a$ and $R^b$ are preferably defined identically and are, for example, each $C_1$-$C_{12}$-alkyl such as methyl, ethyl, n-propyl, isopropyl, n-butyl, isobutyl, sec-butyl, tert-butyl, n-pentyl, n-hexyl, n-heptyl, n-octyl, n-nonyl, n-decyl, n-undecyl or n-dodecyl, or aryl such as phenyl, 2-, 3- and 4-methylphenyl, 2,4-, 2,5-, 3,5- and 2,6-dimethylphenyl, 2,4,6-trimethylphenyl, 2-, 3- and 4-ethylphenyl, 2,4-, 2,5-, 3,5- and 2,6-diethylphenyl, 2,4,6-triethylphenyl, 2-, 3- and 4-propylphenyl, 2,4-, 2,5-, 3,5- and 2,6-dipropylphenyl, etc.

In this embodiment, the fluorine groups are inserted preferably by using an alkali metal fluoride, especially KF.

For the halogen exchange, in this embodiment, it is possible to use a crown ether, especially 18-crown-6 in the case of use of KF. Preference is given to using a 2-azaallenium compound, especially (N,N-dimethylimidazolidino)tetramethylguanidinium chloride (CNC$^+$). Particular preference is given to using sulfolane as the solvent.

For use of the products as a semiconductor, it may be advantageous to subject the products to a further purification. These include, for example, column chromatography processes in which the products, dissolved, for example, in a halogenated hydrocarbon such as methylene chloride or a toluene/ or petroleum ether/ethyl acetate mixture, are subjected to a separation or filtration on silica gel. Also possible is a purification by sublimation or crystallization.

The invention further provides a process for preparing compounds of the formula (I.Ba)

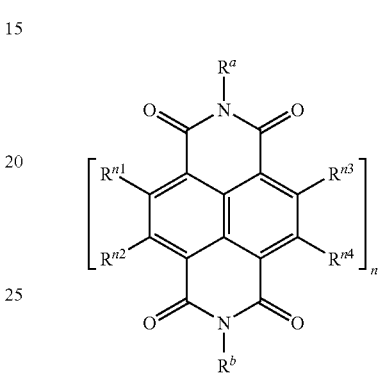

where n, $R^{n1}$, $R^{n2}$, $R^{n3}$ and $R^{n4}$ are each as defined above, and $R^a$ and $R^b$ are each independently hydrogen or unsubstituted or substituted alkyl, alkenyl, alkadienyl, alkynyl, cycloalkyl, bicycloalkyl, cycloalkenyl, heterocycloalkyl, aryl or heteroaryl, in which a1) a rylene dianhydride of the formula II

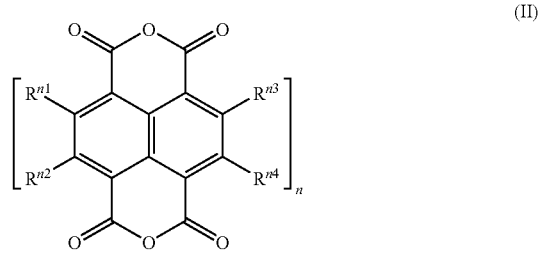

(II)

where at least one of the $R^{n1}$, $R^{n2}$, $R^{n3}$ and $R^{n4}$, $R^1$ radicals is Cl or Br and n is 2,3 or 4, is subjected to a reaction with an alkali metal fluoride under substantially anhydrous conditions as described above, b1) the compound obtained in step a1) is subjected to a reaction with an amine of the formula $R^a$—$NH_2$ and, if appropriate, a different amine of the formula $R^b$—$NH_2$.

The invention further provides a process for preparing compounds of the formulae I.Bb

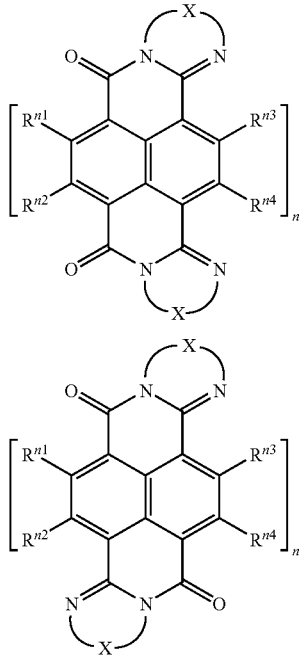

where n, X, $R^{n1}$, $R^{n2}$, $R^{n3}$ and $R^{n4}$ are each as defined above, in which a2) a rylene dianhydride of the formula II,

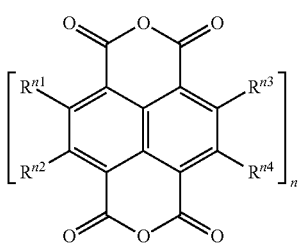

where at least one of the $R^{n1}$, $R^{n2}$, $R^{n3}$ and $R^{n4}$ radicals is Cl or Br and n is 2,3 or 4, is subjected to a reaction with an alkali metal fluoride under substantially anhydrous conditions as described above, b2) the compound obtained in step a2) is subjected to a reaction with an amine of the formula $H_2N$—X—$NH_2$.

Steps a1) and a2)

Suitable process conditions for the aromatic nucleophilic substitution of bromine atoms or chlorine atoms by fluorine atoms (and, if appropriate, partly by hydrogen atoms) are those described above, to which reference is made here.

Steps b1) and b2)

When the imidization in step b1) is effected by subjecting the compound obtained in step a1) to a reaction with an amine of the formula $R^a$—$NH_2$ and, if appropriate, an amine of the formula $R^b$—$NH_2$, the result is at least one compound of the general formula (I.Ba)

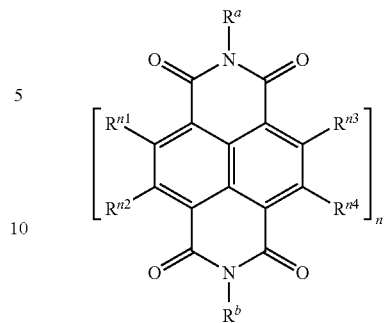

where $R^b$ may also have the same definition as $R^a$ (if only one amine of the formula $R^a$—$NH_2$ is used for the imidization).

When the imidization in step b2) is effected by subjecting the compound obtained in step a2) to a reaction with an amine of the formula $H_2N$—X—$NH_2$ where X is a divalent bridging group having from 2 to 5 atoms between the flanking bonds, the result is at least one compound of the general formulae (I.Bb)

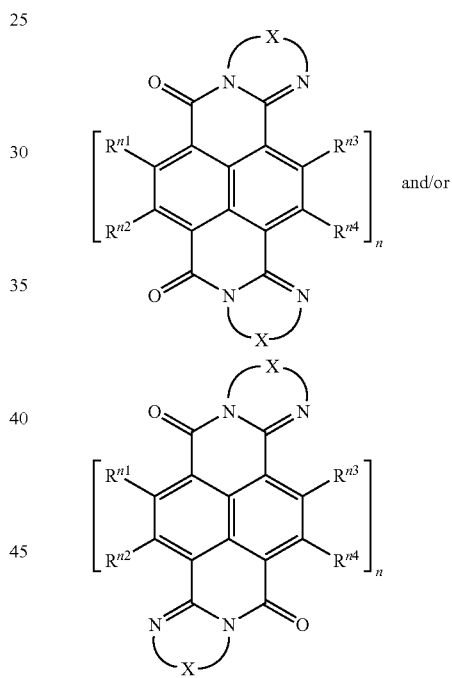

and/or

The imidation of the carboxylic anhydride groups in reaction steps b1) and b2) is known in principle and described, for example, in DE 10 2004 007 382 A1. The reaction of the dianhydride with the primary amine is effected preferably in the presence of an aromatic solvent such as toluene, xylene, mesitylene, phenol or a polar aprotic solvent. Suitable polar aprotic solvents are nitrogen heterocycles such as pyridine, pyrimidine, quinoline, isoquinoline, quinaldine, N-methylpiperidine, N-methylpiperidone and N-methylpyrrolidone. For reaction with an aromatic diamine of the formula $H_2N$—X—$NH_2$, preference is given to using a nitrogen heterocycle or phenol as the solvent. Suitable catalysts are those mentioned below. In the case of use of phenol as the solvent, the catalyst used is preferably piperazine.

The reaction can be undertaken in the presence of an imidation catalyst. Suitable imidation catalysts are organic and inorganic acids, for example formic acid, acetic acid, propionic acid and phosphoric acid. Suitable imidation catalysts are also organic and inorganic salts of transition metals such as zinc, iron, copper and magnesium. These include, for example, zinc acetate, zinc propionate, zinc oxide, iron(II) acetate, iron(III) chloride, iron(II) sulfate, copper(II) acetate, copper(II) oxide and magnesium acetate. An imidation catalyst is used preferably in the reaction of aromatic amines and is generally also advantageous for the reaction of cycloaliphatic amines. In the case of the reaction of aliphatic amines, especially short-chain aliphatic amines, it is generally possible to dispense with the use of an imidation catalyst. The amount of the imidation catalyst used is preferably from 5 to 80% by weight, more preferably from 10 to 75% by weight, based on the total weight of the compound to be amidated.

The ratio of molar amounts of amine to dianhydride is preferably from about 2:1 to 10:1, more preferably from 2:1 to 4:1, for example from 2.2:1 to 3:1.

The organic acids mentioned above as imidation catalysts are also suitable as solvents.

The reaction temperature in steps b1) and b2) is generally from ambient temperature to 200° C., preferably from 40 to 160° C. The reaction of aliphatic and cycloaliphatic amines is effected preferably within a temperature range of from about 60° C. to 100° C. The reaction of aromatic amines is effected preferably within a temperature range of from about 120 to 160° C.

Preference is given to effecting the reaction in reaction steps b1) and b2) under a protective gas atmosphere, for example nitrogen.

Reaction steps b1) and b2) can be effected at standard pressure or, if desired, under elevated pressure. A suitable pressure range is in the range from about 0.8 to 10 bar. In the case of use of volatile amines (boiling point about $\leqq 180°$ C.), they can preferably be used under elevated pressure.

The water formed in the reaction in steps b1) and b2) can be removed by distillation by processes known to those skilled in the art.

In general, the diimides obtained in reaction step b1) or b2) can be used without further purification. For use of the products as semiconductors, it may, however, be advantageous to subject the products to a further purification. These include, for example, column chromatography processes in which the products, preferably dissolved in a halogenated hydrocarbon such as methylene chloride, are subjected to a separation or filtration on silica gel.

It has been found that, surprisingly, fluorinated diimides of the formula (I.Ba),

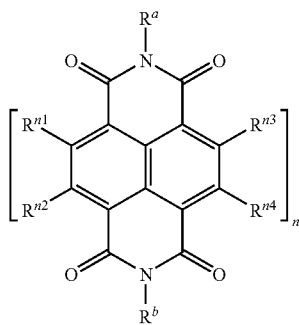

where one or more (e.g. 2, 3 or 4) of the $R^{n1}$, $R^{n2}$, $R^{n3}$ and $R^{n4}$ radicals are each fluorine and the remaining $R^{n1}$, $R^{n2}$, $R^{n3}$ and $R^{n4}$ radicals are each hydrogen are subjected to a reaction of the imide groups to form the corresponding dianhydrides (I.A) (to a hydrolysis). Surprisingly, the fluorine groups are stable even with respect to basic hydrolysis conditions. It is thus possible to prepare fluorinated dianhydrides which are otherwise obtainable only with difficulty. These fluorinated dianhydrides may then in turn serve as reactants for the preparation of diimides which are otherwise obtainable only with difficulty, if at all.

The invention therefore further provides a process for preparing dianhydrides of the formula (I.A)

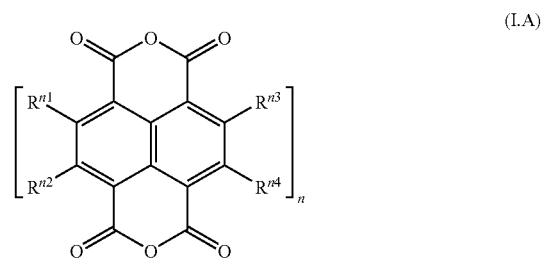

where n is 2, 3 or 4, at least one of the $R^{n1}$, $R^{n2}$, $R^{n3}$ and $R^{n4}$ radicals is fluorine, the remaining $R^{n1}$, $R^{n2}$, $R^{n3}$ and $R^{n4}$ radicals are each hydrogen, in which a diimide of the formula (I.Ba),

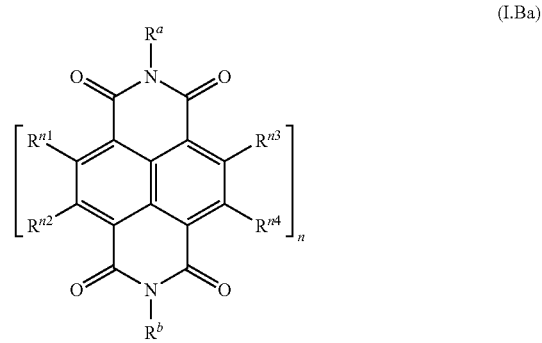

where $R^a$ and $R^b$ are each independently hydrogen or unsubstituted or substituted alkyl, alkenyl, alkadienyl, alkynyl, cycloalkyl, bicycloalkyl, cycloalkenyl, heterocycloalkyl, aryl or heteroaryl, is subjected to a two-stage hydrolysis, the first stage being effected in the presence of a base and the second in the presence of an acid.

In the compounds of the formula (I.Ba), $R^a$ and $R^b$ are preferably each defined identically and are, for example, each $C_1$-$C_{12}$-alkyl such as methyl, ethyl, n-propyl, isopropyl, n-butyl, isobutyl, sec-butyl, tert-butyl, n-pentyl, n-hexyl, n-heptyl, n-octyl, n-nonyl, n-decyl, n-undecyl or n-dodecyl, or aryl such as phenyl, 2-, 3- and 4-methylphenyl, 2,4-, 2,5-, 3,5- and 2,6-dimethylphenyl, 2,4,6-trimethylphenyl, 2-, 3- and 4-ethylphenyl, 2,4-, 2,5-, 3,5- and 2,6-diethylphenyl, 2,4,6-triethylphenyl, 2-, 3- and 4-propylphenyl, 2,4-, 2,5-, 3,5- and 2,6-dipropylphenyl, etc.

In a specific, nonrestrictive embodiment, the compounds (I.Ba) are selected from

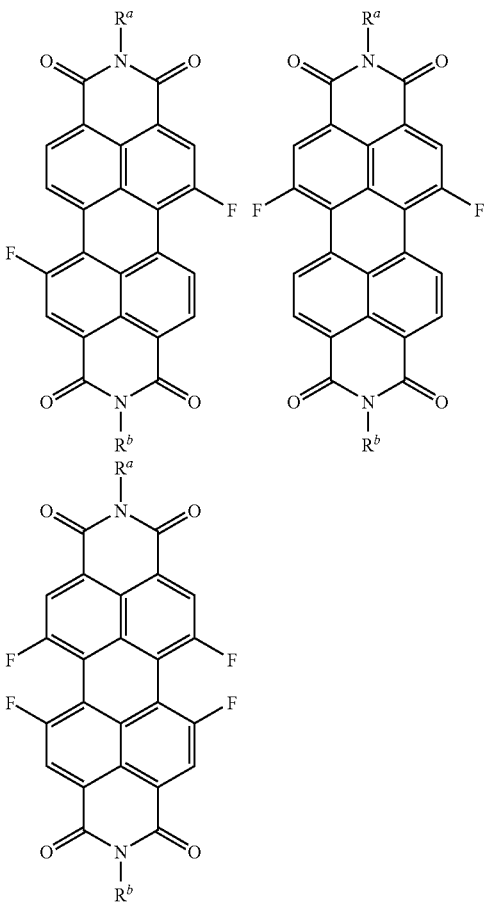

Suitable bases for the first step of the hydrolysis are, for example, alkali metal and alkaline earth metal hydroxides such as NaOH, KOH, Ca(OH)$_2$. The use amount of the base is preferably from 10 to 500, more preferably from 30 to 350, molar equivalents based on the compound to be hydrolyzed.

The hydrolysis can be effected in the presence of water and/or at least one alcohol. Suitable alcohols are $C_1$- to $C_{1-8}$-alkanols, preferably $C_3$- to $C_{1-10}$-alkanols, especially $C_4$- to $C_6$-alkanols, such as methanol, ethanol, propanol, isopropanol, n-butanol, tert-butanol, n-pentanol or n-hexanol. The use amount of the alcohol is preferably from 10 to 500 ml, especially from 30 to 250 ml, per gram of compound to be hydrolyzed.

If desired, the hydrolysis can additionally be effected in the presence of a solvent which solubilizes the starting diamide. Suitable solvents are aromatic solvents such as toluene, xylene, mesitylene, phenol or polar aprotic solvents such as pyridine, pyrimidine, quinoline, isoquinoline, quinaldine and N-methylpiperidine.

For the first step of the hydrolysis, the reaction temperature is generally within a range from ambient temperature to 200° C., preferably from 40 to 180° C., more preferably from 60 to 150° C.

In general, the product of the first hydrolysis step can be used without isolation for the second hydrolysis step. To this end, a sufficient amount of an acid is generally added to the reaction mixture. Suitable acids are mineral acids such as HCl, H$_2$SO$_4$, H$_3$PO$_4$, and organic acids, preferably $C_1$- to $C_6$-carboxylic acids such as acetic acid, propionic acid, etc.

For the second step of the hydrolysis, the reaction temperature is generally within a range of from ambient temperature to 200° C., preferably from 50 to 180° C., more preferably from 80 to 150° C.

The isolation and, if appropriate, purification of the resulting dianhydride (I.A) are effected by customary processes known to those skilled in the art. These include, for example, precipitation with a precipitant, such as a sufficient amount of water, filtration and drying.

The fluorinated dianhydrides of the formula (I.A)

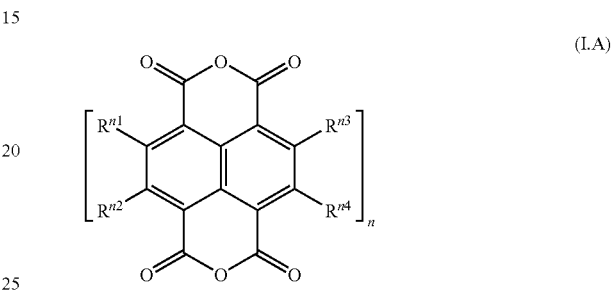

(I.A)

where n is 2, 3 or 4, at least one of the $R^{n1}$, $R^{n2}$, $R^{n3}$ and $R^{n4}$ radicals is fluorine and the remaining $R^{n1}$, $R^{n2}$, $R^{n3}$ and $R^{n4}$ radicals are each hydrogen are suitable in an advantageous manner as reactants for preparing diimides which are otherwise obtainable only with difficulty, if at all.

The invention therefore further provides a process for preparing compounds of the formula (I.Ba)

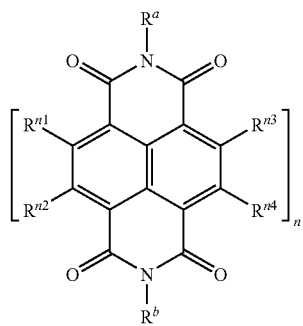

in which n is 2, 3 or 4, at least one of the $R^{n1}$, $R^{n2}$, $R^{n3}$ and $R^{n4}$ radicals is fluorine, the remaining $R^{n1}$, $R^{n2}$, $R^{n3}$ and $R^{n4}$ radicals are each hydrogen, and $R^a$ and $R^b$ are each independently hydrogen or unsubstituted or substituted alkyl, alkenyl, alkadienyl, alkynyl, cycloalkyl, bicycloalkyl, cycloalkenyl, heterocycloalkyl, aryl or heteroaryl, in which a dianhydride of the formula (I.A)

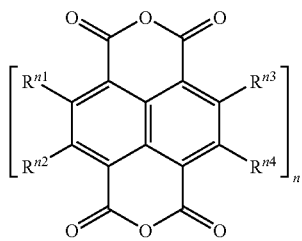
(I.A)

where
n is 2, 3 or 4,
at least one of the $R^{n1}$, $R^{n2}$, $R^{n3}$ and $R^{n4}$ radicals is fluorine,
the remaining $R^{n1}$, $R^{n2}$, $R^{n3}$ and $R^{n4}$ radicals are each hydrogen,
is subjected to a reaction with an amine of the formula $R^a$—$NH_2$ and optionally a different amine of the formula $R^b$—$NH_2$.

With regard to suitable and preferred process conditions for reaction with the amine of the formula $R^a$—$NH_2$ and if appropriate the amine of the formula $R^b$—$NH_2$, reference is made completely to the preceding remarks regarding the imidization step b1), or the remarks regarding the imidization steps b1) and b2).

The invention further provides a process for preparing compounds of the formulae I.Bb

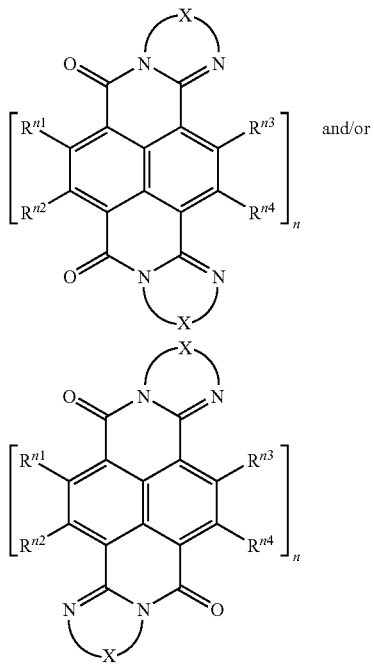
and/or in which
n is 2, 3 or 4,
at least one of the $R^{n1}$, $R^{n2}$, $R^{n3}$ and $R^{n4}$ radicals is fluorine,
the remaining $R^{n1}$, $R^{n2}$, $R^{n3}$ and $R^{n4}$ radicals are each hydrogen, and
X is a divalent bridging group having from 2 to 5 atoms between the flanking bonds, in which a dianhydride of the formula (I.A)

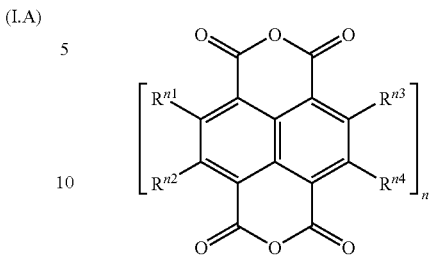
(I.A)

where
n is 2, 3 or 4,
at least one of the $R^{n1}$, $R^{n2}$, $R^{n3}$ and $R^{n4}$ radicals is fluorine,
the remaining $R^{n1}$, $R^{n2}$, $R^{n3}$ and $R^{n4}$ radicals are each hydrogen,
is subjected to a reaction with an amine of the formula $H_2N$—X—$NH_2$.

With regard to suitable and preferred process conditions for the reaction with the amine of the formula $H_2N$—X—$NH_2$, reference is made completely to the preceding remarks regarding the imidization step b2) or the remarks regarding the imidization steps b1) and b2).

It has been found that, surprisingly, fluorinated diimides of the formula (I.Ba2),

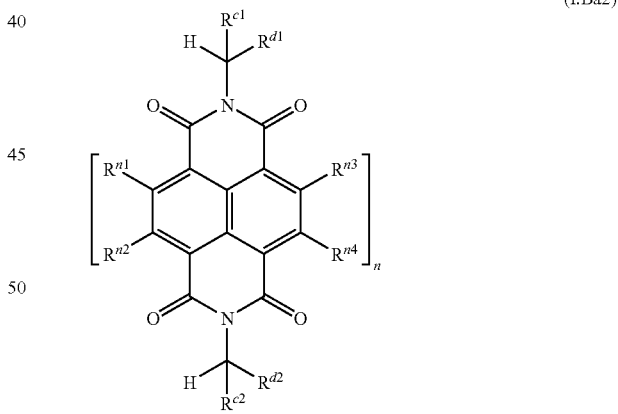
(I.Ba2)

where one or more (e.g. 2, 3 or 4) of the $R^{n1}$, $R^{n2}$, $R^{n3}$ and $R^{n4}$ radicals are each fluorine, the remaining $R^{n1}$, $R^{n2}$, $R^{n3}$ ad $R^{n4}$ radicals are each hydrogen, $R^{c1}$ and $R^{c2}$ are each independently aryl, and $R^{d1}$ and $R^{d2}$ are each independently alkyl, can be subjected readily to a reaction to obtain diimides, in which the imide nitrogen atoms bear hydrogen atoms (I.BaH).

The invention therefore further provides a process for preparing compounds of the formula (I.BaH)

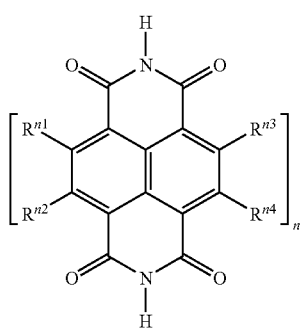

(I.BaH)

in which
n is 2, 3 or 4,
at least one of the $R^{n1}$, $R^{n2}$, $R^{n3}$ and $R^{n4}$ radicals is fluorine, and
the remaining $R^{n1}$, $R^{n2}$, $R^{n3}$ and $R^{n4}$ radicals are each hydrogen,
in which a diimide of the formula (I.Ba2),

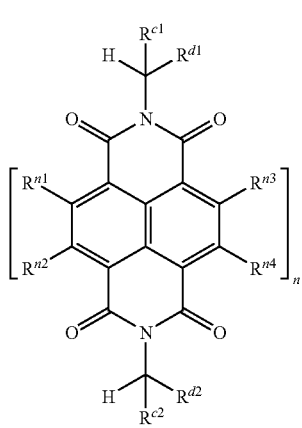

(I.Ba2)

in which
n is 2, 3 or 4,
at least one of the $R^{n1}$, $R^{n2}$, $R^{n3}$ and $R^{n4}$ radicals is fluorine,
the remaining $R^{n1}$, $R^{n2}$, $R^{n3}$ and $R^{n4}$ radicals are each hydrogen, $R^{c1}$ and $R^{c2}$ are each independently aryl, and $R^{d1}$ and $R^{d2}$ are each independently alkyl,
is subjected to a reaction with a strong Lewis acid and a proton donor.

In the aforementioned compounds of the formula (I.Ba2), $R^{c1}$ and $R^{c2}$ are preferably defined identically and are, for example, each phenyl.

In the aforementioned compounds of the formula (I.Ba2), $R^{d1}$ and $R^{d2}$ are preferably defined identically and are, for example, each $C_1$-$C_{12}$-alkyl, more preferably $C_1$-$C_{12}$-alkyl such as methyl, ethyl, n-propyl, isopropyl, n-butyl, isobutyl, sec-butyl, tert-butyl. $R^{d1}$ and $R^{d1}$ are especially each methyl.

Useful Lewis acids include covalent metal halides and semimetal halides which have an electron pair vacancy. Such compounds are known to those skilled in the art, for example from J. P. Kennedy, B. Ivan, "Designed Polymers by Carbocationic Macromolecular Engineering", Oxford University Press, New York, 1991. They are generally selected from halogen compounds of titanium, of tin, of aluminum, of vanadium or of iron, and especially the halides of boron. Preferred Lewis acids are boron tribromide, boron trichloride, titanium tetrachloride, tin tetrachloride, aluminum trichloride, vanadium pentachloride, iron trichloride, alkylaluminum dichlorides and dialkylaluminum chlorides. A particularly preferred Lewis acid is titanium tetrachloride.

The Lewis acid is used in an amount which is sufficient to convert both imide groups of the compound of the formula I.Ba2. The molar ratio of Lewis acid to compound of the formula I.Ba2 is preferably from 2:1 to 10:1 and more preferably from 2.1:1 to 5:1.

The reaction is typically performed in a solvent. Useful solvents are those which are stable toward Lewis acids. Preferred solvents are halogenated hydrocarbons, for example halogenated aliphatic hydrocarbons, in particular haloalkanes such as chloromethane, dichloromethane, trichloromethane, chloroethane, 1,2-dichloroethane, 1,1,1-trichloroethane, 1-chloropropane, 2-chloropropane, 1-chlorobutane and 2-chlorobutane, and halogenated aromatic hydrocarbons such as chlorobenzene and fluorobenzene. Also suitable are mixtures of the aforementioned solvents. Particularly preferred solvents are the abovementioned haloalkanes, in particular dichloromethane.

It is self-evident that the reaction is initially performed under substantially aprotic, especially under anhydrous, reaction conditions. The solvents are prepurified, i.e. predried, in a customary manner, preferably by treatment with solid desiccants such as molecular sieves or predried oxides such as aluminum oxide, silicon dioxide, calcium oxide or barium oxide.

In general, the process according to the invention will be performed at temperatures in the range from 60 to −140° C., preferably in the range from 40 to −80° C., more preferably in the range from 10 to −40° C.

To release the compounds (I.BaH), a protic compound (proton donor) is added to the reaction mixture. The proton donor is preferably selected from water, alcohols such as methanol, ethanol, n-propanol, isopropanol, n-butanol, isobutanol, sec-butanol or tert-butanol, or mixtures thereof with water.

The isolation and, if appropriate, purification of the resulting diimide (I.BaH) are effected by customary processes known to those skilled in the art. These include, for example, the removal of the solvent used for the reaction, for example by evaporation. The evaporation can be effected under elevated temperature and/or reduced pressure. In a suitable embodiment, the solvent used for the reaction with the Lewis acid is removed partly or fully even before the addition of the proton donor. The isolation of the diimide (I.BaH) may comprise precipitation with a suitable precipitant. To release the diimide (I.BaH), preference is given to using a proton donor in which the compound (IBaH) is insoluble or only slightly soluble. Such proton donors are water and water/alcohol mixtures with a sufficient water content. The isolation of the diimide (I.BaH) may also comprise a filtration and/or drying step.

The aforementioned compounds may be subjected to a further purification. This includes, for example, column chromatography processes, sublimation, crystallization or a combination of a plurality of these processes. For use of the products as semiconductors, it may be advantageous to subject the products to a further purification. Column chromatography and crystallization are each effected with use of a suitable solvent. These include halogenated hydrocarbons such as methylene chloride or chloroform, or aromatic solvents. For the crystallization, it is also possible to use aprotic carboxamides, if appropriate in combination with water and/or an alcohol, in order to reduce the solubility. Compounds sparingly soluble in organic solvents, for example diimides in which $R^a$ and $R^b$ are each $C_1$- to $C_4$-alkyl, and also the dianhydrides may also be purified by fractionation from sulfuric acid. Purification by sublimation can be effected with use of a temperature gradient, for example in a three-zone sublimation apparatus, as described in detail below.

The inventive compounds obtainable by the process according to the invention are suitable particularly advantageously as organic semiconductors. They function generally as n-semiconductors. When the compounds of the formula (I) used in accordance with the invention are combined with other semiconductors and the position of the energy levels causes the other semiconductors to function as n-conductors, the compounds (I) can also function as p-semiconductors in exceptional cases. This is the case, for example, for the combination with cyano-substituted perylenetetracarboximides. The compounds of the formula (I) are notable for their air stability. They also possess a high charge transport mobility and have a high on/off ratio. They are suitable in a particularly advantageous manner for organic field-effect transistors. The inventive compounds are advantageously suitable for preparing integrated circuits (ICs) for which the n-channel MOS-FETs (metal oxide semiconductor field-effect transistors) customary to date are used. These are CMOS-like semiconductor units, for example for microprocessors, microcontrollers, static RAM and other digital logic circuits. For the production of semiconductor materials, the processes according to the invention can be processed further by one of the following processes: printing (offset, flexographic, gravure, screen, inkjet, electrophotography), evaporation, laser transfer, photolithography, dropcasting. They are suitable in particular for use in displays (especially large-area and/or flexible displays) and RFID tags.

The inventive compounds and those obtainable by the process according to the invention are also suitable particularly advantageously for data storage, in diodes, especially in OLEDs, in photovoltaics, as UV absorbers, as optical brighteners, as invisible labels and as fluorescent labels for biomolecules such as proteins, DNA, sugars and combinations thereof.

The inventive compounds and those obtainable by the process according to the invention are also suitable particularly advantageously as a fluorescent dye in a display based on fluorescence conversion; in a light-collecting plastics part which, if appropriate, is combined with a solar cell; as a pigment dye in electrophoretic displays; as a fluorescent dye in an application based on chemoluminescence (for example in glow sticks).

The inventive compounds and those obtainable by the process according to the invention are also particularly advantageously suitable as a fluorescent dye in a display based on fluorescence conversion. Such displays generally comprise a transparent substrate, a fluorescent dye disposed on the substrate and a radiation source. Customary radiation sources transmit blue (color by blue) or UV light (color by uv). The dyes absorb either the blue or the UV light and are used as green emitters. In these displays, for example, the red light is generated by virtue of the red emitter being excited by a blue or UV light-absorbing green emitter. Suitable color-by-blue displays are described, for example, in WO 98/28946. Suitable color-by-uv-displays are described, for example, by W. A. Crossland, I. D. Sprigle and A. B. Davey in Photoluminescent LCDs (PL-LCD) using phosphors Cambridge University and Screen Technology Ltd., Cambridge, UK.

The inventive compounds and those obtainable by the process according to the invention are also particularly suitable as fluorescence emitters in OLEDs, in which they are excited either by electroluminescence or by an appropriate phosphorescence emitter via Forster energy transfer (FRET).

The inventive compounds and those obtainable by the process according to the invention are also particularly suitable in displays which switch colors on and off based on an electrophoretic effect via charged pigment dyes. Such electrophoretic displays are described, for example, in US 2004/0130776.

The inventive compounds and those obtainable by the process according to the invention are also particularly suitable for use in a light-collecting plastics part which absorbs light over a large surface and at whose edges the light is emitted after multiple refraction (so-called LISAs). Such LISAs may have, at the edges, solar cells, for example silicon solar cells or organic solar cells, which convert the concentrated light to electrical energy. A combination of light-collecting plastics with solar cells is described, for example, in U.S. Pat. No. 4,110,123.

The inventive compounds and those obtainable by the process according to the invention are also particularly suitable in chemiluminescence applications. These include so-called "glow sticks". They can be produced by using at least one compound of the formula (I), for example in an alkyl phthalate. The chemiluminescence can be induced by mixing an oxalic ester with hydrogen peroxide, for example after these two initially separate components have been mixed by breaking a piece of glass. The resulting reaction energy leads to the excitation and fluorescence of the dyes. Such glow sticks can be used as emergency light, for example for angling, in lifejackets for emergency sea rescue or other safety applications.

The inventive compounds and those obtainable by the process according to the invention are also particularly suitable for laser welding or for heat management.

The invention further provides organic field-effect transistors comprising a substrate having at least one gate structure, a source electrode and a drain electrode, and at least one compound of the formula I as defined above as an n-semiconductor. The invention further provides substrates having a multitude of organic field-effect transistors, at least some of the field-effect transistors comprising at least one compound of the formula I as defined above as an n-semiconductor. The invention also provides semiconductor units which comprise at least one such substrate.

A specific embodiment is a substrate with a pattern (topography) of organic field-effect transistors, each transistor comprising
    an organic semiconductor disposed on the substrate;
    a gate structure for controlling the conductivity of the conductive channel; and
    conductive source and drain electrodes at the two ends of the channel,
the organic semiconductor consisting of at least one compound of the formula (I) or comprising a compound of the formula (I). In addition, the organic field-effect transistor generally comprises a dielectric.

A further specific embodiment is a substrate having a pattern of organic field-effect transistors, each transistor forming an integrated circuit or being part of an integrated circuit and at least some of the transistors comprising at least one compound of the formula (I).

Suitable substrates are in principle the materials known for this purpose. Suitable substrates comprise, for example, metals (preferably metals of groups 8, 9, 10 or 11 of the Periodic Table, such as Au, Ag, Cu), oxidic materials (such as glass, quartz, ceramics, SiO$_2$), semiconductors (e.g. doped Si, doped Ge), metal alloys (for example based on Au, Ag, Cu, etc.), semiconductor alloys, polymers (e.g. polyvinyl chloride, polyolefins such as polyethylene and polypropylene, polyesters, fluoropolymers, polyamides, polyimides, polyurethanes, polyalkyl (meth)acrylates, polystyrene and mixtures and composites thereof, inorganic solids (e.g. ammonium chloride), paper and combinations thereof. The substrates may be flexible or inflexible, and have a curved or planar geometry, depending on the desired use.

A typical substrate for semiconductor units comprises a matrix (for example a quartz or polymer matrix) and, optionally, a dielectric top layer.

Suitable dielectrics are SiO$_2$, polystyrene, poly-α-methylstyrene, polyolefins (such as polypropylene, polyethylene, polyisobutene), polyvinylcarbazole, fluorinated polymers (e.g. Cytop, CYMM), cyanopullulans, polyvinylphenol, poly-p-xylene, polyvinyl chloride, or polymers crosslinkable thermally or by atmospheric moisture. Specific dielectrics are "self-assembled nanodielectrics", i.e. polymers which are obtained from monomers comprising SiCl functionalities, for example Cl$_3$SiOSiCl$_3$, Cl$_3$Si—(CH$_2$)$_6$—SiCl$_3$, Cl$_3$Si—(CH$_2$)$_{12}$—SiCl$_3$, and/or which are crosslinked by atmospheric moisture or by addition of water diluted with solvents (see, for example, Faccietti Adv. Mat. 2005, 17, 1705-1725). Instead of water, it is also possible for hydroxyl-containing polymers such as polyvinylphenol or polyvinyl alcohol or copolymers of vinylphenol and styrene to serve as crosslinking components. It is also possible for at least one further polymer to be present during the crosslinking operation, for example polystyrene, which is then also crosslinked (see Facietti, US patent application 2006/0202195).

The substrate may additionally have electrodes, such as gate, drain and source electrodes of OFETs, which are normally localized on the substrate (for example deposited onto or embedded into a nonconductive layer on the dielectric). The substrate may additionally comprise conductive gate electrodes of the OFETs, which are typically arranged below the dielectric top layer (i.e. the gate dielectric).

In a specific embodiment, an insulator layer (gate insulating layer) is present on at least part of the substrate surface. The insulator layer comprises at least one insulator which is preferably selected from inorganic insulators such as SiO$_2$, SiN, etc., ferroelectric insulators such as Al$_2$O$_3$, Ta$_2$O$_5$, La$_2$O$_5$, TiO$_2$, Y$_2$O$_3$, etc., organic insulators such as polyimides, benzocyclobutene (BCB), polyvinyl alcohols, polyacrylates, etc., and combinations thereof.

Suitable materials for source and drain electrodes are in principle electrically conductive materials. These include metals, preferably metals of groups 8, 9, 10 or 11 of the Periodic Table, such as Pd, Au, Ag, Cu, Al, Ni, Cr, etc. Also suitable are conductive polymers such as PEDOT (=poly(3,4-ethylenedioxythiophene)); PSS (=poly(styrenesulfonate)), polyaniline, surface-modified gold, etc. Preferred electrically conductive materials have a specific resistance of less than $10^{-3}$ ohm×meter, preferably less than $10^{-4}$ ohm×meter, especially less than $10^{-6}$ or $10^{-7}$ ohm×meter.

In a specific embodiment, drain and source electrodes are present at least partly on the organic semiconductor material. It will be appreciated that the substrate may comprise further components as used customarily in semiconductor materials or ICs, such as insulators, resistors, capacitors, conductor tracks, etc.

The electrodes may be applied by customary processes, such as evaporation, lithographic processes or another structuring process.

The semiconductor materials may also be processed with suitable auxiliaries (polymers, surfactants) in disperse phase by printing.

In a first preferred embodiment, the deposition of at least one compound of the general formula I (and if appropriate further semiconductor materials) is carried out by a gas phase deposition process (physical vapor deposition, PVD). PVD processes are performed under high-vacuum conditions and comprise the following steps: evaporation, transport, deposition. It has been found that, surprisingly, the compounds of the general formula I are suitable particularly advantageously for use in a PVD process, since they essentially do not decompose and/or form undesired by-products. The material deposited is obtained in high purity. In a specific embodiment, the deposited material is obtained in the form of crystals or comprises a high crystalline content. In general, for the PVD, at least one compound of the general formula I is heated to a temperature above its evaporation temperature and deposited on a substrate by cooling below the crystallization temperature. The temperature of the substrate in the deposition is preferably within a range from about 20 to 250° C., more preferably from 50 to 200° C. It has been found that, surprisingly, elevated substrate temperatures in the deposition of the compounds of the formula I can have advantageous effects on the properties of the semiconductor elements achieved.

The resulting semiconductor layers generally have a thickness which is sufficient for ohmic contact between source and drain electrodes. The deposition can be effected under an inert atmosphere, for example, under nitrogen, argon or helium.

The deposition is effected typically at ambient pressure or under reduced pressure. A suitable pressure range is from about $10^{-7}$ to 1.5 bar.

The compound of the formula I is preferably deposited on the substrate in a thickness of from 10 to 1000 nm, more preferably from 15 to 250 nm. In a specific embodiment, the compound of the formula I is deposited at least partly in crystalline form. For this purpose, especially the above-described PVD process is suitable. Moreover, it is possible to use previously prepared organic semiconductor crystals. Suitable processes for obtaining such crystals are described by R. A. Laudise et al. in "Physical Vapor Growth of Organic Semi-Conductors", Journal of Crystal Growth 187 (1998), pages 449-454, and in "Physical Vapor Growth of Centimeter-sized Crystals of α-Hexathiophene", Journal of Crystal Growth 1982 (1997), pages 416-427, which are incorporated here by reference.

In a second preferred embodiment, the deposition of at least one compound of the general formula I (and if appropriate further semiconductor materials) is effected by spin-coating. Surprisingly, it is thus also possible to use the compounds of the formula I used in accordance with the invention in a wet processing method to produce semiconductor substrates. The compounds of the formula (I) should thus also be suitable for producing semiconductor elements, especially OFETs or based on OFETs, by a printing process. It is possible for this purpose to use customary printing processes (inkjet, flexographic, offset, gravure; intaglio printing, nanoprinting). Preferred solvents for the use of compounds of the formula (I) in a printing process are aromatic solvents such as toluene, xylene, etc. It is also possible to add thickening substances such as polymers, for example polystyrene, etc., to these "semiconductor inks". In this case, the dielectrics used are the aforementioned compounds.

In a preferred embodiment, the inventive field-effect transistor is a thin-film transistor (TFT). In a customary construction, a thin-film transistor has a gate electrode disposed on the substrate, a gate insulation layer disposed thereon and on the substrate, a semiconductor layer disposed on the gate insulator layer, an ohmic contact layer on the semiconductor layer, and a source electrode and a drain electrode on the ohmic contact layer.

In a preferred embodiment, the surface of the substrate, before the deposition of at least one compound of the general formula (I) (and if appropriate of at least one further semiconductor material), is subjected to a modification. This modification serves to form regions which bind the semiconductor materials and/or regions on which no semiconductor materials can be deposited. The surface of the substrate is preferably modified with at least one compound (C1) which is suitable for binding to the surface of the substrate and to the compounds of the formula I. In a suitable embodiment, a portion of the surface or the complete surface of the substrate is coated with at least one compound (C1) in order to enable improved deposition of at least one compound of the general formula I (and if appropriate further semiconductive compounds). A further embodiment comprises the deposition of a pattern of compounds of the general formula (C1) on the substrate by a corresponding production process. These include the mask processes known for this purpose and so-called "patterning" processes, as described, for example, in U.S. Ser. No. 11/353,934, which is incorporated here fully by reference.

Suitable compounds of the formula (C1) are capable of a binding interaction both with the substrate and with at least one semiconductor compound of the general formula I. The term "binding interaction" comprises the formation of a chemical bond (covalent bond), ionic bond, coordinative interaction, van der Waals interactions, e.g. dipole-dipole interactions etc., and combinations thereof. Suitable compounds of the general formula (C1) are:

silanes, phosphonic acids, carboxylic acids, hydroxamic acids, such as alkyltrichlorosilanes, e.g. n-octadecyltrichlorosilane; compounds with trialkoxysilane groups, e.g. alkyltrialkoxysilanes such as n-octadecyltrimethoxysilane, n-octadecyltriethoxysilane, n-octadecyltri(n-propyl)oxysilane, n-octadecyltri(isopropyl)oxysilane; trialkoxyaminoalkylsilanes such as triethoxyaminopropylsilane and N-[(3-triethoxysilyl)propyl]ethylenediamine; trialkoxyalkyl 3-glycidyl ether silanes such as triethoxypropyl 3-glycidyl ether silane; trialkoxyallylsilanes such as allyltrimethoxysilane; trialkoxy(isocyanatoalkyl)silanes; trialkoxysilyl(meth)acryloyloxyalkanes and trialkoxysilyl(meth)acrylamidoalkanes such as 1-triethoxysilyl-3-acryloyloxypropane.

amines, phosphines and sulfur-comprising compounds, especially thiols.

The compound (C1) is preferably selected from alkyltrialkoxysilanes, especially n-octadecyltrimethoxysilane, n-octadecyltriethoxysilane; hexaalkyldisilazanes, and especially hexamethyldisilazane (HMDS); $C_8$-$C_{30}$-alkylthiols, especially hexadecanethiol; mercaptocarboxylic acids and mercaptosulfonic acids, especially mercaptoacetic acid, 3-mercaptopropionic acid, mercaptosuccinic acid, 3-mercapto-1-propanesulfonic acid and the alkali metal and ammonium salts thereof.

Various semiconductor architectures comprising the inventive semiconductors are also conceivable, for example top contact, top gate, bottom contact, bottom gate, or else a vertical construction, for example a VOFET (vertical organic field-effect transistor), as described, for example, in US 2004/0046182.

The layer thicknesses are, for example, from 10 nm to 5 μm in semiconductors, from 50 nm to 10 μm in the dielectric; the electrodes may, for example, be from 20 nm to 1 μm. The OFETs may also be combined to form other components such as ring oscillators or inverters.

A further aspect of the invention is the provision of electronic components which comprise a plurality of semiconductor components, which may be n- and/or p-semiconductors. Examples of such components are field-effect transistors (FETs), bipolar junction transistors (BJTs), tunnel diodes, converters, light-emitting components, biological and chemical detectors or sensors, temperature-dependent detectors, photodetectors such as polarization-sensitive photodetectors, gates, AND, NAND, NOT, OR, TOR and NOR gates, registers, switches, timer units, static or dynamic stores and other dynamic or sequential, logical or other digital components including programmable circuits.

A specific semiconductor element is an inverter. In digital logic, the inverter is a gate which inverts an input signal. The inverter is also referred to as a NOT gate. Real inverter circuits have an output current which constitutes the opposite of the input current. Typical values are, for example, (0, +5V) for TTL circuits. The performance of a digital inverter reproduces the voltage transfer curve (VTC), i.e. the plot of input current against output current. Ideally, it is a staged function, and the closer the real measured curve approximates to such a stage, the better the inverter is. In a specific embodiment of the invention, the compounds of the formula (I) are used as organic n-semiconductors in an inverter.

The inventive compounds of the formula (I) and those obtainable by the process according to the invention are also particularly advantageously suitable for use in organic photovoltaics (OPVs). In principle, these compounds are also suitable for use in dye-sensitized solar cells. In this case, specifically compounds of the formula (I) with an anhydride function are used. However, preference is given to their use in solar cells which are characterized by diffusion of excited states. In this case, one or both of the semiconductor materials utilized is notable for a diffusion of excited states. Also suitable is the combination of at least one semiconductor material which is characterized by diffusion of excited states with polymers which permit conduction of the excited states along the polymer chain. In the context of the invention, such solar cells are referred to as excitonic solar cells. The direct conversion of solar energy to electrical energy in solar cells is based on the internal photo effect of a semiconductor material, i.e. the generation of electron-hole pairs by absorption of photons and the separation of the negative and positive charge carriers at a p-n transition or a Schottky contact. An exciton can form, for example, when a photon penetrates into a semiconductor and excites an electron to transfer from the valence band into the conduction band. In order to generate current, the excited state generated by the absorbed photons must, however, reach a p-n transition in order to generate a hole and an electron which then flow to the anode and cathode. The photovoltage thus generated can bring about a photocurrent in an external circuit, through which the solar cell delivers its power. The semiconductor can absorb only those photons which have an energy which is greater than its band gap. The size of the semiconductor band gap thus determines the proportion of sunlight which can be converted to electrical energy. Solar cells consist normally of two absorbing materials with different band gaps in order to very effectively utilize the solar energy. Most organic semiconductors have exciton diffusion lengths of up to 10 nm. There is still a need here for organic semiconductors through which the excited state can be passed on over very large distances. It has now been found that, surprisingly, the above-described compounds of the general formula I described above are particularly advantageously suitable for use in excitonic solar cells.

Suitable organic solar cells generally have a layer structure and generally comprise at least the following layers: anode, photoactive layer and cathode. These layers generally consist of a substrate customary therefor. The structure of organic solar cells is described, for example, in US 2005/0098726 A1 and US 2005/0224905 A1, which are fully incorporated here by reference.

Suitable substrates are, for example, oxidic materials (such as glass, quartz, ceramic, $SiO_2$, etc.), polymers (e.g. polyvinyl chloride, polyolefins such as polyethylene and polypropylene, polyesters, fluoropolymers, polyamides, polyurethanes, polyalkyl (meth)acrylates, polystyrene and mixtures and composites thereof) and combinations thereof.

Suitable electrodes (cathode, anode) are in principle metals (preferably of groups 8, 9, or 11 of the Periodic Table, e.g. Pt, Au, Ag, Cu, Al, In, Mg, Ca), semiconductors (e.g. doped Si, doped Ge, indium tin oxide (ITO), gallium indium tin oxide (GITO), zinc indium tin oxide (ZITO), etc.), metal alloys (e.g. based on Pt, Au, Ag, Cu, etc., especially Mg/Ag alloys), semiconductor alloys, etc. The anode used is preferably a material essentially transparent to incident light. This includes, for example, ITO, doped ITO, ZnO, $TiO_2$, Ag, Au, Pt. The cathode used is preferably a material which essentially reflects the incident light. This includes, for example, metal films, for example of Al, Ag, Au, In, Mg, Mg/Al, Ca, etc.

For its part, the photoactive layer comprises at least one or consists of at least one layer which comprises, as an organic semiconductor material, at least one compound which is selected from compounds of the formulae I and II as defined above. In one embodiment, the photoactive layer comprises at least one organic acceptor material. In addition to the photoactive layer, there may be one or more further layers, for example a layer with electron-conducting properties (ETL, electron transport layer) and a layer which comprises a hole-conducting material (hole transport layer, HTL) which need not absorb, exciton- and hole-blocking layers (e.g. EBLs) which should not absorb, multiplication layers. Suitable exciton- and hole-blocking layers are described, for example, in U.S. Pat. No. 6,451,415.

Suitable exciton blocker layers are, for example, bathocuproins (BCPs), 4,4',4"-tris(N-methylphenyl)-N-phenylamino)triphenylamine (m-MTDATA) or polyethylenedioxythiophene (PEDOT), as described in U.S. Pat. No. 7,026,041.

The inventive excitonic solar cells are based on photoactive donor-acceptor heterojunctions. When at least one compound of the formula (I) is used as the HTM (hole transport material), the corresponding ETM (exciton transport material) must be selected such that, after excitation of the compounds, a rapid electron transfer to the ETM takes place. Suitable ETMs are, for example, C60 and other fullerenes, perylene-3,4:9,10-bis(dicarboximides) (PTCDIs), etc. When at least one compound of the formula (I) is used as the ETM, the complementary HTM must be selected such that, after excitation of the compound, a rapid hole transfer to the HTM takes place. The heterojunction may have a flat configuration (cf. Two layer organic photovoltaic cell, C. W. Tang, Appl. Phys. Lett., 48 (2), 183-185 (1986) or N. Karl, A. Bauer, J. Holzäpfel, J. Marktanner, M. Möbus, F. Stölzle, Mol. Cryst. Liq. Cryst., 252, 243-258 (1994).) or be implemented as a bulk heterojunction (or interpenetrating donor-acceptor network; cf., for example, C. J. Brabec, N. S. Sariciftci, J. C. Hummelen, Adv. Funct. Mater., 11 (1), 15 (2001).). The photoactive layer based on a heterojunction between at least one compound of the formula (I) and an HTL (hole transport layer) or ETL (exciton transport layer) can be used in solar cells with MiM, pin, pn, Mip or Min structure (M=metal, p=p-doped organic or inorganic semiconductor, n=n-doped organic or inorganic semiconductor, i=intrinsically conductive system of organic layers; cf., for example, J. Drechsel et al., Org. Eletron., 5 (4), 175 (2004) or Maennig et al., Appl. Phys. A 79, 1-14 (2004)). It can also be used in tandem cells, as described by P. Peumnas, A. Yakimov, S. R. Forrest in J. Appl. Phys, 93 (7), 3693-3723 (2003) (cf. patents U.S. Pat. Nos. 4,461,922, 6,198,091 and 6,198,092). It can also be used in tandem cells composed of two or more MiM, pin, Mip or Min diodes stacked on one another (cf. patent application DE 103 13 232.5) (J. Drechsel et al., Thin Solid Films, 451-452, 515-517 (2004)).

Thin layers of the compounds and of all other layers can be produced by vapor deposition under reduced pressure or in inert gas atmosphere, by laser ablation or by solution- or dispersion-processible methods such as spin-coating, knife-coating, casting methods, spraying, dip-coating or printing (e.g. inkjet, flexographic, offset, gravure; intaglio, nanoimprinting). The layer thicknesses of the M, n, i and p layers are typically from 10 to 1000 nm, preferably from 10 to 400 nm.

The substrates used are, for example, glass, metal foils or polymer films which are generally coated with a transparent conductive layer (for example $SnO_2$:F, $SnO_2$:In, ZnO:Al, carbon nanotubes, thin metal layers).

In addition to the compounds of the general formula (I), the following semiconductor materials are suitable for use in organic photovoltaics:

Acenes such as anthracene, tetracene, pentacene and substituted acenes. Substituted acenes comprise at least one substituent selected from electron-donating substituents (e.g. alkyl, alkoxy, ester, carboxylate or thioalkoxy), electron-withdrawing substituents (e.g. halogen, nitro or cyano) and combinations thereof. These include 2,9-dialkylpentacenes and 2,10-dialkylpentacenes, 2,10-dialkoxypentacenes, 1,4,8,11-tetraalkoxypentacenes and rubrene (5,6,11,12-tetraphenylnaphthacenes). Suitable substituted pentacenes are described in US 2003/0100779 and U.S. Pat. No. 6,864,396. A preferred acene is rubrene (5,6,11,12-tetraphenylnaphthacene).

Phthalocyanines, such as hexadecachlorophthalocyanines and hexadecafluorophthalocyanines, metal-free phthalocyanine and phthalocyanine comprising divalent metals, especially those of titanyloxy, vanadyloxy, iron, copper, zinc, especially copper phthalocyanine, zinc phthalocyanine and metal-free phthalocyanine, copper hexadecachlorophthalocyanine, zinc hexadecachlorophthalocyanine, metal-free hexadecachlorophthalocyanine, copper hexadecafluorophthalocyanine, hexadecafluorophthalocyanine or metal-free hexadecafluorophthalocyanine.

Porphyrins, for example 5, 10,15,20-tetra(3-pyridyl)porphyrin (TpyP).

Liquid-crystalline (LC) materials, for example hexabenzocoronene (HBC-PhC12) or other coronenes, coronenediimides, or triphenylenes such as 2,3,6,7,10,11-hexahexylthiotriphenylene (HTT6) or 2,3,6,7,10,11-hexakis(4-n-nonylphenyl)triphenylene (PTP9), 2,3,6,7,10,11-hexakis (undecyloxy)triphenylene (HAT11). Particular preference is given to LCs which are discotic.

Thiophenes, oligothiophenes and substituted derivatives thereof. Suitable oligothiophenes are quaterthiophenes, quinquethiophenes, sexithiophenes, $\alpha,\omega$-di($C_1$-$C_8$)alkyloligothiophenes such as $\alpha,\omega$-dihexylquaterthiophenes, $\alpha,\omega$-dihexylquinquethiophenes and $\alpha,\omega$-dihexylsexithiophenes, poly (alkylthiophenes) such as poly(3-hexylthiophene), bis (dithienothiophenes), anthradithiophenes and dialkylanthradithiophenes such as dihexylanthradithiophene, phenylene-thiophene (P-T) oligomers and derivatives thereof, especially α,ω-alkyl-substituted phenylenethiophene oligomers.

Preferred thiophenes, oligothiophenes and substituted derivatives thereof, are poly-3-hexylthiophene or compounds of the α α'-bis(2,2-dicyanovinyl)quinquethiophene (DCV5T) type, P3HT, (3-(4-octylphenyl)-2,2'-bithiophene) (PTOPT), (PEOPT), poly(3-(2'-methoxy-5'-octylphenyl)thiophenes) (POMeOPTs), poly(3-octylthiophene) (P3OT), EHH-PpyPz, PTPTB copolymers, BBL, F8BT, PFMO; see Brabec C., Adv. Mater., 2996, 18, 2884. (PCPDTBT) poly[2,6-(4,4-bis(2-ethylhexyl)-4H-cyclopenta[2,1-b;3,4-b']-dithiophene)-4,7-(2,1,3-benzothiadiazoles)].

Paraphenylenevinylene and paraphenylenevinylene-comprising oligomers and polymers, for example polyparaphenylenevinylene, MEH-PPV (poly(2-methoxy-5-(2'-ethylhexyloxy)-1,4-phenylenevinylene)), MDMO-PPV (poly(2-methoxy-5-(3',7'-dimethyloctyloxy)-1,4-phenylenevinylene)), PPV, CN-PPV (with various alkoxy derivatives).

PPE-PPV hybrid polymers.

Polyfluorenes and alternating polyfluorene copolymers, for example with 4,7-dithien-2'-yl-2,1,3-benzothiadiazoles, and also $F_8BT$, PFB.

Polycarbazoles, i.e. carbazole-comprising oligomers and polymers, such as (2,7) and (3,6).

Polyanilines, i.e. aniline-comprising oligomers and polymers, such as (2,7) and (3,6).

Triarylamines, polytriarylamines, polycyclopentadienes, polypyrroles, polyfuran, polysiloles, polyphospholes, TPD, CBP, spiro-MeOTAD.

Fullerenes, especially C60 and derivatives thereof such as PCBM (=[6,6]-phenyl-$C_{61}$-butyric acid methyl ester). In such cells, the fullerene derivative would be a hole conductor.

Copper(I) iodide, copper(I) thiocyanate.

p-n-Mixed materials, i.e. donor and acceptor in one material, polymer, block polymers, polymers with C60s, C60 azo dyes, trimeric mixed material which comprises compounds of the carotenoid type, porphyrin type and quinoid liquid-crystalline compounds as donor/acceptor systems, as described by Kelly in S. Adv. Mater. 2006, 18, 1754.

All aforementioned semiconductor materials may also be doped. Examples of dopants: $Br_2$, $F_4$-TCNQ, etc.

The invention is illustrated in detail with reference to the nonrestrictive examples which follow.

EXAMPLES

General Method for Determining Transistor Characteristics

I. Production of Semiconductor Substrates by means of Physical Vapor Deposition (PVD)

The substrates used were n-doped silicon wafers (2.5×2.5 cm, conductivity <0.004 $\Omega^{-1}$ cm) with a thermally deposited oxide layer as a dielectric (area-based capacitance $C_i$=10 $nF/cm^2$). The surfaces of the substrates were cleaned by washing with acetone, followed by isopropanol. Subsequently, the surfaces of the substrates are modified by treatment with n-octadecyltrimethoxysilane (OTS, $C_{18}H_{37}Si(OCH_3)_3$). To this end, a few drops of OTS (obtainable from Aldrich Chem. Co.) were placed onto the unheated or heated substrate surface (about 100° C.) in a vacuum desiccator. The desiccator was evacuated immediately thereafter (25 mm Hg) and the substrates were left under vacuum for 5 hours. Subsequently, the substrates were baked at 110° C. for 15 minutes, rinsed with isopropanol and dried in an air stream. The compounds of the formula I were applied to the substrate surfaces by means of vacuum deposition as thin films with a layer thickness of about 40 nm. The application rate was 1.0 Å/s at $10^{-5}$ torr. To produce components with top contacts, source and drain electrodes of gold were deposited onto the organic semiconductor films by means of a shadowmask. The channel length was 2000 μm and the channel width 200 μm. The electrical properties of the OFETs were determined by means of a Keithley 4200-SCS semiconductor parameter analyzer.

II. Production of Semiconductor Substrates by Means of Spin-coating

The substrates used were n-doped silicon wafers (2.5×2.5 cm, conductivity <0.004 $\omega^{-1}$ cm) with a thermally deposited oxide layer (300 nm) as a dielectric (area-based capacitance $C_i$=10 $nF/cm^2$). The surfaces of the substrates were cleaned by washing with acetone, followed by isopropanol. Subsequently, the surfaces of the substrates are modified by treatment with n-octadecyltrimethoxysilane (OTS, $C_{18}H_{37}Si(OCH_3)_3$), as described for the PVD process. The compounds of the formula I were applied to the wafers as thin films by means of spin-coating (800 rpm, 30 s). The solvent used was dichloromethane or tetrahydrofuran.

Example 1

Mixture of 1,7-difluoro-N,N'-bis(2,6-diisopropylphenyl)perylene-3,4:9,10-tetracarboximide and 1,6-difluoro-N,N'-bis(2,6-diisopropylphenyl)perylene-3,4:9,10-tetracarboximide

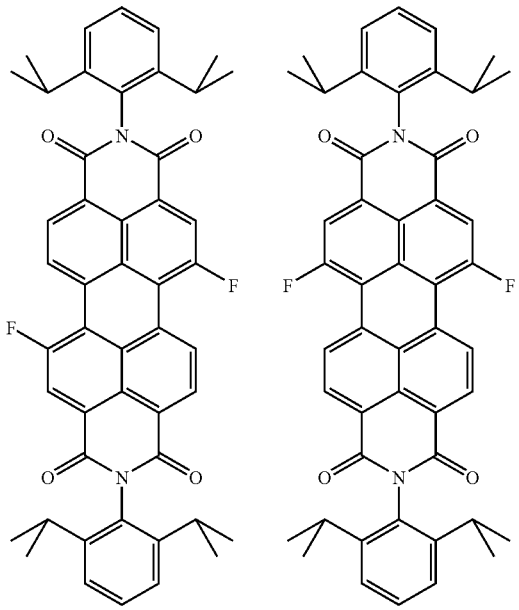

A mixture of 75 ml of dry sulfolane, 4.34 g (5 mmol) of 1,7-dibromo-N,N'-bis(2,6-diisopropylphenyl)perylene-3,4:9,10-tetracarboximide (which, as a result of the preparation, still comprises approx. 25% 1,6-dibromo isomer) and 0.26 g (1 mmol) of 18-crown-6 is heated to 160° C. At this temperature, 1.74 g (30 mmol) of dry potassium fluoride is added thereto and the reaction mixture is kept at this temperature for 90 minutes. Subsequently, it is cooled to room temperature, poured into 500 ml of water and filtered. The precipitate is washed repeatedly with water and dried under reduced pressure. The residue is purified by chromatography (50:1 toluene/ethyl acetate). 2.34 (63%) of an orange solid are obtained.

$R_f$(10:1 toluene/ethyl acetate)=0.56

FIG. 1 shows the absorption and fluorescence spectrum in methyl isobutyrate.

$\lambda_{max}$ (CH$_2$Cl$_2$)=511 nm/130 l.g$^{-1}$ cm$^{-1}$, 477 nm/75 l.g$^{-1}$ cm$^{-1}$, 448 nm/26 l.g$^{-1}$ cm$^{-1}$ The x-ray diffractometry data of toluene solvates of 1,7-difluoro-N,N'-bis(2,6-diisopropylphenyl)perylene-3,4:9,10-tetracarboximide were determined with a Bruker AXS CCD detector using monochromatic CuK$_\alpha$ radiation. The unit cell comprises two crystallographically independent halves of the imide and two molecules of toluene. Crystal data: 2C$_{40}$H$_{38}$F$_4$N$_2$O$_4$·4C$_7$H$_8$, red prisms, 0.30×0.10×0.07 mm, monoclinic, space group P2$_1$/c, a=17.040(2), b=11.320(1), c=25.137(2) Å, β=97.135(6), V=4811.3(X)Å$^3$, Z=4, ρ$_{calc}$=1.388 g/cm$^3$, μ=0.105 mm$^{-1}$, F-(000)=1968, T=100(2) K, R$_1$=0.052, 4828 independent reflections and 653 parameters.

Example 2

Mixture of 1,7-difluoro-N,N'-biscyclohexylperylene-3,4:9,10-tetracarboximide and 1,6-difluoro-N,N'-biscyclohexylperylene-3,4:9,10-tetracarboximide

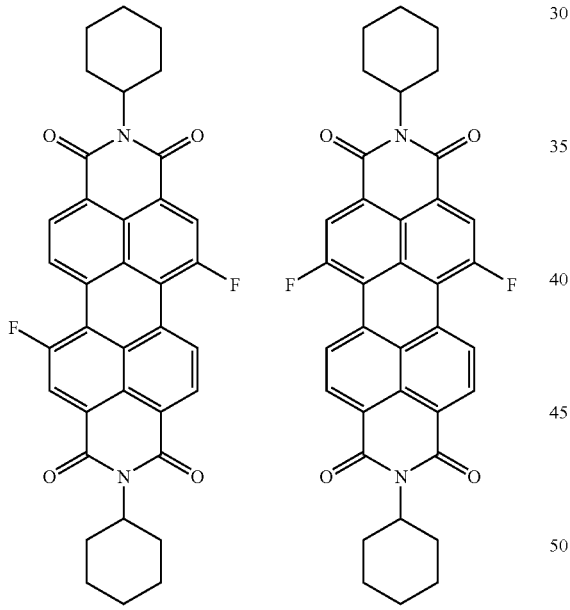

37 mg (0.14 mmol) of 18-crown-6, 1.0 g (17.2 mmol) of KF and 0.5 g (0.7 mmol) of 1,7-dibromo-N,N'-biscyclohexylperylene-3,4:9,10-tetracarboximide (which, as a result of the preparation, still comprises approx. 25% 1,6-isomer) are added to 40 ml of dry sulfolane. The mixture is heated to 160° C. and stirred at this temperature for one hour. Subsequently, the mixture is cooled to room temperature and the reaction mixture is poured onto sodium chloride solution. The precipitated solid is filtered and washed repeatedly with water and dried under reduced pressure. The product is purified by preparative thin-layer chromatography with dichloromethane.

$R_f$(10:1 toluene/ethyl acetate)=0.64

Example 3

1,6,7,12-Tetrafluoro-N,N'-bis(2,6-diisopropylphenyl)perylene-3,4:9,10-tetracarboximide

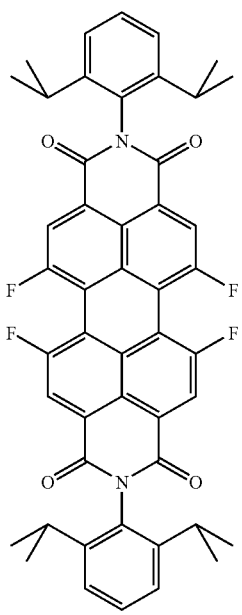 [SMILES: CC(C)c1cccc(C(C)C)c1N1C(=O)c2cc(F)c3c4c(F)cc5c6c(cc(F)c(c7c(F)cc(c2c37)C1=O)c64)C(=O)N(c1c(C(C)C)cccc1C(C)C)C5=O]

A mixture of 80 ml of sulfolane, 4.24 g (5 mmol) of 1,6,7,12-tetrachloro-N,N'-bis(2,6-diisopropylphenyl)perylene-3,4:9,10-tetracarboximide, 0.52 g (2 mmol) of 18-crown-6 and 3.48 g (60 mmol) of KF is heated to 150° C. for 16 hours. The reaction mixture is cooled and precipitated by addition of 100 ml of ethanol, the precipitate is filtered off and the residue is washed with water and dried. The product is purified by preparative thin-layer chromatography (8:1 petroleum ether/ethyl acetate).

Figure 2:
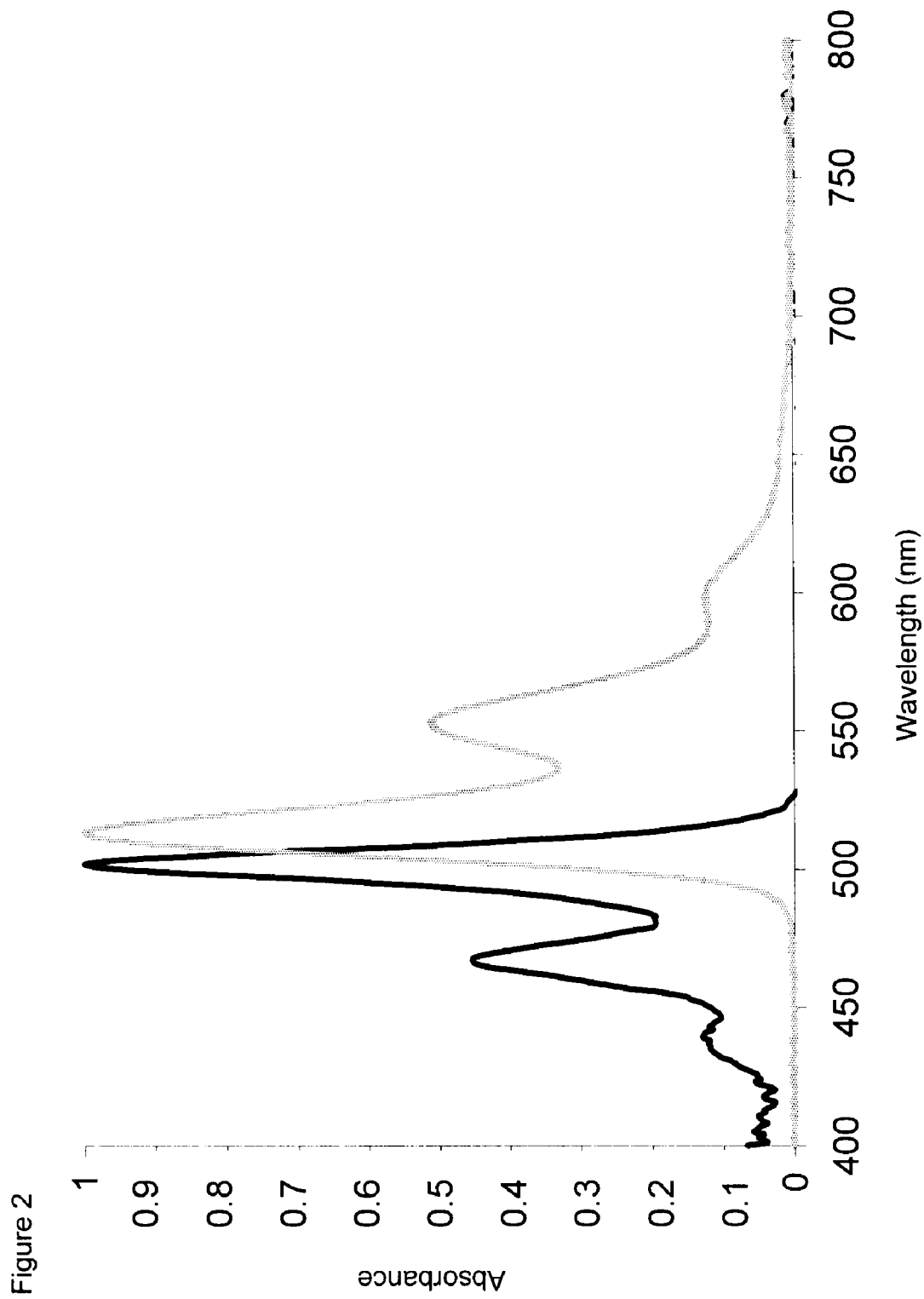
FIG. 2 shows the UV spectrum of the product of Example 3 in dichloromethane.

FIG. 2 shows the UV spectrum of the product in dichloromethane.

Figure 4:
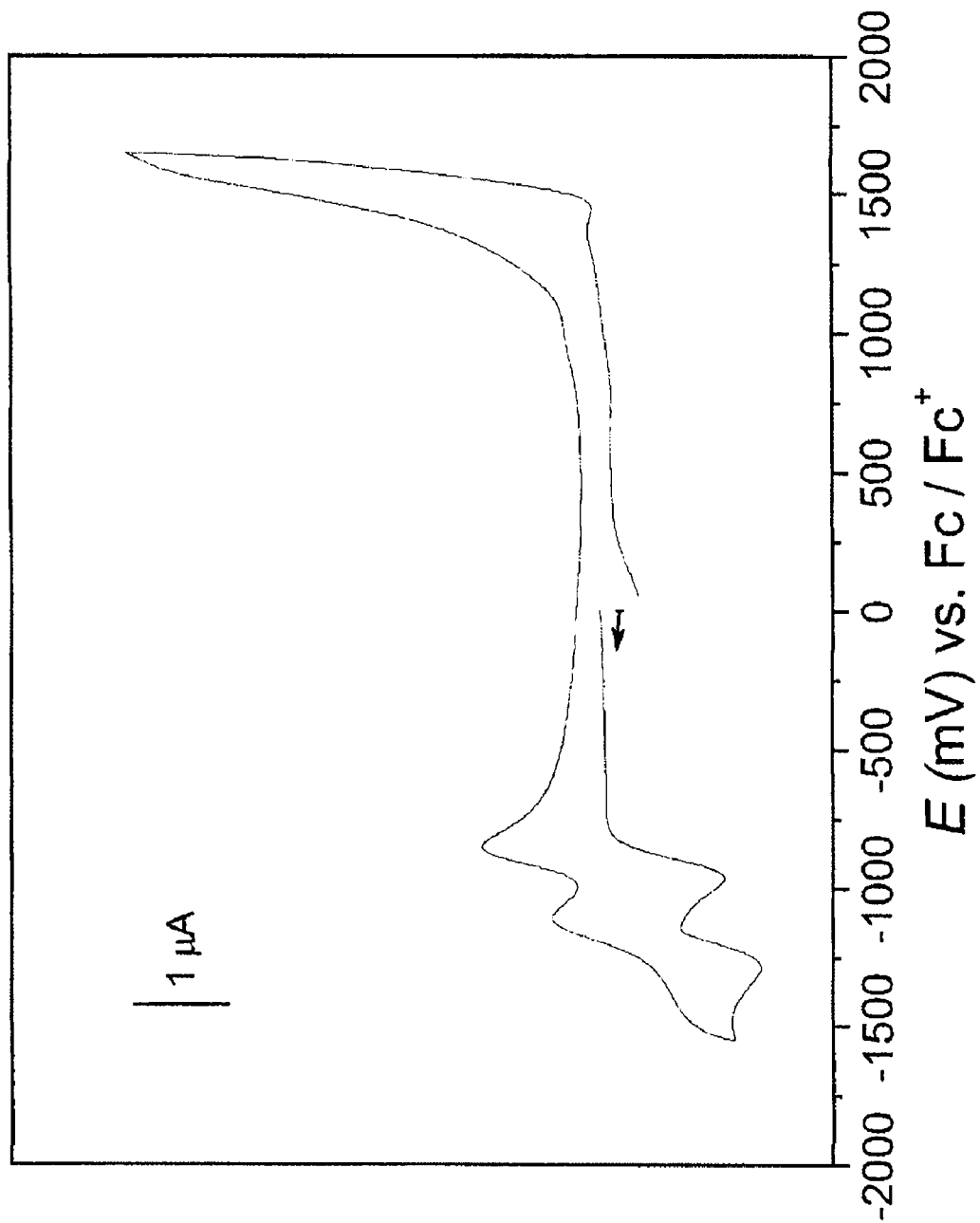
FIG. 4 shows the cyclic voltamogram of 1,6,7,12-tetrafluoro-N,N'-bis(2,6-diisopropylphenyl)perylene-3,4:9,10-tetracarboximide.
Figure 5:
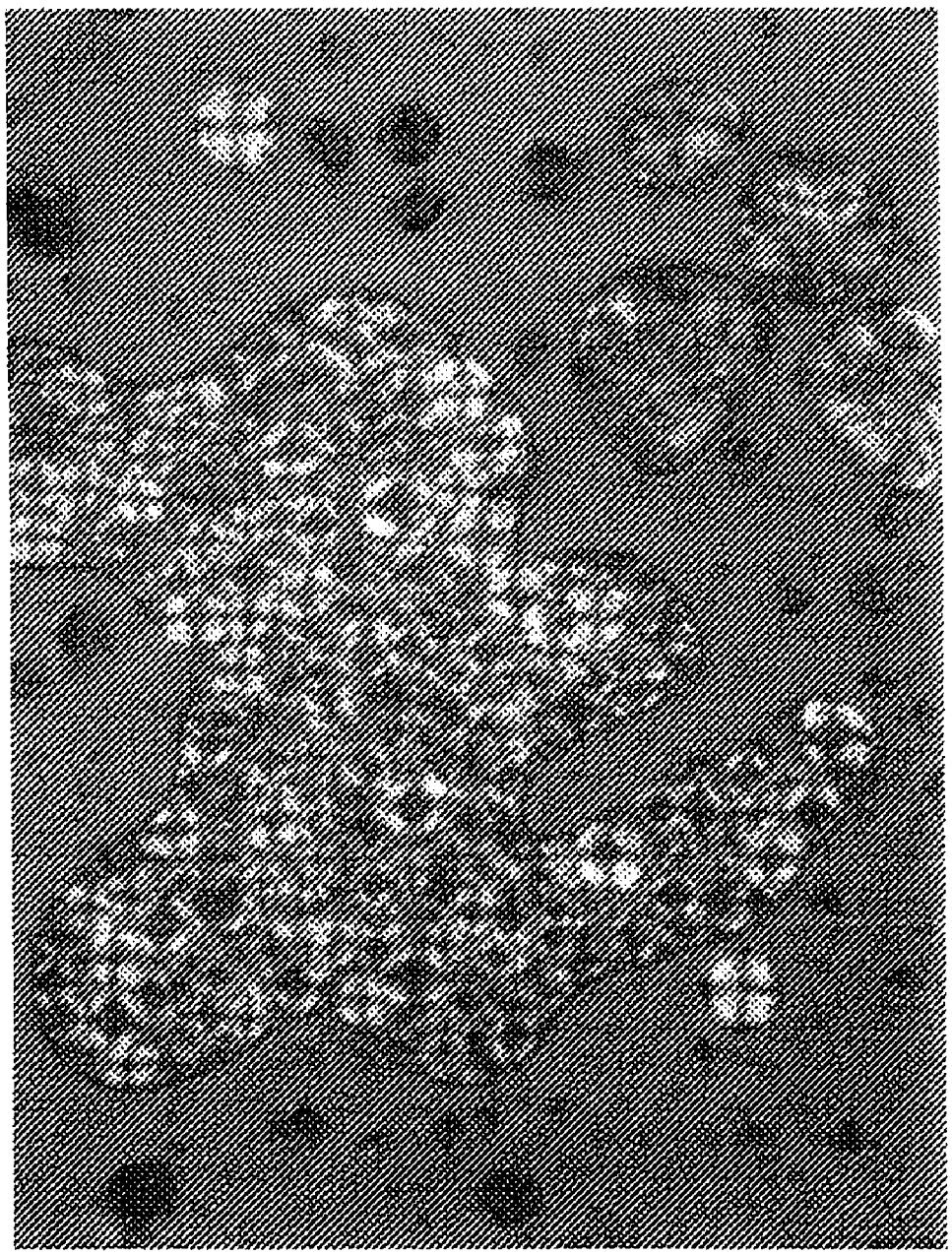
FIG. 5 shows polarization microscope image of the product of Example 3.
Figure 6:
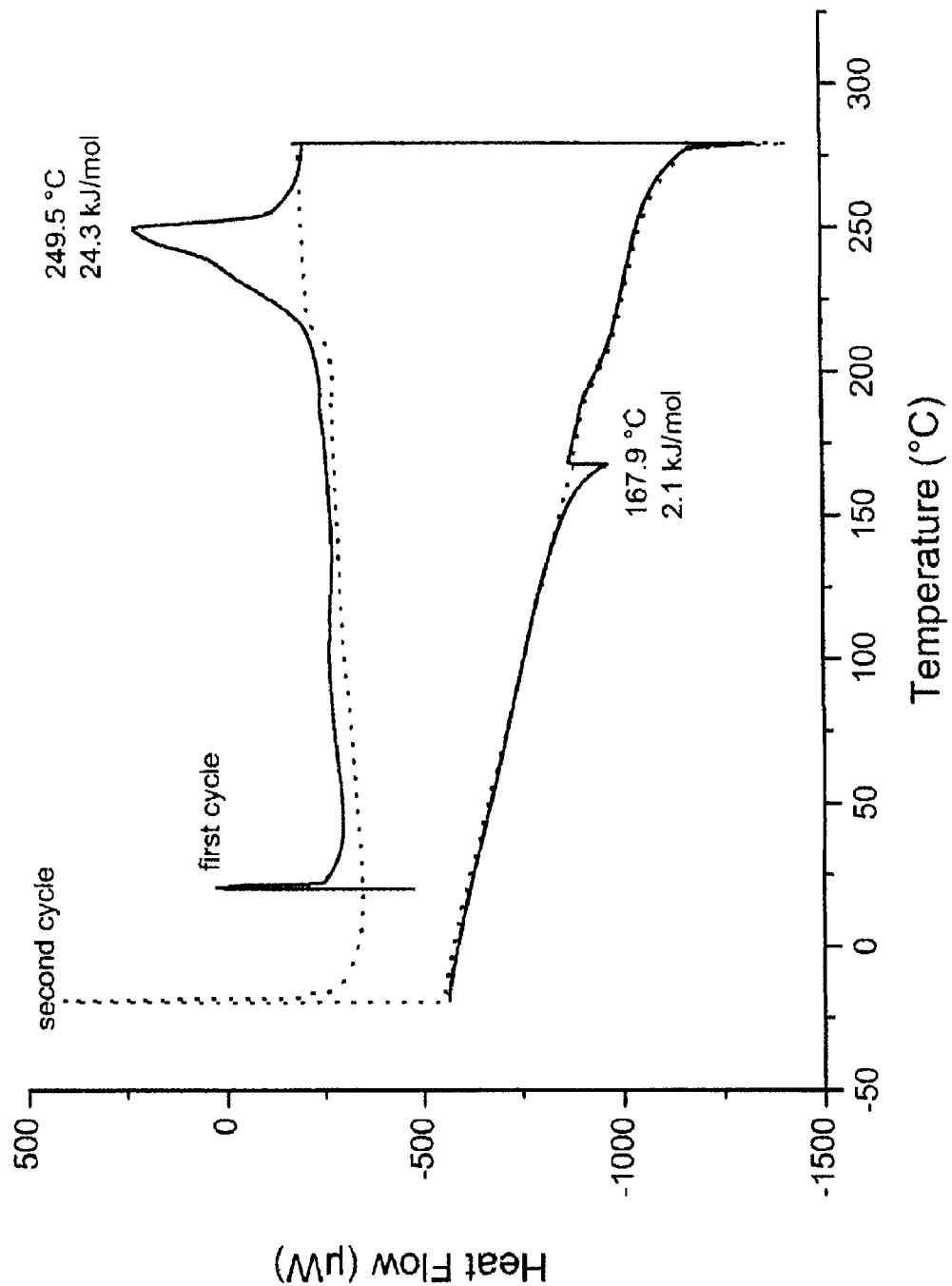
FIG. 6 shows a DSC curve of the product of Example 3.

$\lambda_{max\ abs}$ (CH$_2$Cl$_2$)=440 nm, 467 nm, 502 nm $\lambda_{max\ em}$ (CH$_2$Cl$_2$)=514 nm, 554 nm, 601 nm The cyclic voltamogram of 1,6,7,12-tetrafluoro-N,N'-bis(2,6-diisopropylphenyl)perylene-3,4:9,10-tetracarboximide is depicted in FIG. 4. A polarization microscope image is depicted in FIG. 5 and the DSC curve is depicted in FIG. 6.

Example 4

Mixture of
1,7-difluoroperylene-3,4:9,10-tetracarboxylic
bisanhydride and 1,6-difluoroperylene-3,4:9,
10-tetracarboxylic bisanhydride

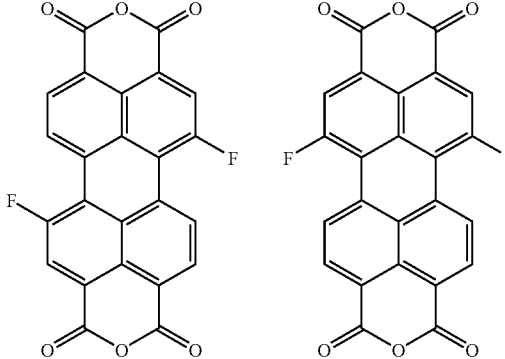

Mixture of 50 ml of sulfolane, 1.9 g (7.2 mmol) of 18-crown-6 and 2.09 g (36 mmol) of potassium fluoride is heated to 160° C. and a suspension of 1.0 g (1.8 mmol) of 1,7-dibromoperylene-3,4:9,10-tetracarboxylic bisanhydride (which, as a result of the preparation, still comprises approx. 25% 1,6-isomer) in 75 ml of sulfolane is added dropwise within 30 minutes. The blue reaction mixture is kept at 160° C. for one hour. After the reaction mixture has been cooled, it is poured onto sodium chloride solution, filtered and washed repeatedly with water. According to mass spectroscopy analysis (MALDI), the product consists predominantly of difluoroperylenetetracarboxylic bisanhydride. The compound was purified by triple sublimation in a three-zone sublimation apparatus.

OFETs were produced according to the general method for the PVD process. The results are shown below.

| Substrate | | Room temperature | 125° C. |
|---|---|---|---|
| handled only under protective gas | mobility (cm$^2$/Vs) | 2.3 × 10$^{-4}$ | 3.1 × 10$^{-4}$ |
| | on/off ratio | 635 | 5284 |
| | $V_{th}$ (V) | 17 | 24 |
| handled under the atmosphere | mobility (cm$^2$/Vs) | 8.2 × 10$^{-5}$ | 2.4 × 10$^{-4}$ |
| | on/off ratio | 497 | 1449 |
| | $V_{th}$ (V) | 20 | 28 |

Example 5

Mixture of 1,7-difluoro-N,N'-dicyclohexylperylene-
3,4:9,10-tetracarboximide and 1,6-difluoro-N,N'-
dicyclohexylperylene-3,4:9,10-tetracarboximide

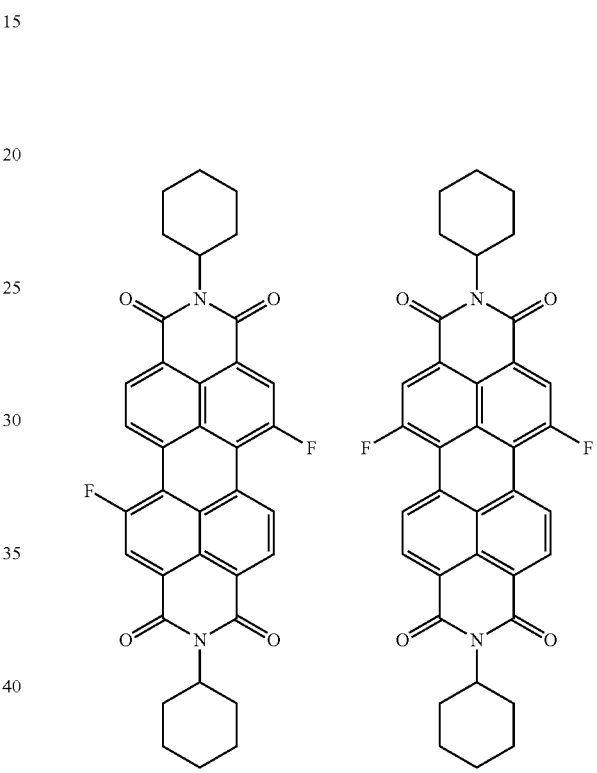

A mixture of 100 mg (0.14 mmol) of 1,7-dibromo-N,N'-dicyclohexylperylene-3,4:9,10-tetracarboximide (comprises approx. 25% 1,6 isomer), 84 mg (1.4 mmol) of KF and 1 mg of (N,N-dimethylimidazolidino)tetramethylguanidinium chloride are heated to 180° C. in 3 ml of dry sulfolane for 6.5 hours. The reaction mixture is cooled to room temperature and the product is precipitatd by adding 10 ml of water. The precipitate is filtered, washed repeatedly with water and dried under reduced pressure. After chromatography with 4:1 and 3:2 dichloromethane/n-pentane, 38 mg (46%) of an orange solid were obtained.

Example 6

Mixture of 1,7-difluoro-N,N'-dicyclohexylperylene-3,4:9,10-tetracarboximide and 1,6-difluoro-N,N'-dicyclohexylperylene-3,4:9,10-tetracarboximide by Imidation of a difluoroperylene-3,4:9,10-tetracarboxylic Bisanhydride Mixture 40 mg (93 μmol) of 1,7-difluoroperylene-3,4:9,10-tetracarboxylic bisanhydride (according to example 4, which comprises approx. 25% 1,6-difluoro isomer) are heated with 86.7 mg (874 μmol) of cyclohexylamine and 20.0 mg of zinc acetate and 5 ml of quinoline to 180° C. for two hours. The reaction mixture is cooled to room temperature and poured into dilute hydrochloric acid, and the precipitate is filtered off, washed with water and dried under reduced pressure. The residue was purified by chromatography as described in example 5.

Example 7

Mixture of 1,7-difluoro-N,N'-di(n-octyl)perylene-3,4:9,10-tetracarboximide and 1,6-difluoro-N,N'-di(n-octyl)perylene-3,4:9,10-tetracarboximide

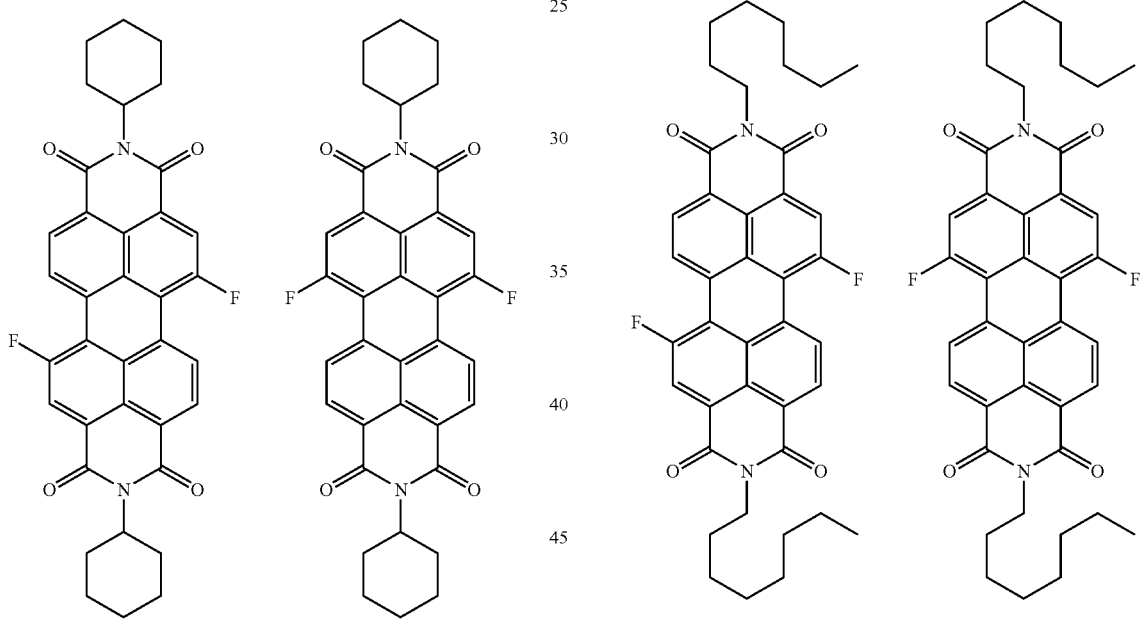

Figure 3:
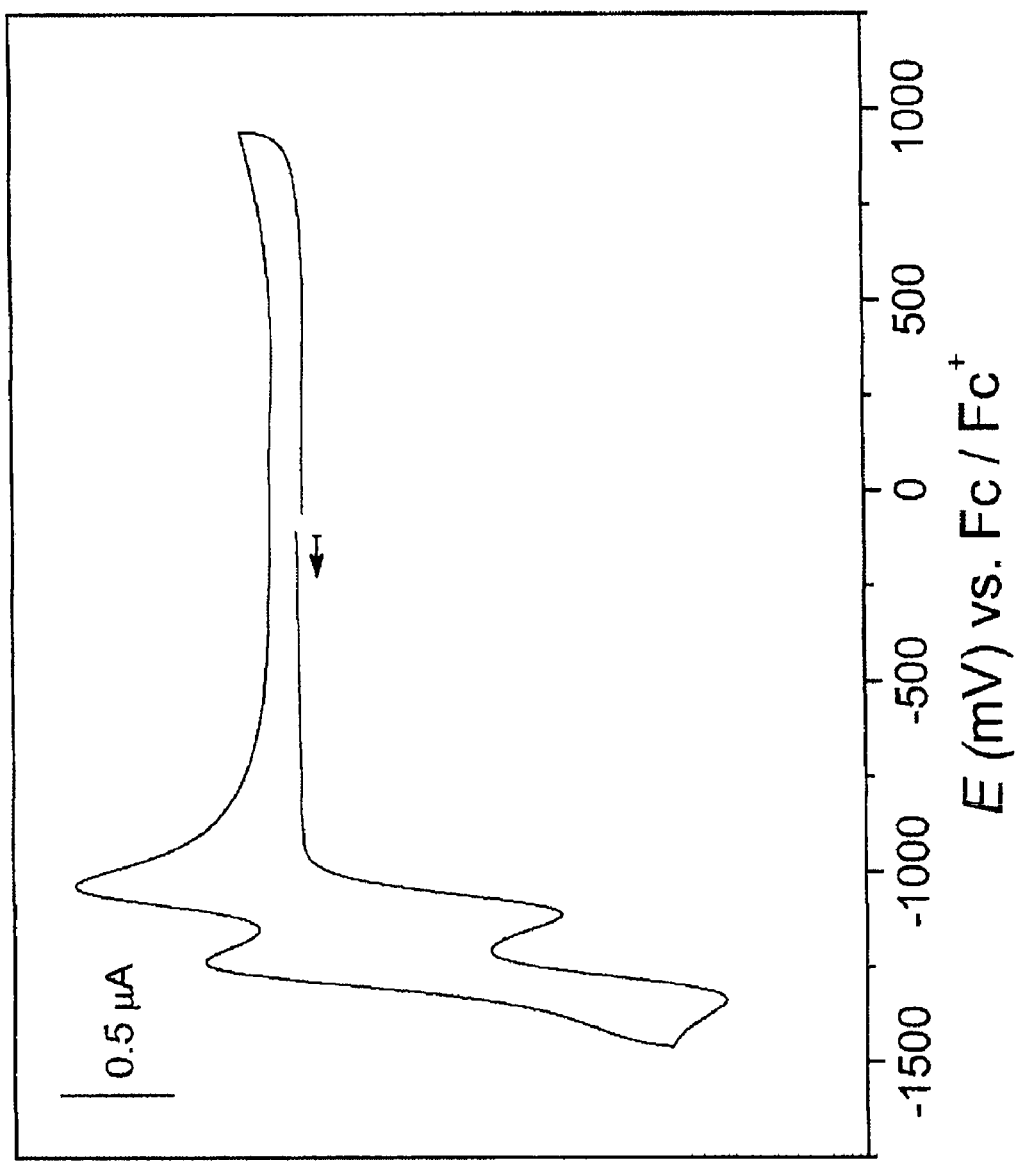
FIG. 3 shows the cyclic voltammogram of 1,7-difluoro-N,N'-biscyclohexylperylene-3,4:9,10-tetracarboximide.

A mixture of 97 mg (0.13 mmol) of 1,7-dibromo-N,N'-di(n-octyl)perylene (which contains approx. 25% 1,6 isomer), 85 mg (1.46 mmol) of KF and 6 mg of (N,N-dimethylimidazolidino)tetramethylguanidinium chloride (CNC$^+$) are heated in 2.9 g of sulfolane to 170° C. for 16 hours. The reaction mixture is worked up as in example 5. After chroma- The cyclic voltammogram of 1,7-difluoro-N,N'-biscyclohexylperylene-3,4:9,10-tetracarboximide is depicted in FIG. 3.

tography with 7:3 and 3:2 chloroform/pentane and subsequent crystallization from toluene, 22.8 mg (28%) of a red solid are obtained.

Example 8

Mixture of 1,7-difluoro-N,N'-di(n-octyl)perylene-3,4:9,10-tetracarboximide and 1,6-difluoro-N,N'-di(n-octyl)perylene-3,4:9,10-tetracarboximide by imidation of a difluoroperylene-3,4:9,10-tetracarboxylic bisanhydride mixture

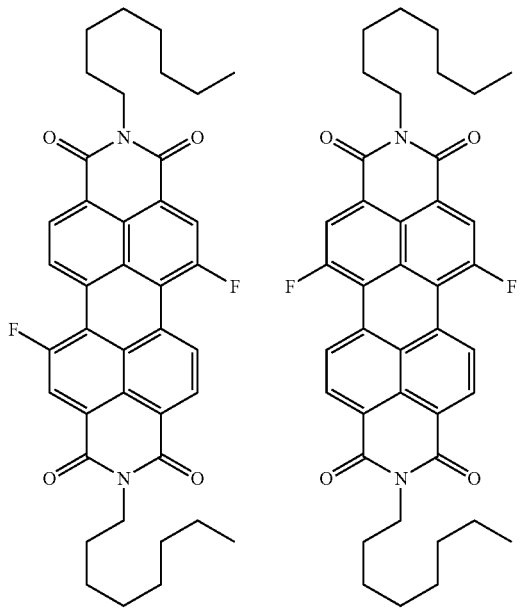

44.0 mg of 1,7-difluoroperylene-3,4:9,10-tetracarboxylic bisanhydride (according to example 4, which comprises approx. 25% 1,6-difluoro isomer) are heated with 78.1 mg (0.6 mmol) of n-octylamine, 20 mg of zinc(II) acetate and 5 ml of quinoline to 180° C. for two hours. The reaction mixture is worked up as in example 6. After column chromatography with 4:1 and 7:3 chloroform/n-hexane, the product is obtained.

Example 9

1,6,7,12-Tetrafluoro-N,N'-bis(n-octyl)perylene-3,4:9,10-tetracarboximide

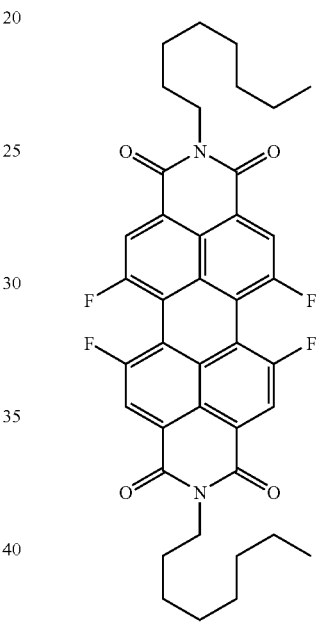

Based on example 5, the conversion of 1,6,7,12-tetrachloro-N,N'-bis(n-octyl)perylene-3,4:9,10-tetracarboximide is carried out. The target compound is obtained as an orange solid after column chromatography ($CH_2Cl_2$:n-pentane=3:2 and 7:3).

The x-ray diffractometry data of 1,6,7,12-tetrafluoro-N,N'-bis(n-octyl)perylene-3,4:9,10-tetracarboximides were determined with a Bruker AXS CCD detector using monochromatic MoK$_\alpha$ radiation. Crystal data: $C_{40}H_{38}F_4N_2O_4$, orange needles, 0.30×0.10×0.07 mm, triclinic, space group: P-1, a=7.8097(4), b=12.1717(7), c=18.2517(11)Å, α=75.6050(10), β=80.7910(10), γ=80.2050(10)°, V=1643.34(16)Å$^3$, Z=2, $\rho_{calc}$=1.388 g/cm$^3$, μ=0.105 mm$^{-1}$, F-(000)=720, T=193(2) K, $R_1$=0.1295, $wR_2$=0.2112, 6490 independent reflections [$2\theta \geqq 52.16°$] and 470 parameters.

Example 10

N,N'-Bis(heptafluorobutyl)-1,7-difluoro-3,4:9,10-tetracarboximide

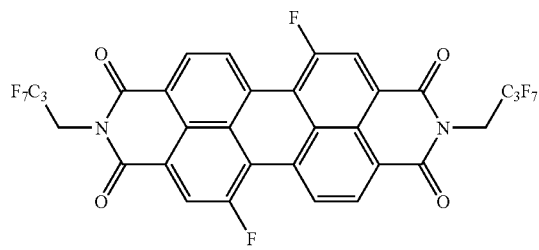

10.1 N,N'-Bis(heptafluorobutyl)-1,7-dibromo-3,4:9,10-tetracarboximide 460 mg (0.836 mmol) of 1,7-dibromo-3,4:9,10-tetracarboxylic bisanhydride (prepared as described in F. Würther, V. Stepanenko, Z. Chen, C. R. Saha-Möller, N. Kocher, D. Stalke, J. Org. Chem. 2004, 69, 7933-7939) are treated with ultrasound in an ultrasound bath in 10 ml of dry N-methylpyrrolidone (NMP) for 30 min. Thereafter, 0.532 g (2.68 mmol) of 2,2,3,3,4,4,4-heptafluorobutylamine in 7 ml of N-methylpyrrolidone and 0.34 g of acetic acid are added. The reaction mixture is heated to 90° C. for 5 h. After cooling to room temperature, the mixture is poured onto 2 N HCl and the solid which precipitates is filtered off. Drying under reduced pressure is followed by column chromatography (dichloromethane) purification to obtain 690 mg (94%) of the title compound.

$^1$H NMR (400 MHz, CDCl$_3$, TMS): δ=5.04 (t, 4H, $^3$J(H, F)=15.3 Hz), 8.78 (d, 2H, $^3$J=8.1 Hz), 9.00 (s, 2H), 9.54 (d, 2H, $^3$J=8.2 Hz).

10.2 N,N'-Bis(heptafluorobutyl)-1,7-difluoro-3,4:9,10-tetracarboximide 40.0 mg (0.043 mmol) of N,N'-bis(heptafluorobutyl)-1,7-dibromo-3,4:9,10-tetracarboximide, 30 mg of KF and 10 mg of 18-crown-6 in 1.5 ml of sulfolane are heated to 160° C. for 45 min. The cooled mixture is added to water and the solid which precipitates out is filtered off. The dried solid is dissolved in dichloromethane and purified by column chromatography (dichloromethane) to obtain 11 mg (32%) of the title compound.

$^1$H NMR (400 MHz, CDCl$_3$, TMS): δ=5.04 (t, 4H, $^3$J=15.8 Hz), 8.62 (d, 2H, $^3$J=13.5 Hz), 8.81 (d, 2H, $^3$J=7.6 Hz), 9.23 (d, 2H, $^3$J=5.3 Hz);

HR-MS (ESI (neg. mode, chloroform, acetonitrile)): 790.03903 (M), calculated 790.03906 (C$_{32}$H$_{10}$F$_{16}$N$_2$O$_4$);

cyclic voltammogram (CH$_2$Cl$_2$, 0.1M tetrabutylammonium hexafluorophosphate (TBAHFP), vs. ferrocene):
$E^{red}_{1/2}$ (PBI/PBI$^-$)=−0.92 V
$E^{red}_{1/2}$ (PBI$^-$/PBI$^{2-}$)=−1.14 V.
PBI=bisperyleneimide OFETs are produced by the general method for the spin-coating process. Solvent: dichloromethane; mobility: 3.8×10$^{-4}$ cm$^2$/Vs.

OFETs are produced by the general method for the PVD process. Substrate temperature: 125° C., mobility: 0.223 cm$^2$/Vs.

When the reactant used is 1,7-dibromoperylene-3,4:9,10-tetracarboxylic bisanhydride which still comprises about 15% 1,6 isomer, an isomer mixture of N,N'-bis(heptafluorobutyl)-1,7-difluoro-3,4:9,10-tetracarboximide and N,N'-bis(heptafluorobutyl)-1,6-difluoro-3,4:9,10-tetracarboximide is obtained. This mixture was used to produce a solar cell.

Example 11

N,N'-Bis(pentafluorophenyl)-1,7-difluoro-3,4:9,10-tetracarboximide

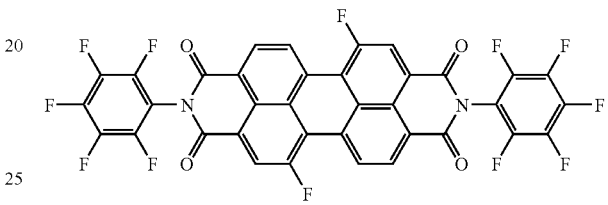

11.1 N,N'-Bis(pentafluorophenyl)-1,7-dibromo-3,4:9,10-tetracarboximide 420 mg (0.76 mmol) of 1,7-dibromo-3,4:9,10-tetracarboxylic bisanhydride, 1.20 g (6.56 mmol) of pentafluoroaniline and 200 mg of zinc(II) acetate are heated to 140° C. for 5 h. After cooling to room temperature, the solid mixture is dissolved in dichloromethane and poured onto 2 N HCl. The mixture is extracted several times with dichloromethane, and the organic phases are combined, dried and concentrated. Purification is effected by column chromatography (dichloromethane) to obtain 90 mg (13%) of the title compound.

$^1$H NMR (400 MHz, CDCl$_3$, TMS): δ=8.12 (d, 2H, $^3$J=8.1 Hz), 9.03 (s, 2H), 9.58 (d, 2H, $^3$J=8.1 Hz);

HR-MS (ESI (neg. mode, chloroform, acetonitrile)): 877.85419 (M), calculated 877.85401 (C$_{36}$H$_6$Br$_2$F$_{10}$N$_2$O$_4$).

11.2 N,N'-Bis(pentafluorophenyl)-1,7-difluoro-3,4:9,10-tetracarboximide 128 mg (0.145 mmol) of N,N'-bis(pentafluorophenyl)-1,7-dibromo-3,4:9,10-tetracarboximide, 100 mg of KF and 50 mg of 18-crown-6 are heated to 160° C. in 2.5 ml of sulfolane for 45 min. The cooled mixture is added to water and the solid which precipitates out is filtered off. The dried solid is dissolved in dichloromethane and purified by column chromatography (dichloromethane) to obtain 50 mg (45%) of the title compound.

$^1$H NMR (400 MHz, CDCl$_3$, TMS): δ=8.66 (d, 2H, $^3$J=13.3 Hz), 8.85 (d, 2H, 3J=7.5 Hz), 9.29 (m, 2H);

HR-MS (ESI (neg. mode, chloroform)): 792.98290 (M+Cl$^-$), calculated 792.98300 (C$_{36}$H$_6$F$_{12}$N$_2$O$_4$Cl);

cyclic voltammogram (CH$_2$Cl$_2$, 0.1M TBAHFP, vs. ferrocene):
$E^{red}_{1/2}$ (PBI/PBI$^-$)=−0.86 V
$E^{red}_{1/2}$ (PBI$^-$/PBI$^{2-}$)=−1.08 V.

Example 12

N,N'-Di-1-phenylethyl-1,7-difluoro-3,4:9,10-tetra-carboximide

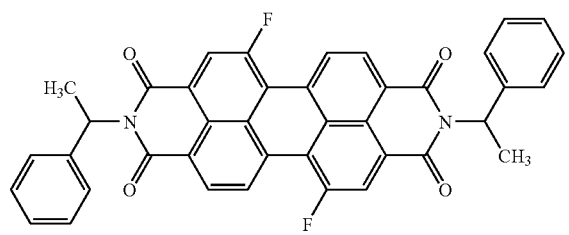 [SMILES: CC(c1ccccc1)N1C(=O)c2ccc3c4c(F)cc5c6c(ccc(c7c(F)cc(c2c37)C1=O)c64)C(=O)N(C(C)c1ccccc1)C5=O]

12.1 N,N'-Di-1-phenylethyl-1,7-dibromo-3,4:9,10-tetracarboximide 2.00 g (3.63 mmol) of 1,7-dibromo-3,4:9,10-tetracarboxylic bisanhydride are heated to 130° C. in 8 ml of distilled quinoline together with 0.5 ml of methylbenzylamine and 10 mg of zinc(II) acetate. After 3 h, the mixture is cooled to room temperature and added to 200 ml of 2 N HCl. The solid which precipitates out is filtered off, dried and purified by column chromatography (dichloromethane), to obtain 1.31 g (1.74 mmol, 48%) of the title compound.

$^1$H NMR (400 MHz, CDCl$_3$, TMS): δ=2.02 (d, 6H, $^3$J=7.2 Hz), 6.54 (q, 2H, $^3$J=7.2 Hz), 7.2-7.3 (m, 2H), 7.34 (m, 4H), 7.51 (m, 4H), 8.67 (d, 2H, $^3$J=8.1 Hz), 8.90 (s, 2H), 9.46 (d, 2H, $^3$J=8.2 Hz);

HR-MS (apci (pos. mode)): 755.0178 (M+H)$^+$, calculated 755.0176 (C$_{40}$H$_{24}$Br$_2$N$_2$O$_4$).

12.2 N,N'-Di-1-phenylethyl-1,7-difluoro-3,4:9,10-tetracarboximide 651 mg (1.36 mmol) of N,N'-di-1-phenylethyl-1,7-dibromo-3,4:9,10-tetracarboximide, 650 mg of KF and 200 mg of 18-crown-6 in 13 ml of sulfolane are heated to 160° C. for 1 h. The cooled mixture is added to 200 ml of water and the solid which precipitates out is filtered off and washed with water. The dried solid is dissolved in dichloromethane and purified by column chromatography (dichloromethane). 330 mg (0.52 mmol, 60%) of the title compound are obtained.

$^1$H NMR (400 MHz, CDCl$_3$, TMS): δ=2.04 (d, 6H, $^3$J=7.2 Hz), 6.54 (q, 2H, $^3$J=7.2 Hz), 7.2-7.3 (m, 2H), 7.34 (m, 4H), 7.51 (m, 4H), 8.46 (d, 2H, $^3$J=13.7 Hz), 8.63 (d, 2H, $^3$J=7.8 Hz), 9.04 (m, 2H);

HR-MS (apci (pos. mode)): 635.1776 (M+H)$^+$, calculated 635.1777 (C$_{40}$H$_{25}$F$_2$N$_2$O$_4$).

Example 13

N,N'-Bis(2-ethylhexyl)-1,7-difluoro-3,4:9,10-tetracarboximide

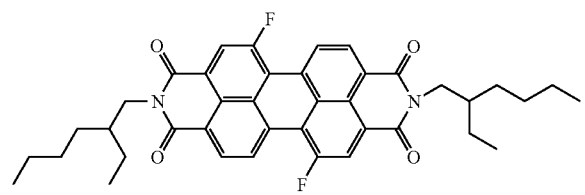 [SMILES: CCCCC(CC)CN1C(=O)c2ccc3c4c(F)cc5c6c(ccc(c7c(F)cc(c2c37)C1=O)c64)C(=O)N(CC(CC)CCCC)C5=O]

13.1 N,N'-Bis(2-ethylhexyl)-1,7-dibromo-3,4:9,10-tetracarboximide 2.00 g (3.63 mmol) of 1,7-dibromo-3,4:9,10-tetracarboxylic bisanhydride, 4 ml of 2-ethylhexylamine and 25 ml of propionic acid are heated to 142° C. for 3.5 h and then added to 150 ml of water. The solid which precipitates out is filtered off, dried and purified by column chromatography (dichloromethane) to obtain 1.38 g (50%) of the title compound.

$^1$H NMR (400 MHz, CDCl$_3$, TMS): δ=0.88-1.00 (m, 12H), 1.25-1.43 (m, 16H), 1.95 (m, 2H), 4.16 (m, 4H), 8.70 (d, 2H, $^3$J=8.2 Hz), 8.94 (s, 2H), 9.50 (d, 2H, $^3$J=8.1 Hz).

13.2 N,N'-Bis(2-ethylhexyl)-1,7-difluoro-3,4:9,10-tetracarboximide

The title compound is prepared analogously to the process described in example 12.2 using N,N'-Bis(2-ethylhexyl)-1,7-dibromo-3,4:9,10-tetracarboximide in place of N,N'-di-1-phenylethyl-1,7-difluoro-3,4:9,10-tetracarboximide, except that the mixture was heated to 160° C. for 2 h. The title compound is obtained in a yield of 50%.

Example 14

1,7-Difluoro-3,4:9,10-tetracarboxylic bisanhydride

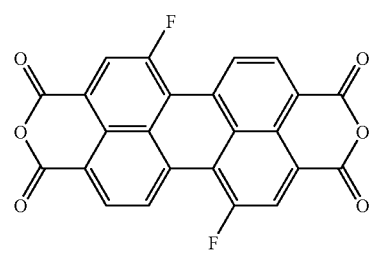 [SMILES: O=C1OC(=O)c2cc(F)c3c4ccc5c6c(cc(F)c(c7ccc1c2c73)c64)C(=O)OC5=O]

Based on the process described in example 19, the conversion of N,N'-bis(2-ethylhexyl)-1,7-difluoro-3,4:9,10-tetracarboximide from example 13 is carried out.

Yield: 90%.

Example 15

N,N'-Bis(heptafluorobutyl)-1,6,7,12-tetrafluoro-3,4:9,10-tetracarboximide

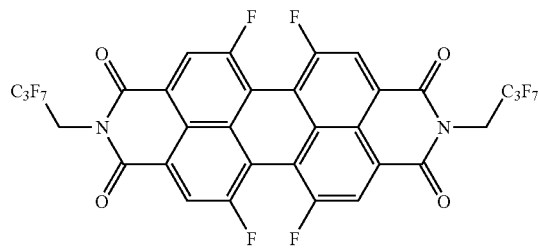

15.1 N,N'-Bis(heptafluorobutyl)-1,6,7,12-tetrachloro-3,4:9,10-tetracarboximide 1.00 g (1.89 mmol) of 1,6,7,12-tetrachloro-3,4:9,10-tetracarboxylic bisanhydride in 20 ml of dry N-methylpyrrolidone are placed in an ultrasound bath for 30 min. Thereafter, 1.06 g (5.35 mmol) of 2,2,3,3,4,4,4-heptafluorobutylamine in 15 ml of N-methylpyrrolidone and 0.68 g of acetic acid are added. The reaction mixture is heated to 90° C. for 5 h. After cooling to room temperature, the mixture is poured onto 2N HCl, and the solid which precipitates out is filtered off. Drying under reduced pressure is followed by column chromatography (dichloromethane) purification to obtain 1.30 g (77%) of the title compound.

$^1$H NMR (400 MHz, CDCl$_3$, TMS): δ=5.04 (t, 4H, $^3$J(H,F)=15.7 Hz), 8.75 (s, 4H);
HR-MS (ESI (neg. mode, chloroform, acetonitrile)): 924.86968 (M+Cl$^-$), calculated 924.87086 (C$_{32}$H$_8$Cl$_5$F$_{14}$N$_2$O$_4$);
cyclic voltamogram (CH$_2$Cl$_2$, 0.1M TBAHFP, vs, ferrocene):
$E^{red}_{1/2}$ (PBI/PBI$^-$)=−0.74 V
$E^{red}_{1/2}$ (PBI$^-$/PBI$^{2-}$)=−0.95 V.

15.2 N,N'-Bis(heptafluorobutyl)-1,6,7,12-tetrafluoro-3,4:9,10-tetracarboximide 700 mg (0.956 mmol) of N,N'-bis(heptafluorobutyl)-1,6,7,12-tetrachloro-3,4:9,10-tetracarboximide, 1.09 g of KF and 120 mg of (N,N-dimethylimidazolidino)tetramethylguanidinium chloride in 50 ml of sulfolane are heated to 160° C. for 2 h. The cooled mixture is added to 700 ml of water and the solid which precipitates out is filtered off and washed with water. The dried solid is dissolved in dichloromethane and purified by column chromatography (pentane/dichloromethane:1/4). Yield: 63 mg (8.6%).

$^1$H NMR (400 MHz, CDCl$_3$, TMS): δ=5.04 (t, 4H, $^3$J=15.3 Hz), 8.56 (t, 4H, $^3$J=5.2 Hz);
HR-MS (ESI (neg. mode, chloroform, acetonitrile)): 860.9886 (M+Cl$^-$), calculated 860.9891 (C$_{32}$H$_8$F$_{18}$N$_2$O$_4$Cl);
cyclic voltamogram (CH$_2$Cl$_2$, 0.1M TBAHFP, vs. ferrocene):
$E^{red}_{1/2}$ (PBI/PBI$^-$)=−0.87 V
$E^{red}_{1/2}$ (PBI$^-$/PBI$^{2-}$)=−1.12 V.

OFETs are produced by the general method for the spin-coating process. Solvent: dichloromethane; mobility: 4.0×10$^{-4}$ cm$^2$/Vs.

OFETs are produced by the general method for the PVD process. Substrate temperature: 125° C., mobility 0.032 cm$^2$/Vs.

Example 16

N,N'-Di-1-phenylethyl-1,6,7,12-tetrafluoro-3,4:9,10-tetracarboximide

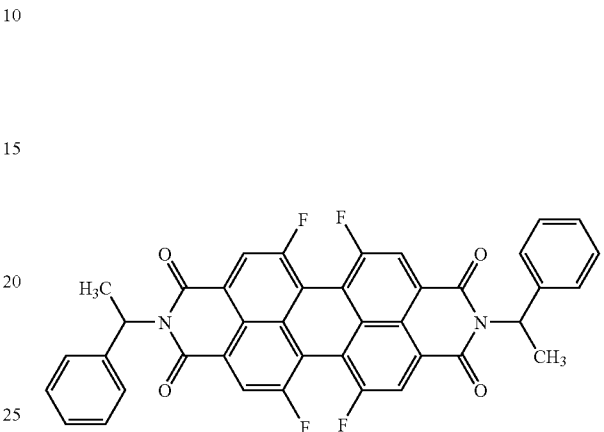

16.1 N,N'-Di-1-phenylethyl-1,6,7,12-tetrachloro-3,4:9,10-tetracarboximide 3.00 g (5.66 mmol) of 1,6,7,12-tetrachloro-3,4:9,10-tetracarboxylic bisanhydride, 65 ml of distilled quinoline, 7.5 ml (65.2 mmol) of methylbenzylamine and 1.00 g of zinc acetate are heated to 180° C. After 4 h, the mixture is cooled to room temperature and added to 300 ml of 2 N HCl. The solid which precipitates out is filtered off and dried. After column chromatography purification (dichloromethane), 3.70 g (88%) of the title compound were obtained.

$^1$H NMR (400 MHz, CDCl$_3$, TMS): δ=2.01 (d, 6H, $^3$J=7.2 Hz), 6.54 (q, 2H, $^3$J=7.2 Hz), 7.2-7.3 (m, 2H), 7.34 (m, 4H), 7.51 (m, 4H), 8.64 (s, 4H);
HR-MS (apci (pos. mode)): 735.0414 (M$^-$), calculated 735.0406 (C$_{40}$H$_{23}$Cl$_4$N$_2$O$_4$).

16.2 N,N'-Di-1-phenylethyl-1,6,7,12-tetrafluoro-3,4:9,10-tetracarboximide 1.00 g (1.36 mmol) of N,N'-di-1-phenylethyl-1,6,7,12-tetrachloro-3,4:9,10-tetracarboximide, 1.25 g of KF and 100 mg of (N,N-dimethylimidazolidino)tetramethylguanidinium chloride in 8 ml of sulfolane are heated to 160° C. for 5 h. The cooled mixture is added to 200 ml of water and the solid which precipitates out is filtered off and washed with water. The dried solid is dissolved in dichloromethane and purified by column chromatography (pentane/dichloromethane:1/2). Yield: 80 mg (8.8%).

$^1$H NMR (400 MHz, CDCl$_3$, TMS): δ=2.01 (d, 6H, $^3$J=7.0 Hz), 6.54 (q, 2H, $^3$J=7.3 Hz), 7.26 (m, 2H), 7.34 (m, 4H), 7.51 (m, 4H), 8.44 (t, 4H, $^3$J=5.3 Hz);

Example 17

1,6,7,12-Tetrafluoro-3,4:9,10-tetracarboximide

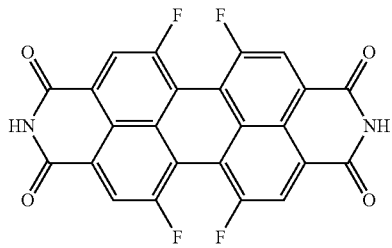 [SMILES: O=C1NC(=O)c2cc(F)c3c4c(F)cc5c6c(cc(F)c(c7c(F)cc1c2c73)c64)C(=O)NC5=O]

A solution of 70.0 mg (104 μmol) of N,N'-di-1-phenylethylamine-1,6,7,12-tetrafluoro-3,4:9,10-tetracarboximide from example 16 in 15 ml of dichloromethane is cooled to 0° C. 200 μl of BBr$_3$ are then slowly added dropwise and the suspension is stirred at room temperature for 3 h. The dichloromethane is removed under reduced pressure and the residue is floated with a methanol/water mixture in an ultrasound bath. The precipitated solid is filtered off and washed with water and then with dichloromethane.

Yield: 45 mg (93%).

HR-MS (EI (pos. mode)): 462.0255 (M$^+$), calculated 462.0260 ($C_{24}H_6F_4N_2O_4$).

OFETs are produced according to the general method for the PVD process. Substrate temperature: 125° C.; mobility: $1.4\times10^{-4}$ cm$^2$/Vs.

OFETs are produced according to the general method for the spin-coating process. Solvent: tetrahydrofuran; mobility: $1.11\times10^{-6}$ cm$^2$/Vs.

Example 18

N,N'-2-Ethylhexyl-1,6,7,12-tetrafluoro-3,4:9,10-tetracarboximide

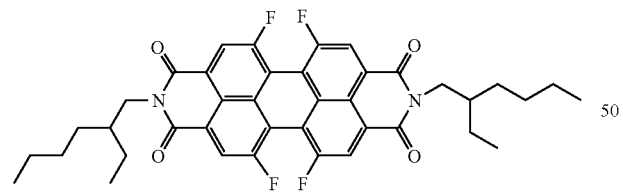

17.1 N,N'-2-Ethylhexyl-1,6,7,12-tetrachloro-3,4:9,10-tetracarboximide 3.00 g (5.66 mmol) of 1,6,7,12-tetrachloro-3,4:9,10-tetracarboxylic bisanhydride, 16 ml of 2-ethylhexylamine and 35 ml of propionic acid are heated to 142° C. for 1.5 h and then added to 150 ml of water. The solid which precipitates out is filtered off, dried and purified by column chromatography (dichloromethane) to obtain 3.30 g (77%) of the title compound.

$^1$H NMR (400 MHz, CDCl$_3$, TMS): δ=0.88-0.95 (m, 12H), 1.25-1.43 (m, 16H), 1.95 (m, 2H), 4.16 (m, 4H), 8.68 (s, 4H).

18.2 N,N'-2-Ethylhexyl-1,6,7,12-tetrafluoro-3,4:9,10-tetracarboximide 300 mg (0.400 mmol) of N,N'-2-ethylhexyl-1,6,7,12-tetrachloro-3,4:9,10-tetracarboximide, 250 mg of KF and 100 mg of (N,N-dimethylimidazolidino)tetramethylguanidinium chloride in 2 ml of sulfolane are heated to 160° C. for 2 h. The cooled mixture is added to 100 ml of water and the solid which precipitates out is filtered off and washed with water. The dried solid is dissolved in dichloromethane and purified by column chromatography (hexane/dichloromethane:3/7). Yield: 30 mg (8.8%).

$^1$H NMR (400 MHz, CDCl$_3$, TMS): δ=0.88-0.97 (m, 12H), 1.25-1.43 (m, 16H), 1.95 (m, 2H), 4.16 (m, 4H), 8.49 (t, 4H, $^3$J=5.2 Hz);

HR-MS (apci (neg. mode)): 686.2783 (M$^-$), calculated 686.2773 ($C_{40}H_{38}F_4N_2O_4$).

Example 19

1,6,7,12-Tetrafluoro-3,4:9,10-tetracarboxylic bisanhydride

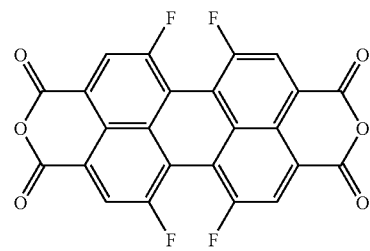 [SMILES: O=C1OC(=O)c2cc(F)c3c4c(F)cc5c6c(cc(F)c(c7c(F)cc1c2c73)c64)C(=O)OC5=O]

55 mg (0.08 mmol) of N,N'-ethylhexyl-1,6,7,12-tetrafluoro-3,4:9,10-tetracarboximide from example 18, 300 mg of KOH, 200 μl of water and 10 ml of butanol are heated to 75° C. for 2 h. Thereafter, the mixture is added to 200 ml of acetic acid and stirred at about 100° C. for 5 h. The mixture is then diluted with water and the product which precipitates out is filtered off and dried. As well as the title compound, the mass spectrum shows a minor impurity with a monohydroxy- and trifluoro-substituted anhydride. Yield: 35 mg (94%).

MS (EI(pos. mode)): 464.1 (M$^+$), calculated 464.0 ($C_{24}H_4F_4O_6$).

Example 20

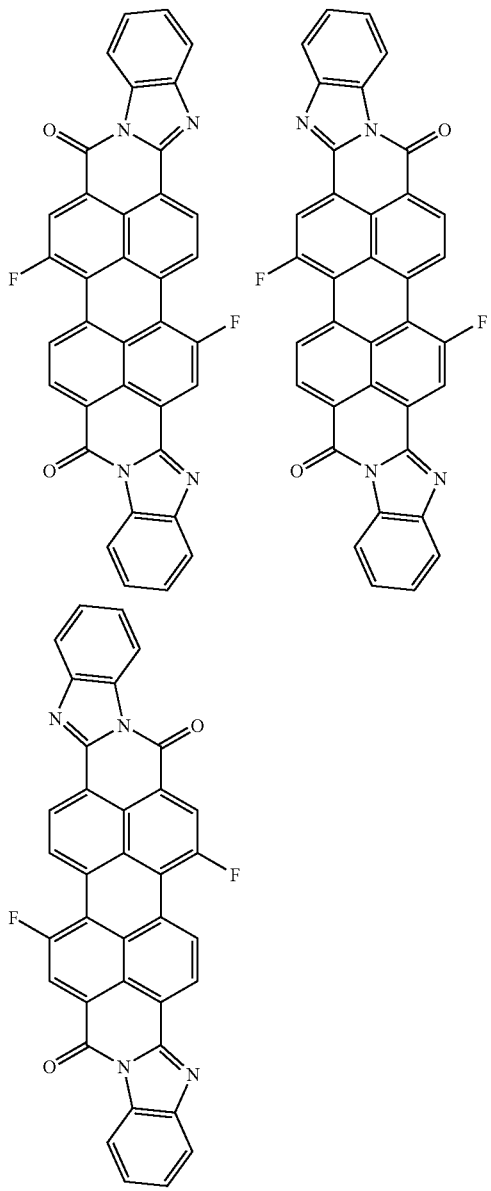

| Substrate temperature | | Room temperature | 125° C. |
|---|---|---|---|
| inside a glovebox | mobility (cm²/Vs) | $4.1 \times 10^{-5}$ | $6.2 \times 10^{-5}$ |
| | $V_{th}$ (V) | 52 | 14 |
| outside a glovebox | mobility (cm²/Vs) | $3.3 \times 10^{-5}$ | $5.1 \times 10^{-5}$ |
| | $V_{th}$ (V) | 64 | 47 |

Example 21

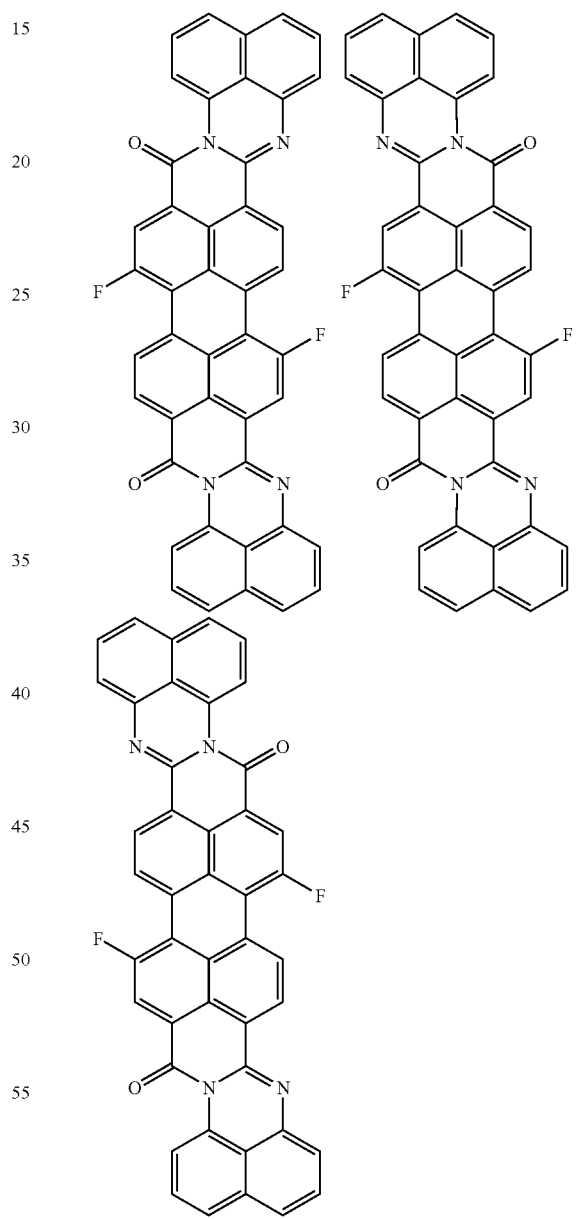

A mixture of 15 g of phenol, 1.01 g (9.3 mmol) of 1,2-phenylenediamine, 0.37 g (4.7 mmol) of pyrazine are heated to 120° C. Thereafter, 1.0 g (2.3 mmol) of 1,7-difluoroperylene-3,4:9,10-tetracarboxylic bisanhydride from example 4 is added at this temperature and the mixture is heated to 170° C. After stirring for 2 hours, the reaction mixture is cooled to room temperature and diluted with 50 ml of demineralized water and 10 ml of methanol. The solid is filtered off, washed with ethanol and dried under reduced pressure. 1.21 g (91%) of a black solid are obtained.

$R^f$(5:1 Trichloroacetic acid: toluene)=0.12, 0.36, 0.48. The compounds were purified by triple sublimation in a three-zone sublimation unit.

OFETs are produced by the general method for the PVD process. The results are shown below.

Based on example 20, the conversion of 1,7-difluoroperylene-3,4:9,10-tetracarboxylic bisanhydride from example 4 is carried out, except that 1,8-diaminonaphthalene is used in place of 1,2-phenylenediamine. A black powder is obtained in 92% yield.

$R^f$(5:1 trichloroacetic acid:toluene)=0.29, 0.47

Example 22

Mixture of 1,7-difluoro-N,N'-dimethylperylene-3,4:9,10-tetracarboximide and 1,6-difluoro-N,N'-dimethylperylene-3,4:9,10-tetracarboximide

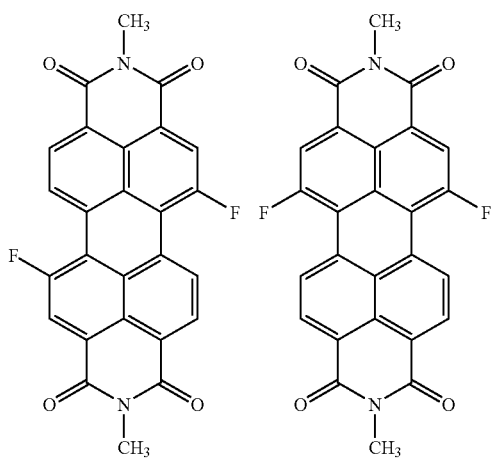

A mixture of 50 ml of water, 5.0 g (0.012 mol) of a mixture of 1,7-difluoroperylene-3,4:9,10-tetracarboxylic bisanhydride and 1,6-difluoroperylene-3,4:9,10-tetracarboxylic bisanhydride from example 4 and 2.8 ml of a 41% methylamine solution (0.048 mol of methylamine) is stirred at room temperature for 22 hours. The precipitate is filtered off, washed with water and dried under reduced pressure. 4.82 g (89%) of a brown-black solid are obtained.

UV-VIS ($H_2SO_4$) $\lambda_{max}$=576 nm (89.5 l/cm·g), 544 nm (71.3 l/cm·g)

Example 23

Mixture of Fluorinated Terrylenediimides

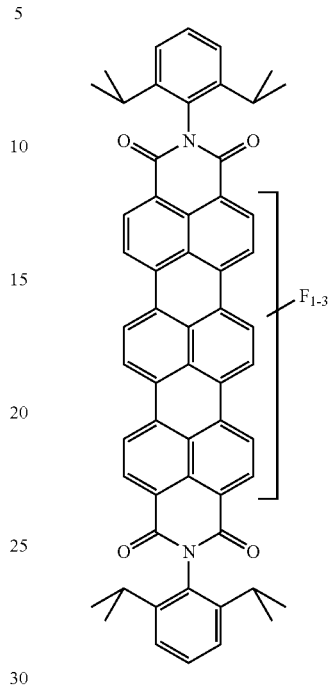

A mixture of 250 ml of sulfolane, 5.8 g (5 mmol) of 1,6,9,14-tetrabromoterrylene-3, 4:11,12-tetracarboximide, 0.26 g (1 mmol) of 18-crown-6 and 2.32 g (40 mmol) of potassium fluoride is heated to 120° C. and diluted with a further 200 ml of sulfolane. After stirring at 120° C. for 3 hours, the mixture is heated to 160° C. and then cooled to room temperature. A further 1.16 g (20 mmol) of potassium fluoride are added and the mixture is heated to 160° C. for a further 22 hours. After cooling to room temperature, 300 ml of water are added and the reaction mixture is stirred for a further 16 hours. The precipitate is filtered off, washed repeatedly with water and dried under reduced pressure. A blue-black product is obtained in quantitative yield. According to mass spectroscopy analysis (MALDI), the product comprises a mixture of the title compounds.

Example 24

24.1

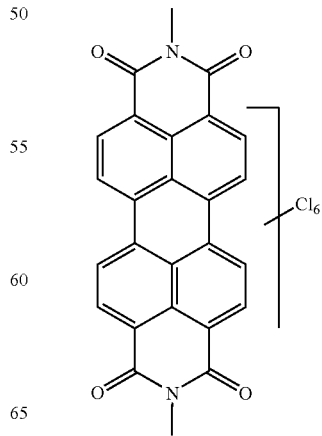

Based on Sadrai Acta. Cryst. 1990, 46, 637-640, 20.9 g (0.05 mol) of N,N'-dimethylperylimide in 115 ml of chlorosulfonic acid are treated with 53.0 g of chlorine at 60° C. with addition of 1.0 g of iodine within three hours. The reaction mixture is precipitated cautiously in ice-water, filtered and washed with water. 29.2 g of an orange solid are obtained, which, according to mass spectroscopy analysis (MALDI), consists predominantly of the hexachloro compound.

Chlorine content: 34.7%

24.2 Mixture of

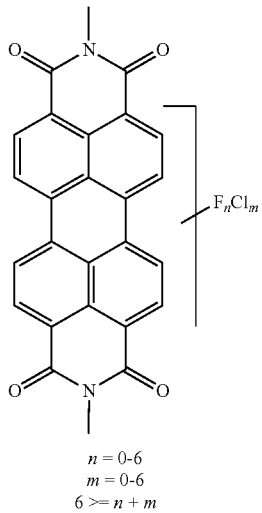

$n = 0-6$
$m = 0-6$
$6 >= n + m$

A mixture of 25 ml of N-methylpyrrolidone, 2.3 g of potassium fluoride (40 mmol), 0.3 g (11 mmol) of 18-crown-6 and 1.2 g (2 mmol) of the mixture from 24.1 are heated to 120° C. for two hours. The reaction mixture is cooled, precipitated in water, filtered and washed. 1.06 g of an orange solid are obtained, which is separated by column chromatography. A mixture of partly chlorinated and partly fluorinated compounds having a maximum of 6 halogen atoms and of a hexafluorinated compound forms.

Use Examples

Use Example 1

Excitonic Solar Cell

The working electrodes used were glass plates coated with indium-doped tin oxide (ITO) of dimensions 25 mm×15 mm×1 mm (indium tin oxide coated glass slide, 30-60 ohm resistance, Sigma-Aldrich). These were cleaned successively with glass cleaner, acetone and isopropanol in a ultrasound bath and dried in a nitrogen stream. Subsequently, the ITO glass was covered with an about 100 nm-thick PEDOT:PSS layer by spin-coating. PEDOT:PSS was used in aqueous solution (Baytron®P VP AI 4083), the spin-coating frequency was set to 4000 rpm and the spin time to 30 s. Thereafter, the sample was dried in a drying cabinet at 100° C. for 15 min.

For electrical insulation of the metal back electrodes from the working electrode, a strip of polyimide (Pyrrolin polyimide coating, Supelco) was applied in each case longitudinally to the edges of the PEDOT:PSS layer, and cured at 200° C. in a drying cabinet for 15 min.

The active organic layers were applied by vapor deposition in the sequence which follows. First applied to the PEDOT:PSS/polyimide layer with a thermal evaporation under reduced pressure, as a donor, was copper phthalocyanine (CuPc, sublimed with a simple gradient), then, as an acceptor, a mixture of N,N'-bis(heptafluorobutyl)-1,7-difluoro-3,4:9,10-tetracarboximide and N,N'-bis(heptafluorobutyl)-1,6-difluoro-3,4:9,10-tetracarboximide from example 10 (the material was purified by column chromatography as described), and finally, as a buffer layer, bathocuproin (BCP, Sensient). The pressure employed was $8 \times 10^{-7}$ mbar. The evaporation of the CuPc took place at a temperature of 380° C. and a vapor deposition rate of from 0.2 to 1.0 nm/s; the mixture of N,N'-bis(heptafluorobutyl)-1,7-difluoro-3,4:9,10-tetracarboximide and N,N'-bis(heptafluorobutyl)-1,6-difluoro-3,4:9,10-tetracarboximide was applied by vapor deposition at 290° C. at a rate of from 0.2 to 0.8 nm/s, and BCP at 180° C. at 1.0 nm/s. The resulting layer thicknesses were 50 nm for the CuPc, 50 nm for the mixture of N,N'-bis(heptafluorobutyl)-1,7-difluoro-3,4:9,10-tetracarboximide and N,N'-bis(heptafluorobutyl)-1,6-difluoro-3,4:9,10-tetracarboximide, and 20 nm for the BCP layer.

The metal back electrode was applied by thermal metal evaporation under reduced pressure. To this end, the sample was provided with a mask, in order to apply 8 separate round back electrodes with a diameter of 1 mm to the active region by vapor deposition, each of which is connected to an about 3 mm×2 mm contact area via the polyimide layer. The metal used was Ag, which was evaporated at a rate of from 0.2 to 1.0 nm/s at a pressure of approx. $5 \times 10^{-5}$ mbar, so as to give rise to a layer thickness of 100 nm.

To determine the efficiency η, the particular current/voltage characteristic was measured with a source meter model 2400 (Keithley Instruments Inc.) with irradiation with a halogen lamp field (Xenophot® 64629; Osram) as a sun simulator.

Figure 7:
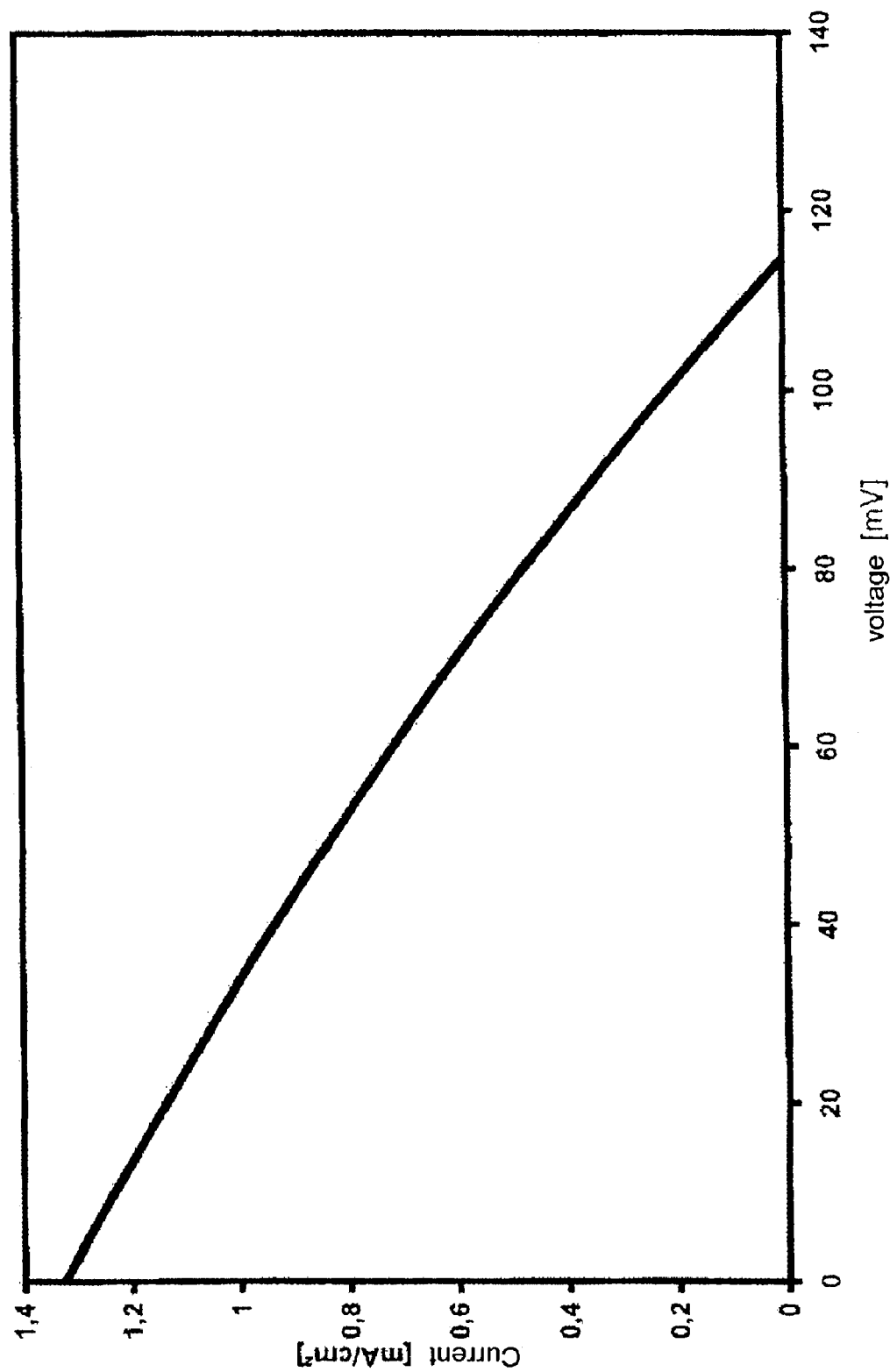
FIG. 7 shows a current/voltage characteristic of the solar cell of Use Example 1 at an illuminance of 100 mW/cm².

The current/voltage characteristic at an illuminance of 100 mW/cm² is shown in FIG. 7. The short-circuit current was 1.37 mA/cm², the open-terminal voltage 114 mV and the fill factor 29%. This gives rise to an efficiency of 0.04%, which demonstrates photovoltaic activity of the substance.

What is claimed is:

1. A method of manufacturing a semiconductor, the method comprising:
combining at least one compound of formula I with a substrate:

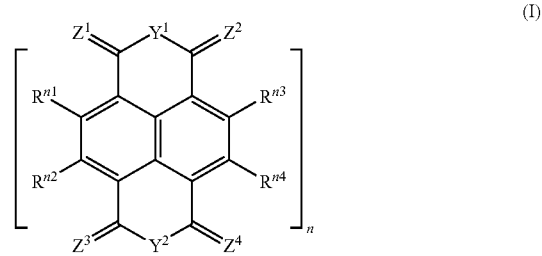

n is 3, or 4,
at least one of the $R^{n1}$, $R^{n2}$, $R^{n3}$, and $R^{n4}$ radicals is fluorine, optionally, at least one further $R^{n1}$, $R^{n2}$, $R^{n3}$, and $R^{n4}$ radical is a substituent which is selected from Cl and Br, and remaining radicals are each hydrogen,
$Y^1$ is O or $NR^a$, wherein $R^a$ is hydrogen or an organyl radical, Y² is O or NR$^b$, wherein R$^b$ is hydrogen or an organyl radical, Z$^1$, Z$^2$, Z$^3$, and Z$^4$ are each O, with the proviso that wherein, in the case that Y$^1$ is NR$^a$, optionally, one of the Z$^1$ and Z$^2$ radicals is NR$^c$, wherein the R$^a$ and R$^c$ radicals together are a bridging group having from 2 to 5 atoms between the flanking bonds, and wherein, in the case that Y$^2$ is NR$^b$, optionally, one of the Z$^3$ and Z$^4$ radicals is NR$^d$, where the R$^b$ and R$^d$ radicals together are a bridging group having from 2 to 5 atoms between the flanking bonds.

2. The method of claim 1, wherein n in formula (I) is 3 such that the compound of formula (I) has the following structure:

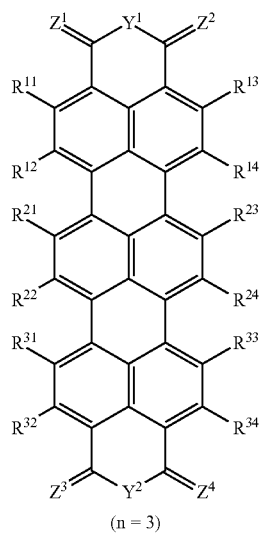

(n = 3)

wherein at leats one of the R$^{11}$, R$^{12}$, R$^{13}$, R$^{14}$, R$^{21}$, R$^{22}$, R$^{23}$, R$^{24}$, R$^{31}$, R$^{32}$, R$^{33}$, and R$^{34}$ radicals is fluorine, optionally, at least one further R$^{11}$, R$^{12}$, R$^{13}$, R$^{14}$, R$^{21}$, R$^{22}$, R$^{23}$, R$^{24}$, R$^{31}$, R$^{32}$, R$^{33}$, and R$^{34}$ radical is a substituent selected from Cl and Br, and the remaining R$^{11}$, R$^{12}$, R$^{13}$, R$^{14}$, R$^{21}$, R$^{22}$, R$^{23}$, R$^{24}$, R$^{31}$, R$^{32}$, R$^{33}$, and R$^{34}$ radicals are each hydrogen;

Y$^1$ is O or NR$^a$, wherein R$^a$ is hydrogen or an organyl radical,

Y$^2$ is O or NR$^b$, wherein R$^b$ is hydrogen or an organyl radical,

Z$^1$, Z$^2$, Z$^3$, and Z$^4$ are each O, wherein, in the case that Y$^1$ is NR$^a$, optionally, one of the Z$^1$ and Z$^2$ radicals is NR$^c$, wherein the R$^a$ and R$^c$ radicals together are a bridging group having from 2 to 5 atoms between the flanking bonds, and wherein, in the case that Y$^2$ is NR$^b$, optionally, one of the Z$^3$ and Z$^4$ radicals is NR$^d$, where the R$^b$ and R$^d$ radicals together are a bridging group having from 2 to 5 atoms between the flanking bonds.

3. The method of claim 1, wherein n in formula (I) is 4 such that the compound of formula (I) has the following structure:

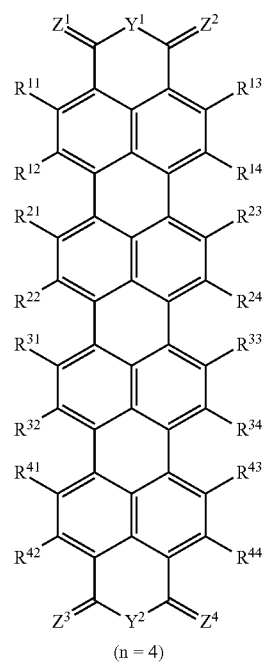

(n = 4)

wherein at least one of the R$^{11}$, R$^{12}$, R$^{13}$, R$^{14}$, R$^{21}$, R$^{22}$, R$^{23}$, R$^{24}$, R$^{31}$, R$^{32}$, R$^{33}$, and R$^{34}$, R$^{41}$, R$^{42}$, R$^{43}$, and R$^{44}$ radicals is fluorine, optionally, at least one further R$^{11}$, R$^{12}$, R$^{13}$, R$^{14}$, R$^{21}$, R$^{22}$, R$^{23}$, R$^{24}$, R$^{31}$, R$^{32}$, R$^{33}$, R$^{34}$, R$^{41}$, R$^{42}$, R$^{43}$, and R$^{44}$ radical is a substituent selected from Cl and Br, and the remainin R$^{11}$, R$^{12}$, R$^{13}$, R$^{14}$, R$^{21}$, R$^{22}$, R$^{23}$, R$^{24}$, R$^{31}$, R$^{32}$, R$^{33}$, R$^{34}$, R$^{41}$, R$^{42}$, R$^{43}$, and R$^{44}$ radicals are each hydrogen;

Y$^1$ is O or NR$^a$, wherein R$^a$ is hydrogen or an organyl radical,

Y$^2$ is O or NR$^b$, wherein R$^b$ is hydrogen or an organyl radical,

Z$^1$, Z$^2$, Z$^3$, and Z$^4$ are each O, wherein, in the case that Y$^1$ is NR$^a$, optionally, one of the Z$^1$ and Z$^2$ radicals is NR$^c$, wherein the R$^a$ and R$^c$ radicals together are a bridging group having from 2 to 5 atoms between the flanking bonds, and wherein, in the case that Y$^2$ is NR$^b$, optionally, one of the Z$^3$ and Z$^4$ radicals is NR$^d$, where the R$^b$ and R$^d$ radicals together are a bridging group having from 2 to 5 atoms between the flanking bonds.

4. A method of manufacturing a semiconductor, the method comprising:

combining with a substrate, at least one compound of formulae I.A (I.A)

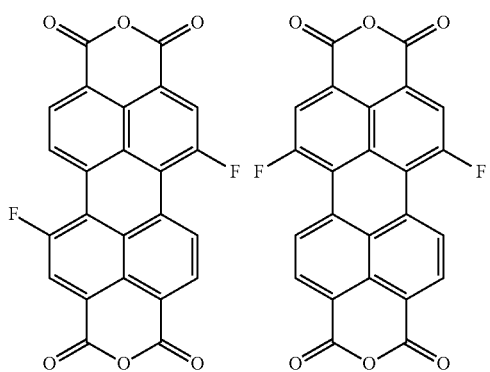

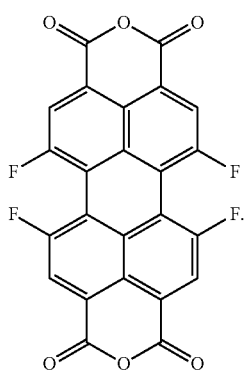

5. A method of manufacturing a semiconductor, the method comprising:
combining with a substrate, at least one compound of formula I.Bb

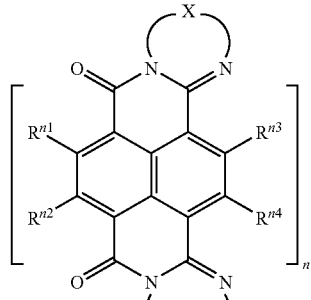

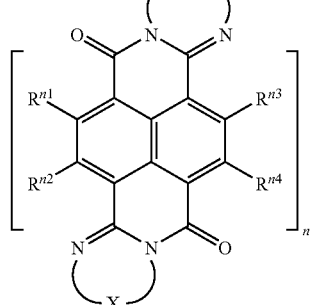

wherein
X is a divalent bridging group having from 2 to 5 atoms between the flanking bonds;
n is 2, 3, or 4,
at least one of the $R^{n1}$, $R^{n2}$, $R^{n3}$, and $R^{n4}$ radicals is fluorine,
optionally, at least one further $R^{n1}$, $R^{n2}$, $R^{n3}$, and $R^{n4}$ radical is a substituent which is selected from Cl and Br, and remaining radicals are each hydrogen.

* * * * *